US012683514B2

(12) United States Patent
Tien et al.

(10) Patent No.: US 12,683,514 B2
(45) Date of Patent: Jul. 14, 2026

(54) CIRCUIT AND METHOD OF CURRENT SENSING FOR LDO- FREE BASED RECTIFIER IN WIRELESS CHARGER SYSTEM

(71) Applicant: STMicroelectronics Asia Pacific Pte Ltd, Singapore (SG)

(72) Inventors: Thanh Ha Tien, Ang Mo Kio (SG); Yannick Guedon, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 350 days.

(21) Appl. No.: 18/523,488

(22) Filed: Nov. 29, 2023

(65) Prior Publication Data

US 2024/0106344 A1     Mar. 28, 2024

Related U.S. Application Data

(63) Continuation-in-part of application No. 17/576,052, filed on Jan. 14, 2022, now Pat. No. 12,040,628, and
(Continued)

(51) Int. Cl.
H02M 7/219        (2006.01)
G01R 19/165       (2006.01)
(Continued)

(52) U.S. Cl.
CPC ...... H02M 7/219 (2013.01); G01R 19/16571 (2013.01); H02J 50/12 (2016.02); H02M 1/0009 (2021.05); H02M 1/32 (2013.01)

(58) Field of Classification Search
CPC .. H02M 7/219; H02M 7/2195; H02M 1/0009; H02M 1/32; H02M 1/38;
(Continued)

(56) References Cited

U.S. PATENT DOCUMENTS 6,657,875 B1    12/2003  Zeng et al.
9,001,543 B2     4/2015  Knoedgen
(Continued)

FOREIGN PATENT DOCUMENTS

CN          1864319 A  * 11/2006
CN        111030314 A     4/2020
(Continued)

OTHER PUBLICATIONS

Cheng, Lin, et al: "A 6.78-MHz Single-Stage Wireless Charger With Constant-Current Constant-Voltage Charging Technique," IEEE Journal of Solid-State Circuits, vol. 55, No. 4, Apr. 2020, pp. 999-1010.
(Continued)

*Primary Examiner* — Monica Lewis
*Assistant Examiner* — Jye-June Lee
(74) *Attorney, Agent, or Firm* — Crowe & Dunlevy LLC

(57)        ABSTRACT
A wireless power-reception system has a bridge rectifier with two high-side and two low-side transistors, linked to input-nodes and sense-resistors. During a first phase, a control circuit activates certain transistors for rectification, producing an output voltage, while modulating a gate voltage of a non-activated low-side transistor to dissipate excess power and regulate the output voltage. During a first given number of occurrences of the first phase, the control circuit determines the current through the low-side transistor having its gate voltage modulated based upon a voltage across a first sense resistor coupled between that low-side transistor and ground. During a second given number of occurrences of the first phase, the control circuit determines the current delivered to the load based upon a voltage across the first sense resistor and a voltage across a second sense resistor coupled between the other low-side transistor and ground.

19 Claims, 51 Drawing Sheets

Related U.S. Application Data a continuation-in-part of application No. 17/576,120, filed on Jan. 14, 2022, now Pat. No. 12,040,724, and a continuation-in-part of application No. 16/930,651, filed on Jul. 16, 2020, now Pat. No. 11,368,052.

(51) Int. Cl.

| | |
|---|---|
| *H02J 50/12* | (2016.01) |
| *H02M 1/00* | (2006.01) |
| *H02M 1/32* | (2007.01) |

(58) Field of Classification Search

CPC ...... H02M 1/0045; H02M 1/088; H02J 50/12; H02J 50/80; G01R 19/16571; H03K 2017/307; H03K 2217/0009; H03K 2217/0036; H03K 17/302

See application file for complete search history.

(56) References Cited

U.S. PATENT DOCUMENTS

| | | | |
|---|---|---|---|
| 10,312,743 | B2 | 6/2019 | Ouda et al. |
| 10,355,514 | B2 | 7/2019 | Terry et al. |
| 11,025,156 | B2 | 6/2021 | Huang et al. |
| 11,368,052 | B2 | 6/2022 | Guedon |

| | | | | |
|---|---|---|---|---|
| 2012/0081027 | A1 | | 4/2012 | Anissimov |
| 2016/0126844 | A1 | | 5/2016 | Tschirhart |
| 2017/0149353 | A1 | | 5/2017 | Hung et al. |
| 2018/0150093 | A1 | | 5/2018 | Poletto et al. |
| 2019/0113570 | A1 | | 4/2019 | Astrauskas |
| 2019/0296786 | A1 | | 9/2019 | Cai et al. |
| 2020/0166960 | A1 | | 5/2020 | Poletto et al. |
| 2021/0088567 | A1 | | 3/2021 | Guedon et al. |
| 2021/0091597 | A1 | | 3/2021 | Hegde et al. |
| 2021/0136893 | A1 | * | 5/2021 | De Jongh .......... H05B 45/3578 |
| 2022/0140657 | A1 | | 5/2022 | Guedon |
| 2022/0140744 | A1 | | 5/2022 | Guedon |
| 2023/0275508 | A1 | | 8/2023 | Guedon et al. |
| 2025/0038637 | A1 | * | 1/2025 | Cohen ................ H02M 7/2176 |

FOREIGN PATENT DOCUMENTS

| | | | |
|---|---|---|---|
| DE | 102015107957 | A1 | 12/2015 |
| EP | 3940945 | A1 | 1/2022 |
| GB | 2187312 | A | 9/1987 |
| JP | 2008154377 | A | 7/2008 |

OTHER PUBLICATIONS

CN First Office Action and Search Report for counterpart CN Appl. No. 202110802555.8, report dated Apr. 25, 2025, 7 pgs.

\* cited by examiner

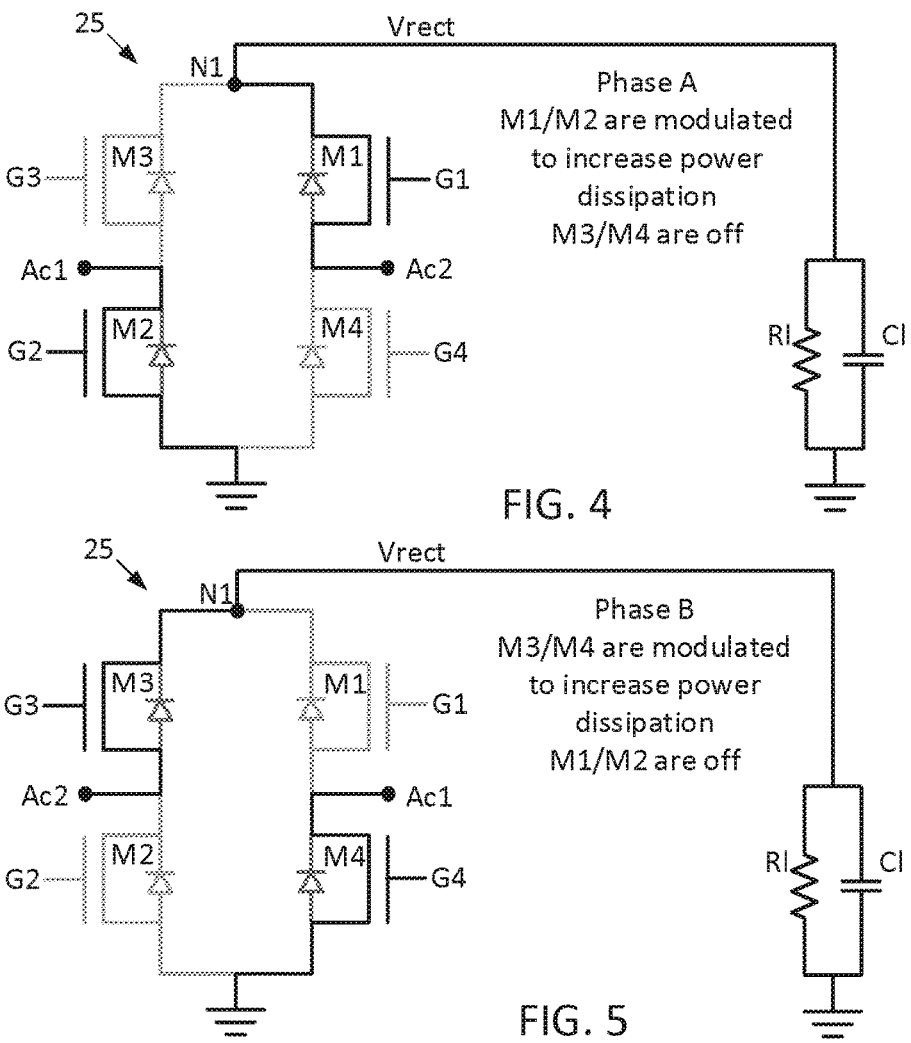
Phase A
M1/M2 are modulated
to increase power
dissipation
M3/M4 are off
FIG. 4
Phase B
M3/M4 are modulated
to increase power
dissipation
M1/M2 are off
FIG. 5
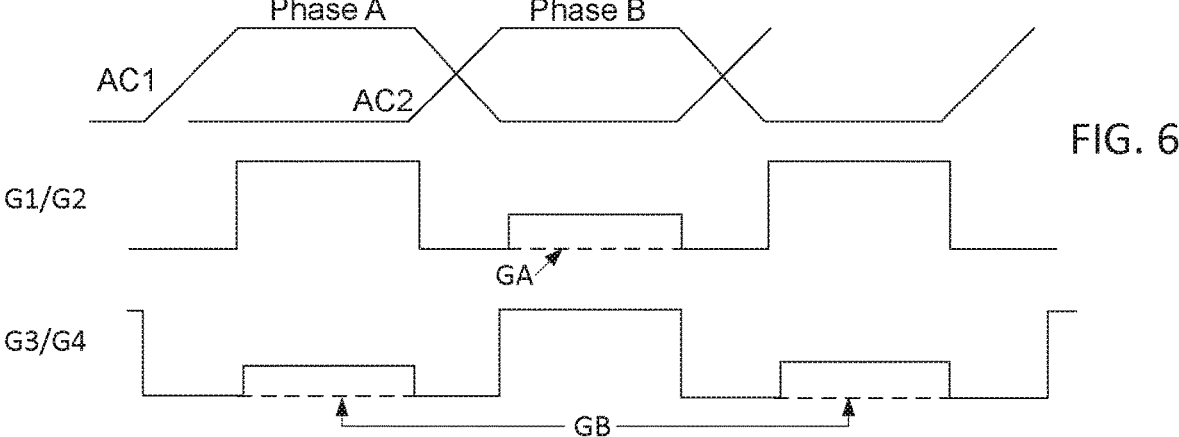
FIG. 6

IN-PHASE SERIAL REGULATION

INPUT POWER HAS A LITTLE EXCESS~90mW

FIG. 10
(CONTINUED)

OUTPUT VOLTAGE CLAMPING EFFECT ALMOST INVISIBLE

V(RECT_3)

H1:5.0009

VOLTAGE (V)

FEEDBACK SIGNAL
FB IS GENERATING CYCLE-TO-CYCLE PULSES

V(GATE_3_PAR)

FB

VOLTAGE (V)

HIGH-SIDE CONTROL AS PER CONVENTIONAL ARCHITECTURE

V(ON1_3)

V(G1)

VOLTAGE (V)

FIG. 13

IN-PHASE SERIAL REGULATION USING PWM

FIG. 13
(CONTINUED)

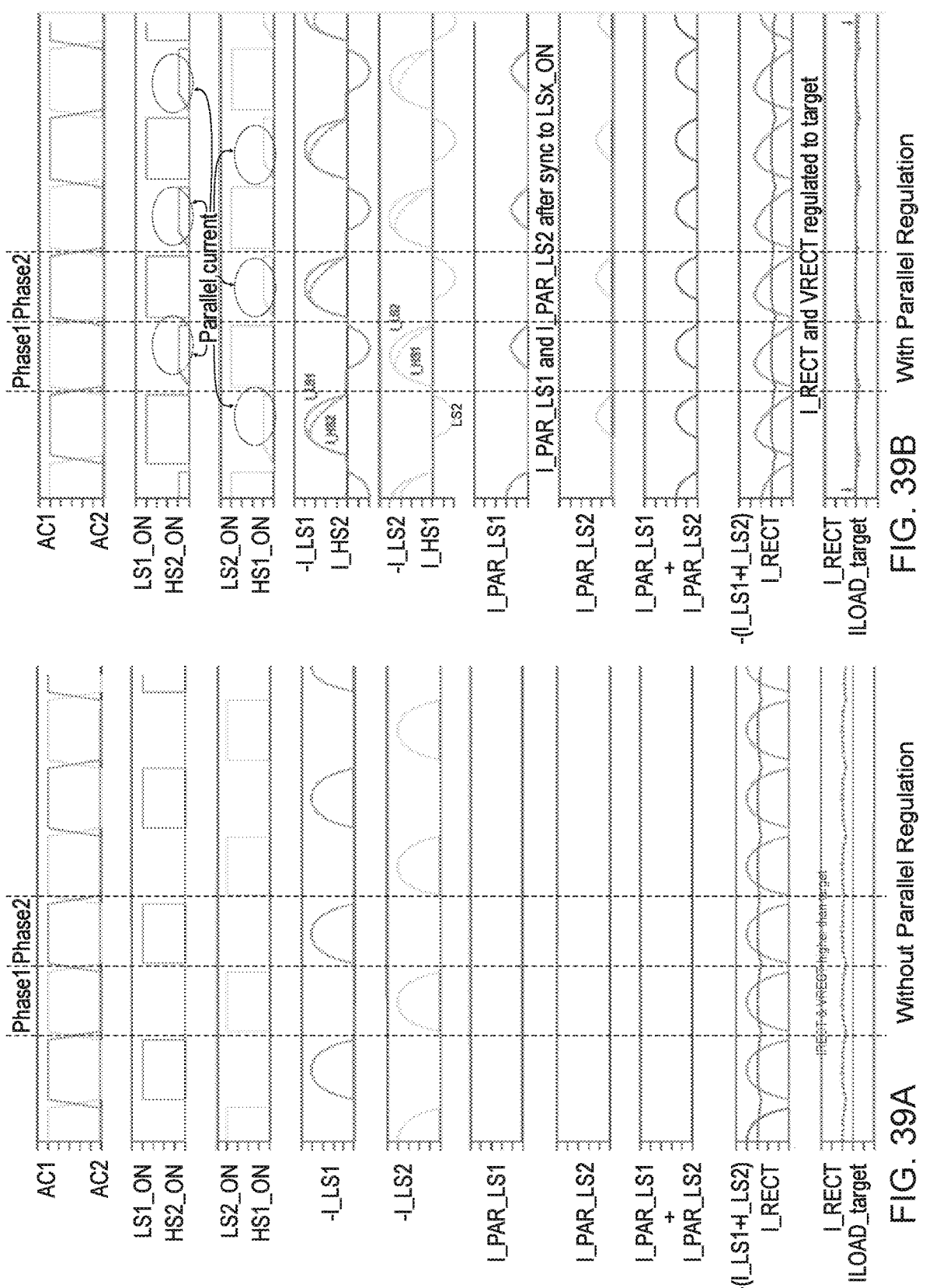
FIG. 39A    Without Parallel Regulation
FIG. 39B    With Parallel Regulation

CIRCUIT AND METHOD OF CURRENT SENSING FOR LDO- FREE BASED RECTIFIER IN WIRELESS CHARGER SYSTEM

RELATED APPLICATIONS

This is a continuation-in-part of U.S. patent application Ser. No. 17/576,120, filed Jan. 14, 2022, and of U.S. patent Ser. No. 17/576,052, filed Jan. 14, 2022, both of which are themselves continuations-in-part of U.S. patent application Ser. No. 16/930,651, filed on Jul. 16, 2020, the contents of all of which are incorporated by reference in their entirety to the maximum extent allowable under the law.

TECHNICAL FIELD

This disclosure is directed to the field of wireless power transmission and, in particular, to hardware, operating techniques for the hardware, and methods for sensing a load current.

BACKGROUND

Portable electronic devices, such as smartphones, smartwatches, audio output devices (earbuds, headphones), and wearables operate on battery power, and not from wired power transmitted thereto over wired transmission lines and distribution systems. The batteries used for such devices are typically rechargeable and, therefore, a way to recharge the power of such batteries is necessary.

Most portable electronic devices include a charging port, typically conforming to the Micro USB or USB-C standards, into which a power cord connected to a power source can be inserted to provide for recharging of their batteries. However, such charging ports may make it difficult to enhance the water resistance of the electronic device, and are subject to damage from repeated use. In addition, some smaller portable electronic devices (for example, earbuds and smartwatches) may lack the available space to provide for a charging port. Still further, some users may find it cumbersome to plug a power cord into the charging port of an electronic device to charge the battery of that device.

Therefore, to address these issues, wireless power transmission has been developed. As shown in FIG. 1, a typical prior art wireless power transmission system 10 utilizes a transmitter 11 including a transmission coil Lp and a serial capacitance Cp forming a serial resonant L,C network, driven by electric power from a power source 12 (typically a wired connection, but in some cases a battery), that generates a time-varying electric field, and a receiver 15 including a receiver coil Ls and a serial capacitance Cs forming a similar serial resonant L,C network in which the time-varying electric field induces an AC current. Other possible configurations exist where L,C are in parallel on the primary side and/or the secondary side, offering four possible schemes—serial-serial, serial-parallel, parallel-serial, and parallel-parallel. Each scheme may present some advantages and/or disadvantages depending on the application, and the serial-serial configuration is the most widely used in recent developments for the mobile device market. The receiver 15 includes a bridge rectifier 16 (comprised of the illustrated diodes D1-D4, but which could also be transistors) that rectifies the AC current to produce a DC current that charges a tank capacitor Ctank connected to an input node Nin of a regulator 17 to a regulator input voltage. The regulator 17, typically a low dropout amplifier, produces a regulated output voltage at its output node Nout, which is provided to a load (represented by the load resistance R1 and the load capacitance C1). While such prior art wireless power transmission systems 10 are functional and in wide use, the usage of the regulator 17 consumes a substantial amount of integrated circuit area due to its use of a large power MOS device. Since such wireless power transmission systems 10 are primarily utilized in portable electronic devices, this area consumption is undesirable. Therefore, further development into wireless power transmission systems is needed.

In addition to the aforementioned challenges, there are specific complications associated with high power wireless power transmission systems. For instance, in a 50 W system, the rectifier output voltage Vrect at node Nin is typically set higher than 12V on the receiver 15 side to minimize the output current Irect. For a clearer illustration: when Vrect is at 9V, Irect is at 5.6 A; at 12V, Irect reduces to 4.2 A; and at an elevated 18V, Irect is further diminished to 2.8 A. This high value of Vrect implies that high-side current sensing circuitry would involve the incorporation of high-voltage rated devices. This may lead to an increase in layout area and demand more expansive hardware to accommodate suitable protection circuits.

Additionally, providing for Vrect regulation and preventing damage to the low-side transistors would involve cycle-to-cycle measurement of low-side transistor currents to maintain a check on the power dissipated thereby. Conventional approaches have proposed a low-side current measurement methodology utilizing current mirrors. However, this may present hardware precision limitations, susceptibility to ageing, and functional constraints particularly when the transistors are within the saturation domain A low-side current sensor would operate as an integrator, translating the output voltage to Ixt/C. This in turn involves additional processing, either by hardware or firmware, based on the incoming transmit frequency, further complicating the system. Another concern is the discrepancy in measurement origins for values emanating from different hardware, therefore their correlative measurements may be poor under PVT variation.

Given thus, further development into wireless power transmission systems is necessary.

SUMMARY

Disclosed herein is a wireless power reception system, including: a bridge rectifier arrangement of transistors comprising a first high-side transistor coupled between an output node and a first input node, a second high-side transistor coupled between the output node and a second input node, a first low-side transistor coupled between the first input node and ground through a first sense resistor, and a second low-side transistor coupled between the second input node and ground through a second sense resistor, wherein an input time varying power signal is received across the first input node and the second input node; and a control circuit coupled to receive a first differential voltage formed across the first sense resistor and a second differential voltage formed across the second sense resistor.

The control circuit is configured to: turn on the first high-side transistor and the second low-side transistor during a first phase, and turn on the second high-side transistor and the first low-side transistor during a second phase, to thereby cause rectification of the input time varying power signal to produce an output voltage at the output node; during a first given number of occurrences of the first phase, determine a current sunk by the first low-side transistor based upon a voltage across the first sense resistor; during second given number of occurrences of the first phase, determine a current delivered to a load coupled between the output node and ground based upon a sum of the voltage across the first sense resistor and a voltage across the second sense resistor; and modulate a gate voltage of the first low-side transistor during the first phase and modulate a gate voltage of the second low-side transistor during the second phase, based upon the determined current delivered to the load, to thereby cause dissipation of excess power delivered by the input time varying power signal and therefore perform output voltage regulation on top of rectification.

The control circuit may be further configured to: during a first given number of occurrences of the second phase, determine a current sunk by the second low-side transistor based upon a voltage across the second sense resistor; and during a second given number of occurrences of the second phase, determine a current delivered to the load coupled between the output node and ground based upon a sum of the voltage across the second sense resistor and the voltage across the first sense resistor.

A channel selection signal may be deasserted during the first given number of occurrences of the first phase, is asserted during the second given number of occurrences of the first phase, may be deasserted during the first given number of occurrences of the second phase, and may be asserted during the second given number of occurrences of the second phase. The control circuit may include a differential channel including: a first chopper configured to chop a first differential voltage across the first sense resistor to produce a first chopped differential voltage during the first phase when the channel selection signal is deasserted, and to block the first differential voltage during the second phase when the channel selection signal is asserted; a first voltage to current converter configured to convert the first chopped differential voltage to a first differential current; a second chopper configured to chop a second differential voltage across the second sense resistor to produce a second chopped differential voltage during the second phase when the channel selection signal is deasserted, and to block the second differential voltage during the first phase when the channel selection signal is asserted; a second voltage to current converter configured to convert the second chopped differential voltage to a second differential current; and a control signal generator configured to control turn-on of the first high-side transistor, first low-side transistor, second high-side transistor, and second low-side transistor, and to control modulation of the gate voltage of the first low-side transistor and the second low-side transistor, based upon the first differential current and second differential current.

The differential channel may further include: a first current to voltage converter configured to receive the first and second differential currents from the first and second voltage to current converters and to convert them into a corresponding differential voltage; a first de-chopper configured to de-chop the differential voltage provided by the first current to voltage converter to produce a stabilized voltage signal; a first low-pass filter configured to receive the stabilized voltage signal provided by the first de-chopper and filter out high-frequency noise, thereby producing a filtered voltage signal indicative of the current delivered to the load; and an analog-to-digital converter configured to digitize the filtered voltage signal provided by the first low-pass filter and pass the digitized filtered voltage signal to the control signal generator for use in controlling turn-on of the first high-side transistor, first low-side transistor, second high-side transistor, and second low-side transistor, and for use in controlling modulation of the gate voltage of the first low-side transistor and the second low-side transistor, based upon the first differential current and second differential current.

The control circuit may also include a single-ended channel, the single-ended channel having: a third de-chopper configured to de-chop the first differential current provided by the first voltage to current converter to produce a first single, non-differential output current; a fourth de-chopper configured to de-chop the second differential current provided by the second voltage to current converter to produce a second single, non-differential output current; and a protection circuit configured to generate overcurrent and/or overvoltage protection signals based upon the first and second single non-differential output currents and the output voltage at the output node. The control signal generator may modify turn-on of the first high-side transistor, first low-side transistor, second high-side transistor, and second low-side transistor based upon the overcurrent and/or overvoltage protection signals.

The single-ended channel may also include: a second current to voltage converter configured to receive the first and second single non-differential output currents and to convert them into a corresponding differential voltage; and a second low-pass filter configured to receive the differential voltage from the single current to voltage converter and filter out high-frequency noise therefrom to produce a filtered voltage signal. The protection circuit may generate the overcurrent protection signal based upon the filtered voltage signal received from the second low-pass filter.

The protection circuit may include a first comparator configured to compare the filtered voltage signal to a predetermined current threshold and generate an overcurrent protection signal when the predetermined current threshold is exceeded; and a second comparator configured to compare the output voltage at the output node against a predetermined voltage threshold and generate an overvoltage protection signal when the predetermined voltage threshold is exceeded. The control signal generator may modify turn-on of the first high-side transistor, first low-side transistor, second high-side transistor, and second low-side transistor, and may modify modulation of the gate voltage of the first low-side transistor and the second low-side transistor based upon the overcurrent and/or overvoltage protection signals.

The second voltage to current converter may include: a first p-channel transistor having a source connected to a supply voltage node, a drain connected to a first node, and a gate connected to the first node; a first n-channel transistor having a drain connected to the first node, a source connected to a second node, and a gate connected to a third node; a first current source connected between the second node and a fourth node and configured to sink a first reference current from the second node and source the first reference current to the fourth node; a second p-channel transistor having a source connected to the supply voltage node, a drain connected to a fifth node, and a gate connected to the fifth node; a second n-channel transistor having a drain connected to the fifth node, a source connected to a sixth node, and a gate connected to a seventh node; and a second current source connected between the sixth node and a seventh node and configured to sink a second reference current from the sixth node and source the second reference current to the seventh node. The second chopped differential voltage may be received at the fourth node and seventh node.

The second voltage to current converter may also include: a first NPN transistor having a collector connected to the third node, a emitter connected to the fourth node, and a base connected to the second node; a third current source connected between the supply voltage node and the third node, the third current source configured to source a scaled version of the first reference current to the third node; a second NPN transistor having a collector connected to the seventh node, an emitter connected to the seventh node, and a base connected to the sixth node; and a fourth current source connected between the supply voltage node and the seventh node, the fourth current source configured to source a scaled version of the second reference current to the seventh node.

The second voltage to current converter may also include: a third p-channel transistor having a source connected to the supply voltage node, a drain connected to an eighth node, and a gate connected to the first node; a fifth current source connected between the eighth node and ground, the fifth current source configured to sink a third reference current from the eighth node; a fourth p-channel transistor having a source connected to the supply voltage node, a drain connected to a ninth node, and a gate connected to the fifth node; and a sixth current source connected between the ninth node and ground, the sixth current source configured to sink a fourth reference current from the ninth node. The first, second, third, and fourth reference currents may be equal in magnitude.

The second voltage to current converter may also include: a fifth p-channel transistor having a source connected to the supply voltage node, a drain connected to the fourth de-chopper, and a gate connected to the first node; and a sixth p-channel transistor having a source connected to the supply voltage node, a drain connected to the fourth de-chopper, and a gate connected to the fifth node.

The first voltage to current converter may also include: a first p-channel transistor having a source connected to a supply voltage node, a drain connected to a first node, and a gate connected to the first node; a first n-channel transistor having a drain connected to the first node, a source connected to a second node, and a gate connected to a third node; a first current source connected between the second node and a fourth node and configured to sink a first reference current from the second node and source the first reference current to the fourth node; a second p-channel transistor having a source connected to the supply voltage node, a drain connected to a fifth node, and a gate connected to the fifth node; a second n-channel transistor having a drain connected to the fifth node, a source connected to a sixth node, and a gate connected to a seventh node; and a second current source connected between the sixth node and a seventh node and configured to sink a second reference current from the sixth node and source the second reference current to the seventh node. The first chopped differential voltage may be received at the fourth node and seventh node.

The first voltage to current converter may include: a first NPN transistor having a collector connected to the third node, a emitter connected to the fourth node, and a base connected to the second node; a third current source connected between the supply voltage node and the third node, the third current source configured to source a scaled version of the first reference current to the third node; a second NPN transistor having a collector connected to the seventh node, an emitter connected to the seventh node, and a base connected to the sixth node; and a fourth current source connected between the supply voltage node and the seventh node, the fourth current source configured to source a scaled version of the second reference current to the seventh node.

The first voltage to current converter may also include: a third p-channel transistor having a source connected to the supply voltage node, a drain connected to an eighth node, and a gate connected to the first node; a fifth current source connected between the eighth node and ground, the fifth current source configured to sink a third reference current from the eighth node; a fourth p-channel transistor having a source connected to the supply voltage node, a drain connected to a ninth node, and a gate connected to the fifth node; and a sixth current source connected between the ninth node and ground, the sixth current source configured to sink a fourth reference current from the ninth node. The first, second, third, and fourth reference currents may be equal in magnitude.

The first voltage to current converter may also include: a fifth p-channel transistor having a source connected to the supply voltage node, a drain connected to the third de-chopper, and a gate connected to the first node; and a sixth p-channel transistor having a source connected to the supply voltage node, a drain connected to the third de-chopper, and a gate connected to the fifth node.

Method aspects are also disclosed herein. For example, disclosed herein is a method for controlling a wireless power reception system, including: receiving an input time-varying power signal across a first and a second input node; turning on a first high-side transistor and a second low-side transistor during a first phase and turning on a second high-side transistor and a first low-side transistor during a second phase to cause rectification of the input time-varying power signal to produce an output voltage at an output node; determining, during a first given number of occurrences of the first phase, a current sunk by the first low-side transistor based on a voltage across a first sense resistor; determining, during a second given number of occurrences of the first phase, a current delivered to a load coupled between the output node and ground based on a sum of the voltage across the first sense resistor and a voltage across a second sense resistor; and modulating a gate voltage of the first low-side transistor during the first phase and modulating a gate voltage of the second low-side transistor during the second phase, based on the determined current delivered to the load, to dissipate excess power delivered by the input time-varying power signal and perform output voltage regulation on top of rectification.

The method may also include: during a first given number of occurrences of the second phase, determining a current sunk by the second low-side transistor based upon a voltage across the second sense resistor; and during a second given number of occurrences of the second phase, determining a current delivered to the load coupled between the output node and ground based upon a sum of the voltage across the second sense resistor and the voltage across the first sense resistor.

The method may further include: deasserting a channel selection signal during the first given number of occurrences of the first phase and asserting the channel selection signal during the second given number of occurrences of the first phase; deasserting the channel selection signal during the first given number of occurrences of the second phase and asserting the channel selection signal during the second given number of occurrences of the second phase; chopping a first differential voltage across the first sense resistor to produce a first chopped differential voltage during the first phase when the channel selection signal is deasserted; blocking the first differential voltage during the second phase when the channel selection signal is asserted; converting the first chopped differential voltage to a first differential current; chopping a second differential voltage across the second sense resistor to produce a second chopped differential voltage during the second phase when the channel selection signal is deasserted; blocking the second differential voltage during the first phase when the channel selection signal is asserted; converting the second chopped differential voltage to a second differential current; and controlling the turn-on of the first and second high-side transistors, and the first and second low-side transistors, and modulating the gate voltage of the first and second low-side transistors, based upon the first and second differential currents.

The method may also include: converting the first and second differential currents into a corresponding differential voltage; de-chopping the differential voltage to produce a stabilized voltage signal; filtering the stabilized voltage signal to remove high-frequency noise and produce a filtered voltage signal indicative of the current delivered to the load; and digitizing the filtered voltage signal for use in controlling the turn-on of the first and second high-side transistors, and the first and second low-side transistors, and for modulating the gate voltage of the first and second low-side transistors.

BRIEF DESCRIPTION OF THE DRAWINGS

FIG. 4 is a schematic block diagram of the wireless power transmission system of FIG. 2 showing its operation during phase A of the in-phase serial voltage regulation of FIG. 3.

FIG. 5 is a schematic block diagram of the wireless power transmission system of FIG. 2 showing its operation during phase B of the in-phase serial voltage regulation of FIG. 3.

FIG. 6 is a timing diagram showing voltages of the wireless power transmission system of FIG. 2 in operation, when the feedback loop is controlling the bridge rectifier to perform anti-phase parallel voltage regulation.

FIG. 39A are waveforms showing currents and voltages of the wireless power transmission system of FIG. 38 in operation, without performance of the regulation function.

FIG. 39B are waveforms showing currents and voltages of the wireless power transmission system of FIG. 38 in operation, including performance of the regulation function.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Note that in the following description, any resistor or resistance mentioned is a discrete device, unless stated otherwise, and is not simply an electrical lead between two points. Therefore, any resistor or resistance connected between two points has a higher resistance than a lead between those two points, and such resistor or resistance cannot be interpreted as a lead. Similarly, any capacitor or capacitance mentioned is a discrete device, unless stated otherwise, and is not a parasitic element, unless stated otherwise. Additionally, any inductor or inductance mentioned is a discrete device, unless stated otherwise, and is not a parasitic element, unless stated otherwise.

A. Hardware Description

Figure 2:
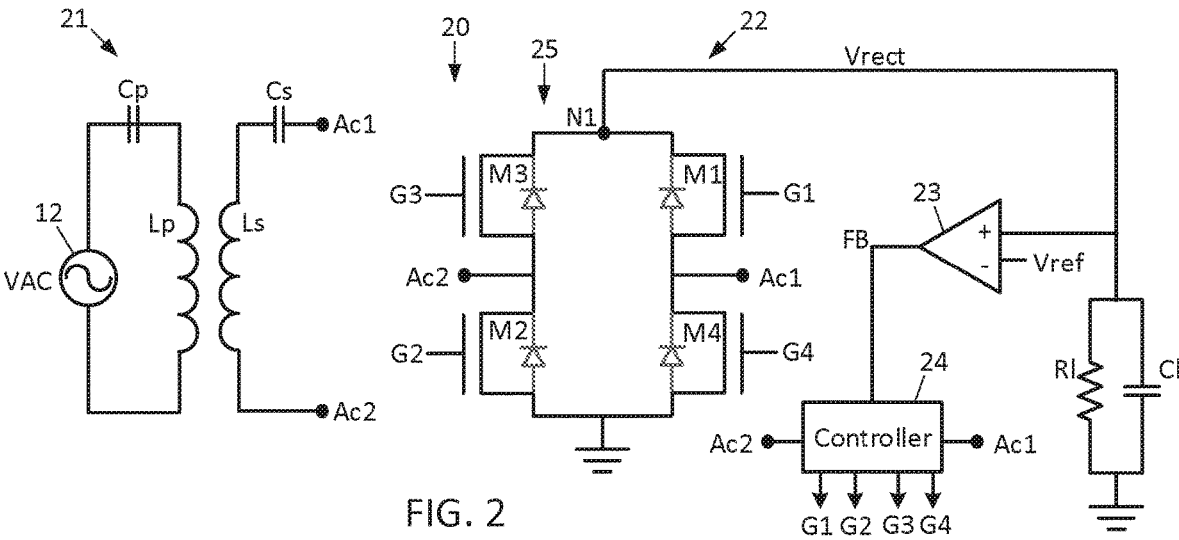
FIG. 2 is a schematic block diagram of a wireless power transmission system disclosed herein in which the bridge rectifier also performs a regulation function, enabling the lack of an additional voltage regulation circuit.

Now described with reference to FIG. 2 is a wireless power transmission system 20 including a transmitter 21 and a receiver 22. The transmitter 21 is comprised of an AC voltage source 12 coupled to a serial resonant transmitter coil Lp and capacitance Cp. The receiver 22 includes a serial resonant receiver coil Ls and capacitance Cs coupled between nodes Ac1 and Ac2, and a "regtifier" 25 (a bridge rectifier also capable of voltage regulation when controlled using techniques described below) formed by transistors M1-M4 coupled between node N1 and ground.

The regtifier is formed by: an n-channel transistor M1 having a drain connected to node N1, a source connected to node Act, and a gate coupled to receive a control signal G1; an n-channel transistor M4 having a drain connected to node Ac1, a source connected to ground, and a gate coupled to receive a control signal G4; an n-channel transistor M3 having a drain connected to node N1, a source connected to node Ac2, and a gate coupled to receive a control signal G3; and a an n-channel transistor M2 having a drain connected to node Ac2, a source connected to ground, and a gate coupled to receive a control signal G2.

An amplifier 23 has an inverting input terminal coupled to receive a reference voltage Vref (which is set to be equal to a desired output voltage Vrect at node N1), a non-inverting input terminal coupled to node N1, and an output coupled to control circuitry 24 and generating a feedback signal FB. A load is connected between node N1 and ground, and is represented by resistor R1 and capacitor C1. The control circuitry 24 itself receives input from the feedback signal FB, and based thereupon, generates the control signals G1-G4 for the transistors M1-M4.

As will be explained in detail below, the control circuitry 24 generates the control signals G1-G4 so as to cause the regtifier 25 to both rectify the AC current induced in the receiver coil Ls to produce a rectified output voltage Vrect, while at the same time suitable modulating one or more of the control signals G1-G4 so as to dissipate excess power to thereby regulate the output voltage Vrect. By dissipating excess power, the power delivered to the load by the regtifier 25 can be controlled and kept within a desired level, without the use of a separate discrete voltage regulation circuit.

Therefore, the amplifier 23 and the control circuitry 24 form a feedback loop.

B. Operation Using In-Phase Serial Voltage Regulation

Operation of the wireless power transmission system 20 under an in-phase serial voltage regulation scheme controlled by the control circuitry 24 is now described.

Figure 3:
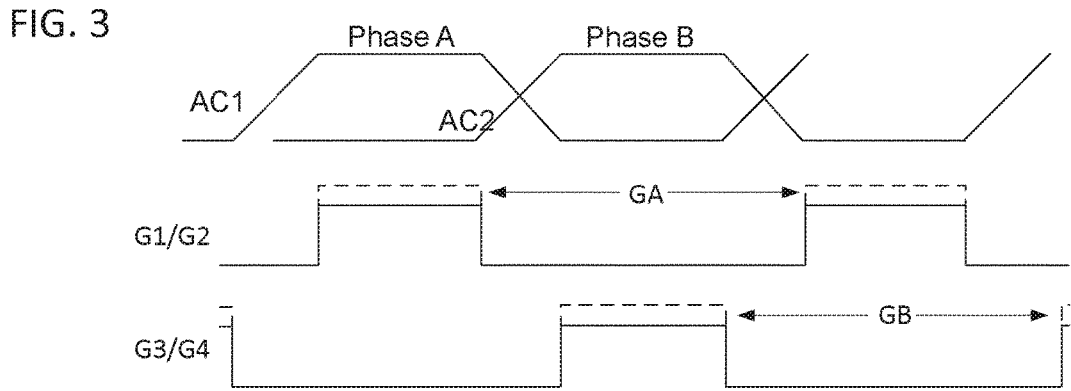
FIG. 3 is a timing diagram showing voltages of the wireless power transmission system of FIG. 2 in operation, when the feedback loop is controlling the bridge rectifier to perform in-phase serial voltage regulation.

Shown in the graph of FIG. 3 are waveform traces of the signals at the nodes Ac1 and Ac2. Notice that when the signal at Ac1 is positive, it is labeled as Phase A, that when the signal at Ac2 is positive, it is labeled as Phase B, and that the signals at Ac1 and Ac2 are 180° out of phase with one another.

During Phase A, corresponding to the positive phase of Ac1 and the negative phase of Ac2, the control signal GA is generated and driven to a high voltage (a level sufficient to fully turn on the transistors M1-M2) by the controller 24, and the control signal GB is generated and pulled to a low voltage (a level to fully turn off the transistors M3-M4) by the controller 24. Conversely, during Phase B, the control signal GB is driven to a high voltage by the controller 24 and the control signal GA is pulled to a low voltage by the controller 24. The controller 24 generates the gate voltages G1-G4 for the transistors M1-M4, and the values of G1-G4 depend upon the voltage values of the control signals GA and GB, the voltage of the feedback signal FB, and the current phase.

When the incoming power delivered by the regtifier 25 to the load is greater than the amount of power consumed by the load, the voltage Vrect at node N1 rises to be greater than the reference voltage Vref, causing the feedback signal FB to rise. When the feedback signal FB rises, the control circuitry 24 modulates the appropriate gate voltages from among G1-G4 so as to place the associated transistors M1-M4 into the linear region (ohmic region) of operation and increase the drain to source resistance of those transistors, resulting in the excess incoming power being dissipated within the activated transistors M1-M4 of the regtifier 25. This modulation continues throughout operation, with the result being that the voltage Vrect remains close to the reference voltage Vref.

When modulation of the gate voltages G1-G4 does not occur, the gate voltages G1-G2 are equal to the voltage of control signal GA.

1. Analog Control of Transistor Gates

In greater detail, as shown in FIG. 3, the gate voltages G1 and G2 are modulated during Phase A so that the transistors M1 and M2 are not fully on, increasing the drain to source resistance of transistors M1 and M2, resulting in additional power dissipation in transistors M1 and M2 over conventional operation; the gate voltages G3 and G4 remain pulled low such that the transistors M3 and M4 remain off. This configuration of the transistors M1-M4 can be seen in FIG. 4.

During Phase B, as shown in FIG. 3, the gate voltages G3 and G4 are modulated so that the transistors M3 and M4 are not fully on, increasing the drain to source resistance of transistors M3 and M4, resulting in additional power dissipation in transistors M3 and M4 over conventional operation; the gate voltages G1 and G2 remain pulled low such that the transistors M1 and M2 remain off. This configuration of the transistors M1-M4 can be seen in FIG. 5.

This operating scheme is referred to as in-phase serial regulation because the transistors M1-M4 that are conventionally fully on during a given phase are instead conductivity modulated, and as a result and as shown in FIGS. 4-5, the power dissipation is achieved by increasing the conductivity and voltage drop within elements which are in serial in the main current path to the load during the method.

Note that during Phase A, the voltage level of the gate voltages G1 and G2 need not both be modulated to increase the drain to source resistance of their respective transistors M1 and M2, and instead only one of the gate voltages G1 or G2 can be modulated to increase the drain to source resistance of its respective transistor M1 or M2 while the other control signal can remain high to keep its respective transistor M1 or M2 fully on.

Similarly, during Phase B, the voltage level of the gate voltages G3 and G4 need not both be modulated to increase the drain to source resistance of their respective transistors M3 and M4, and instead only one of the gate voltages G3 or G4 can be modulated to increase the drain to source resistance of its respective transistor M3 or M4 while the other control signal can remain high to keep its respective transistor M3 or M4 fully on.

The choice of applying the technique to one or more elements is to be appreciated/considered versus the maximum amount of excess power to be dissipated by the system.

Figure 9:
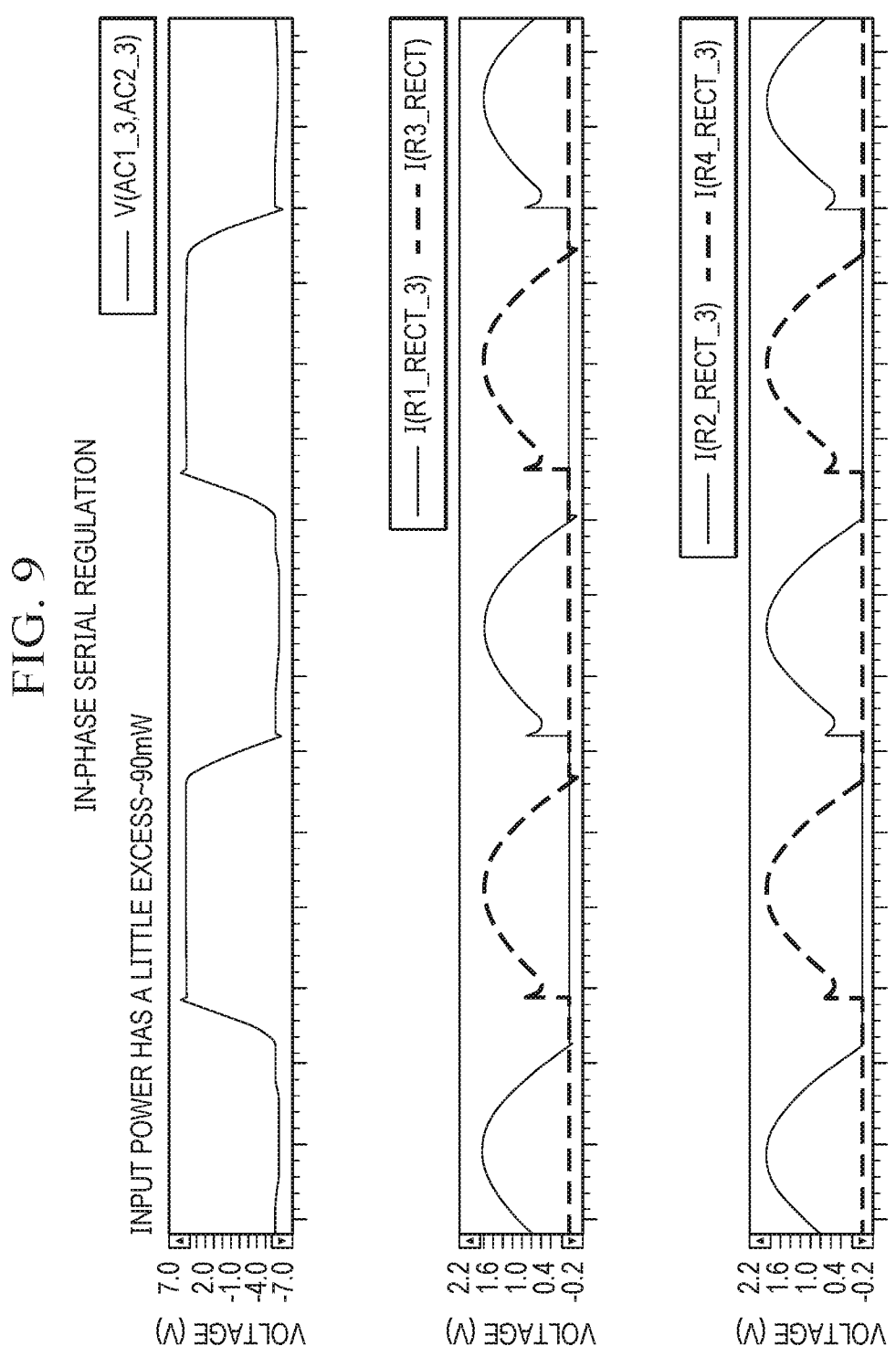
FIG. 9 is a timing diagram showing voltages of the wireless power transmission system of FIG. 2 in operation, when the feedback loop is controlling the bridge rectifier to perform low-side in-phase serial voltage regulation. The regulation is applied on the low-side only in this example for allowing a better appreciation of the substantial difference between the drive signal applied to the low-side as per the wireless power transmission system disclosed herein and the conventional drive signal applied to the high-side as per the prior art.
Figure 9:
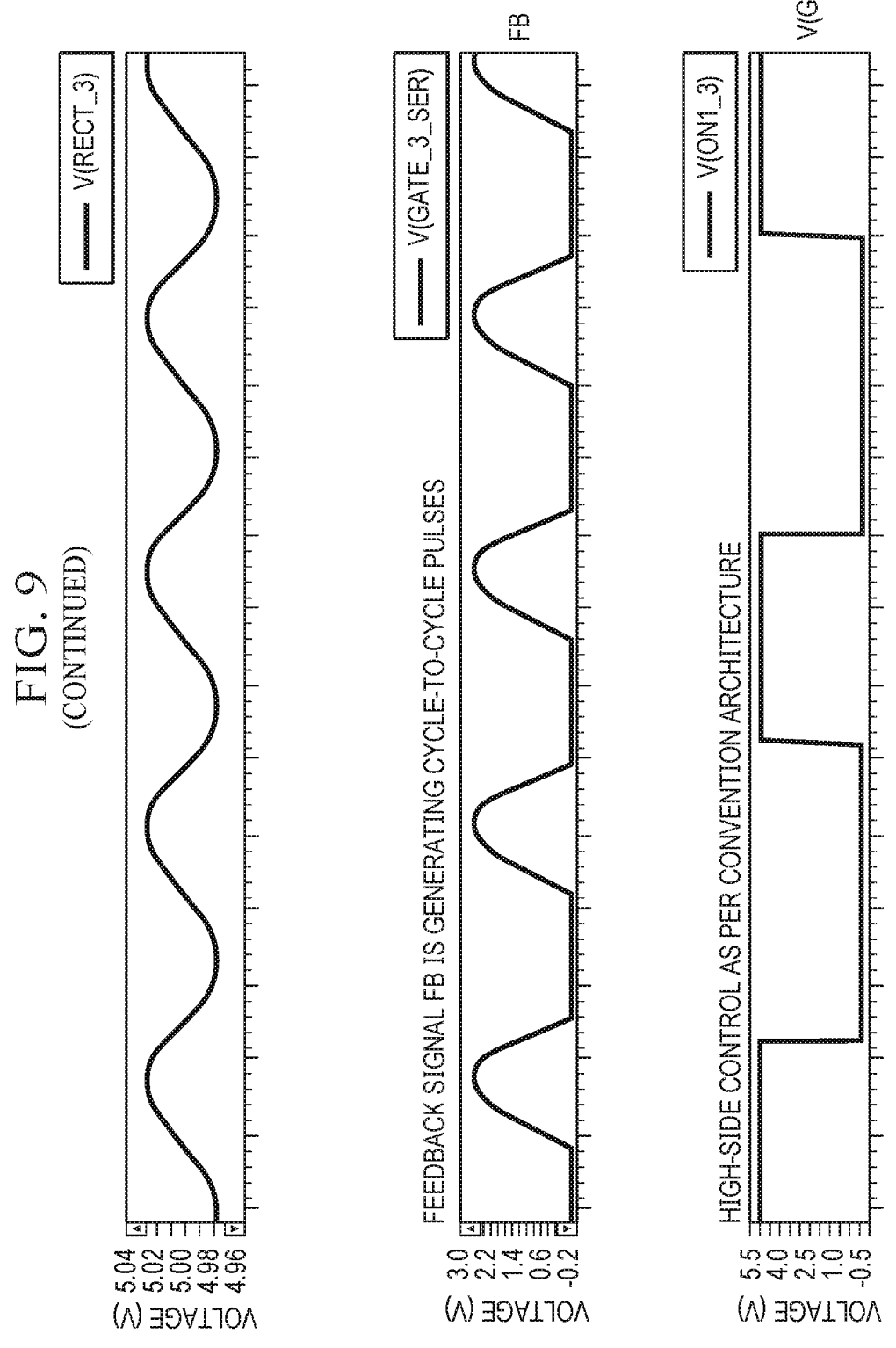
Figure 9:
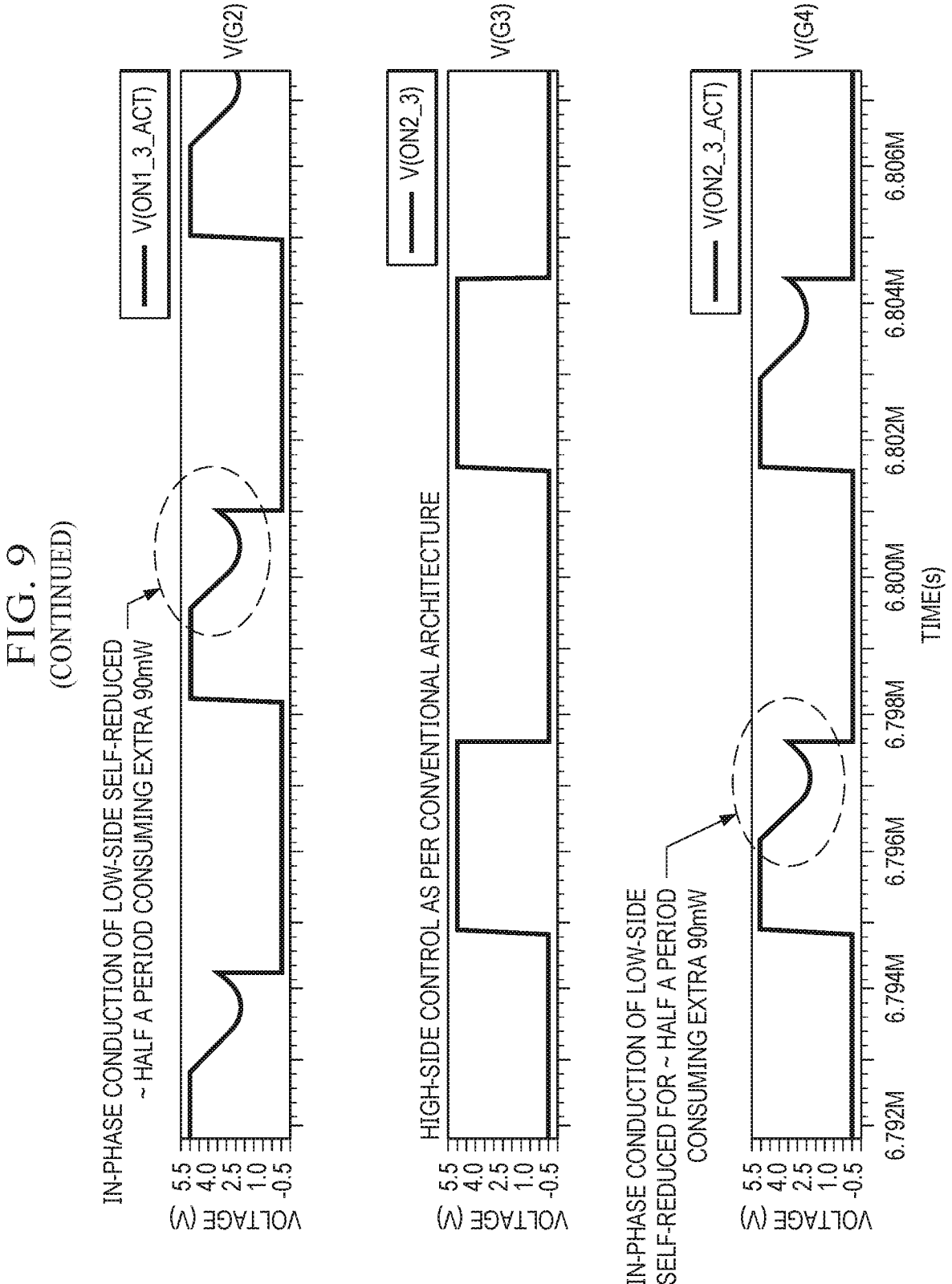

As an example of this form of operation where one transistor M1-M4 at a time is modulated, and the modulation is not flat across each pulse of the gate voltages, FIG. 9 shows additional waveforms of the wireless power transmission system 20 operating using in-phase serial regulation. Here, it can be seen that during phase A, the gate voltage G2 of the transistor M2 (which turns on the transistor M2) is pulled from a steady high voltage of 5.0V to less than 4V while the gate voltage G1 of the transistor M1 (which turns on the transistor M1) remains high and the gate voltages G3 and G4 of the transistors M3 and M4 remain low. Here, it can also be seen that during phase B, the gate voltage G4 of the transistor M4 (which turns on the transistor M4) is pulled from a steady high voltage of 5.0V to less than 4V while the gate voltages G3 of the transistor M3 (which turns on the transistor G3) remains high and the gate voltages G1 and G2 of the transistors M1 and M2 remain low.

Notice that when the gate voltages G2 and G4 are pulled downward from being fully high so as to modulate the on-resistance of transistors M2 and M4, this is performed for approximately half the pulse of those gate voltages. However, if there is the need to consume additional power over this arrangement, the gate voltages G2 and G4 will be pulled downward lower from being fully high or longer than half the pulse of those gate voltages so as to modulate the on-resistance of transistors M2 and M4 for a longer period of time. The shape of the gate voltage mainly results from the gain of the feedback loop. These techniques are clearly applicable to the case where two transistors are simultaneously modulated.

The in-phase serial voltage regulation scheme described above is particularly suited to use where the voltage output Vrect by the regtifier 25 is relatively low and where the expected excess power to be dissipated is relatively low.

Note that the feedback loop formed by the amplifier 23 and the control circuitry 24 may be operated at a sufficient speed so that it reacts on a cycle-to-cycle basis, enabling the control circuitry 24 to alter the generation of the gate voltages G1-G4 on a cycle-to-cycle basis when performing in-phase serial voltage regulation (meaning the gate voltages G1-G4 will naturally, by virtue of the feedback loop gain, self-adjust on the fly to have a different shape and magnitude during each cycle based on the incoming power within the alternance of the cycle, such that the gate voltages G1-G4 may begin a cycle having one magnitude but that magnitude may be changed during a portion of the cycle). This feedback technique can be observed in the graph of FIG. 9, where the feedback signal FB is generated during each phase, enabling the control signals G1-G4 to be altered on a cycle-to-cycle basis.

Figure 22:
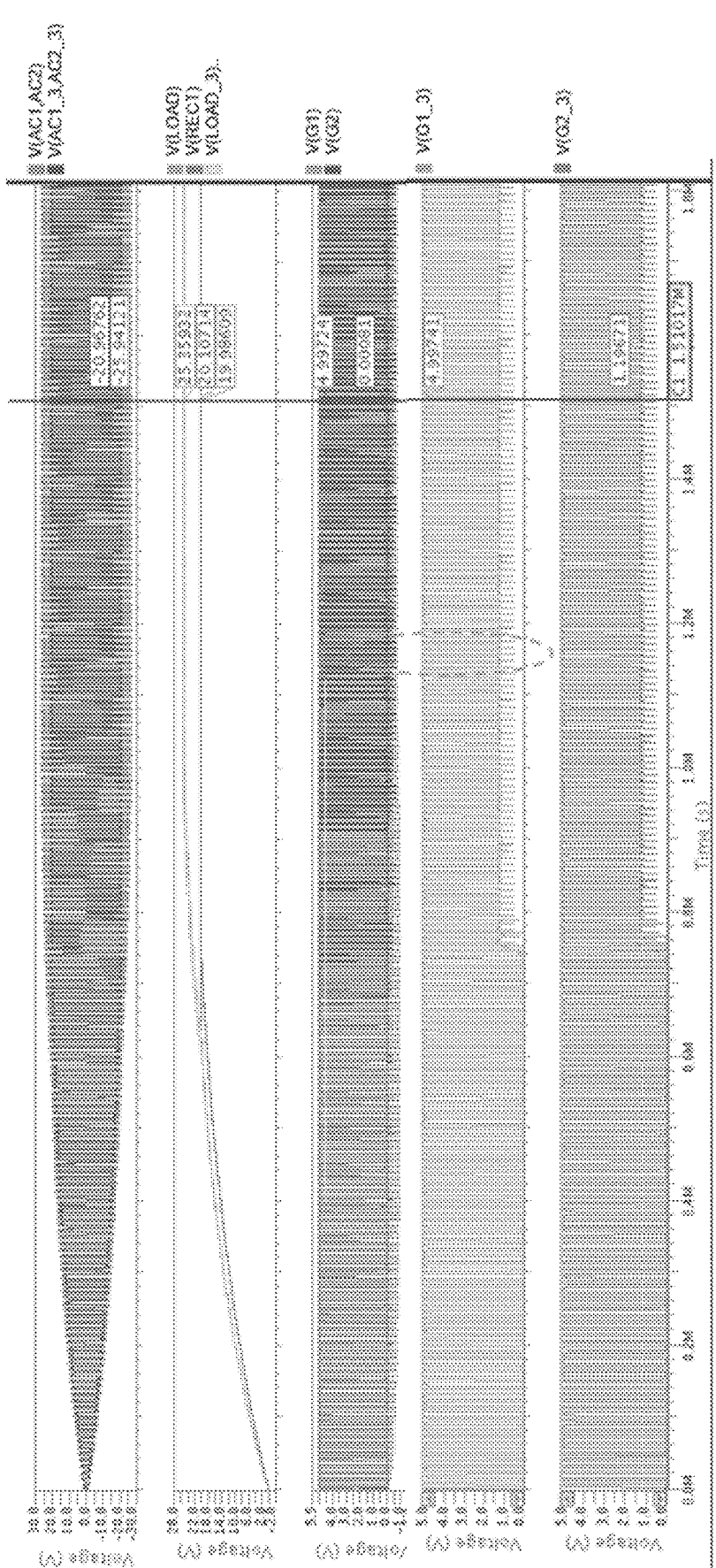
FIG. 22 is a timing diagram showing voltages of the wireless power transmission system of FIG. 2 in operation, when the feedback loop is controlling the bridge rectifier to perform low-side anti-phase parallel voltage regulation. Note that here, the feedback generation of the feedback signal is filtered, so the gates of the transistors of the bridge rectifier are driven pseudo-statically.
Figure 23:
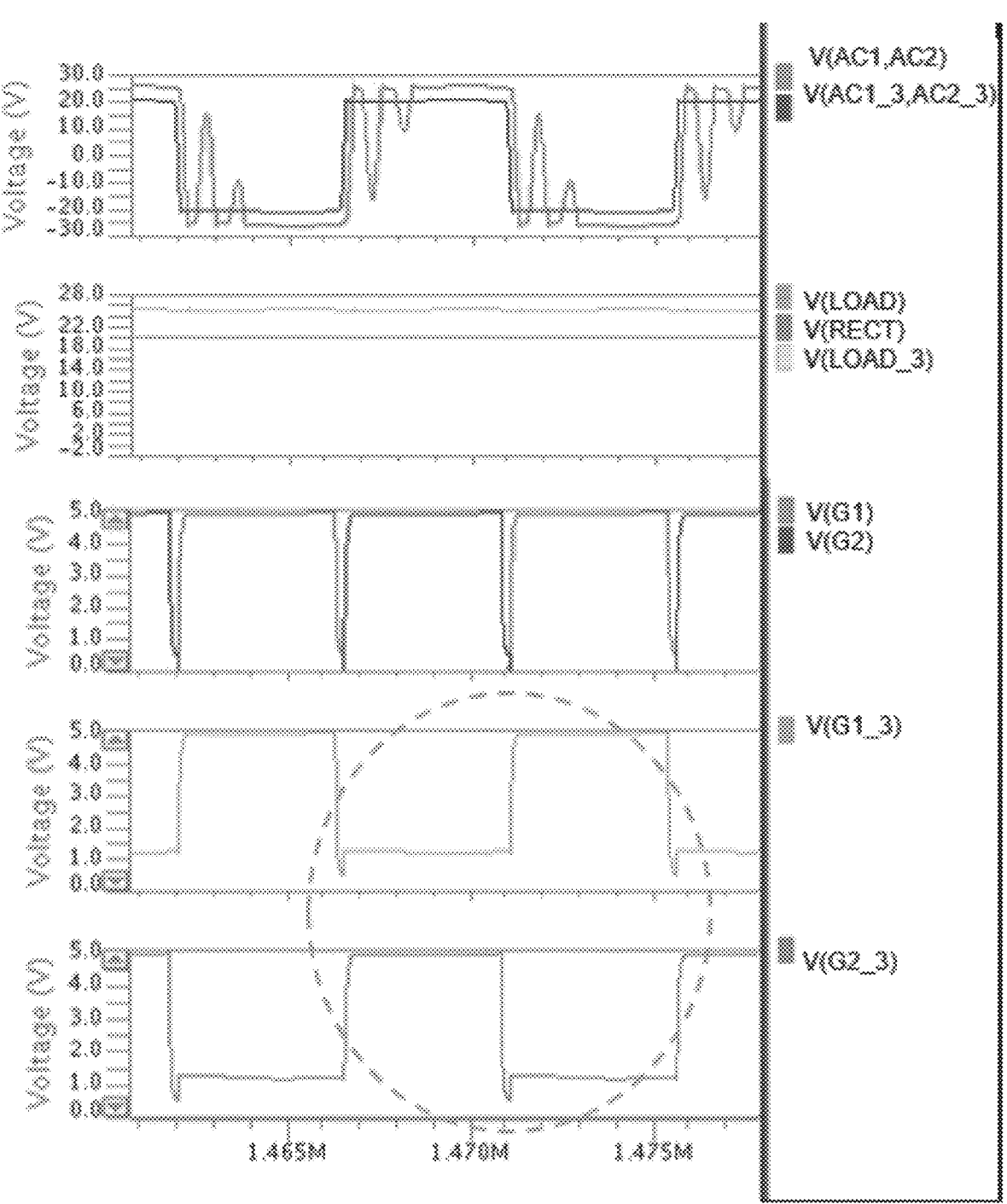
FIG. 23 is a timing diagram showing voltages of the wireless power transmission system of FIG. 2 in operation, when the feedback loop is controlling the bridge rectifier to perform low-side anti-phase parallel voltage regulation. Note that here, the feedback generation of the feedback signal is filtered, so the gates of the transistors of the bridge rectifier are driven pseudo-statically.
Figure 24:
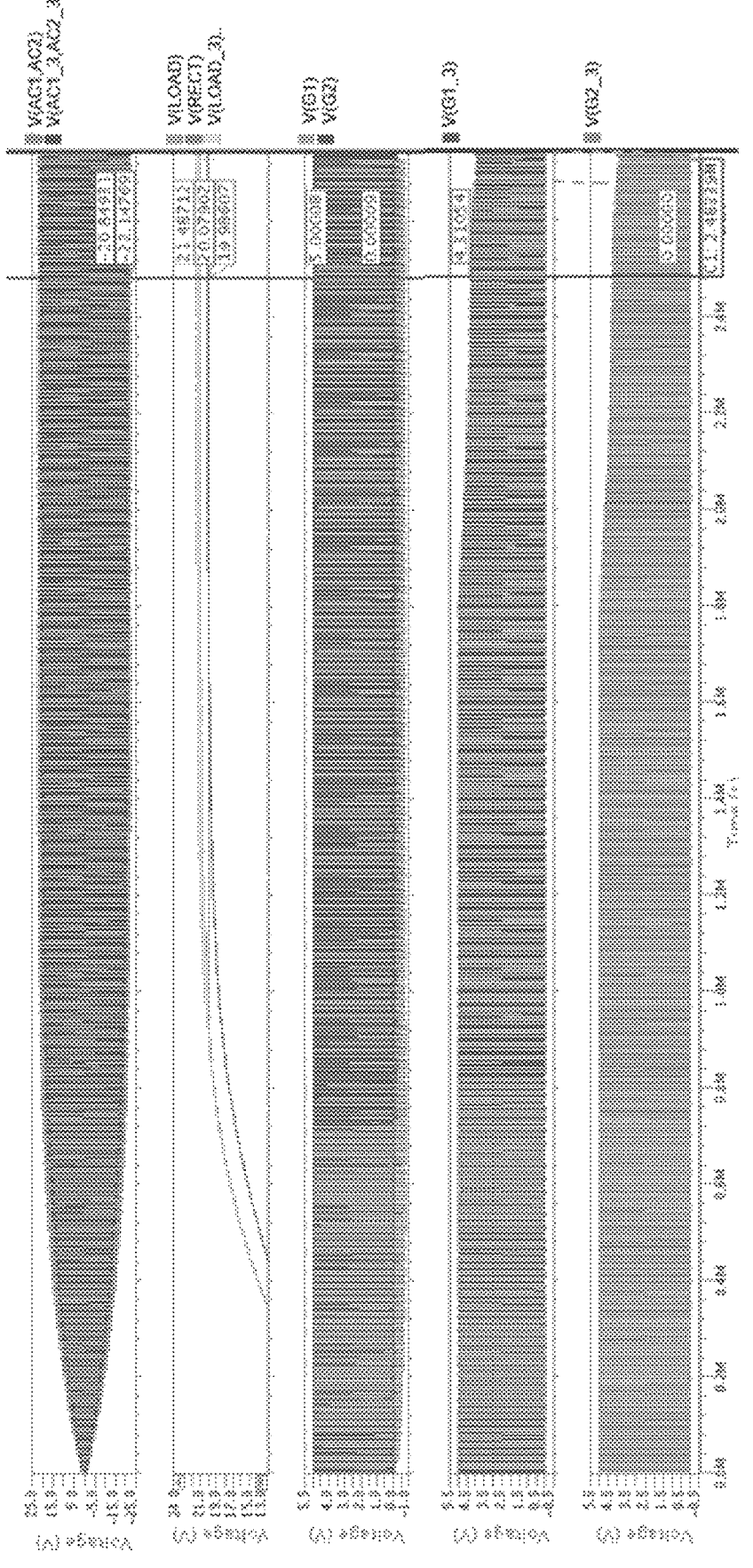
FIG. 24 is a timing diagram showing voltages of the wireless power transmission system of FIG. 2 in operation, when the feedback loop is controlling the bridge rectifier to perform low-side in-phase serial voltage regulation. Note that here, the feedback generation of the feedback signal is filtered, so the gates of the transistors of the bridge rectifier are driven pseudo-statically.
Figure 25:
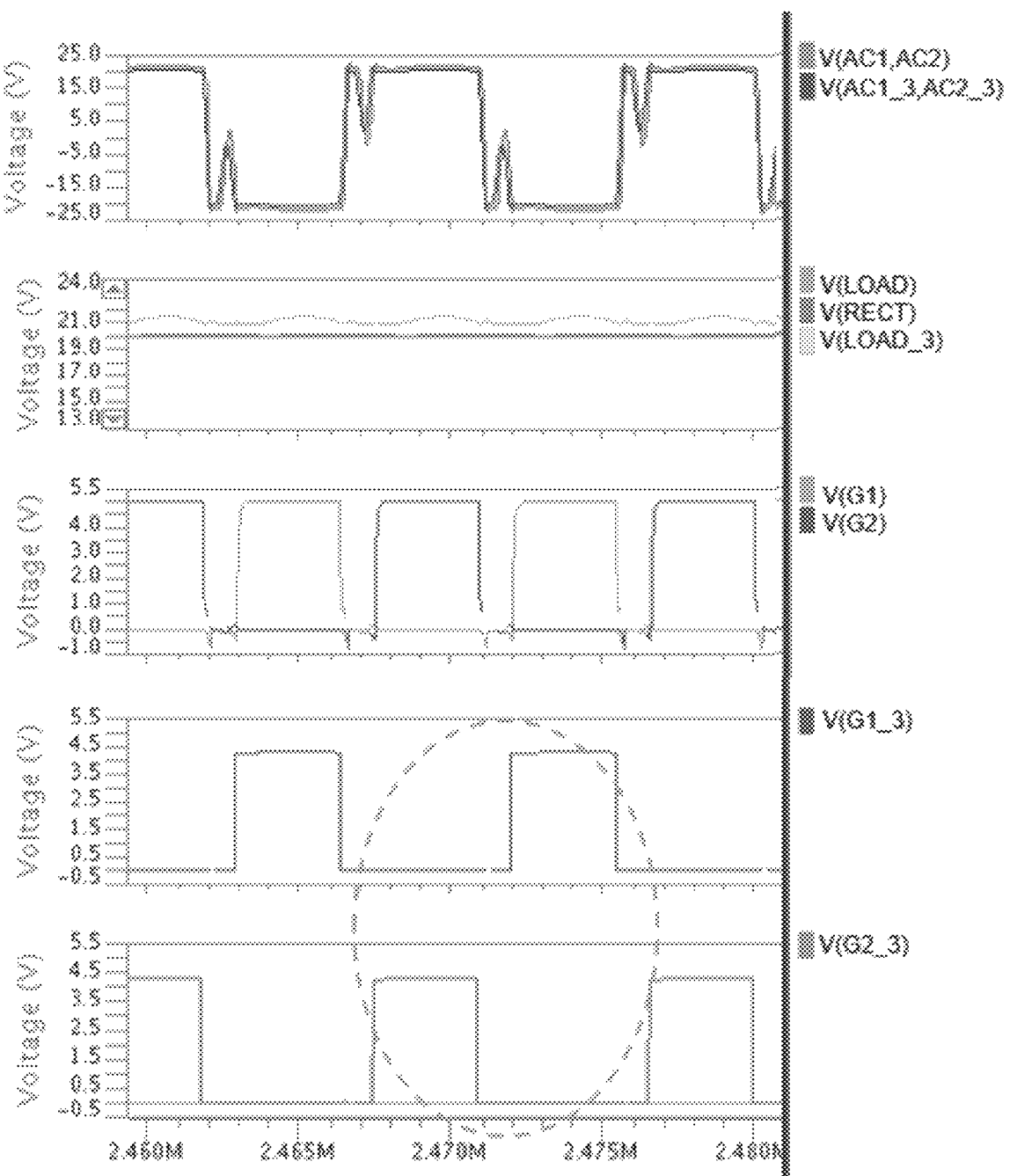
FIG. 25 is a timing diagram showing voltages of the wireless power transmission system of FIG. 2 in operation, when the feedback loop is controlling the bridge rectifier to perform low-side in-phase serial voltage regulation. Note that here, the feedback generation of the feedback signal is filtered, so the gates of the transistors of the bridge rectifier are driven pseudo-statically.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, allowing the gates of the transistors M1-M4 to be driven pseudo-statically. Waveforms showing this mode of operation, when operating using anti-phase parallel regulation can be seen in FIGS. 22-23, and when operating using in-phase serial regulation can be seen in FIGS. 24-25.

2. PWM Control of Transistor Gates

In the description given above, the gate voltages G1-G4 of the transistors M1-M4 are modulated in an analog fashion by the control circuitry 24 to perform in-phase serial voltage regulation. Now, techniques for modulating the gate voltages G1-G4 of the transistors M1-M4 using pulse width modulation (PWM) to perform in-phase serial voltage regulation are described.

A first way in which to operate the gates of the transistors from among M1-M4 to be regulated involves simple on-off PWM. Here the amplifier 23 is configured as a comparator to provide the feedback signal FB as a digital output, resulting in a pulse FB during which the output voltage Vrect exceeds the reference voltage Vref. During this pulse, the transistors from among M1-M4 that are fully on during the current phase are turned fully off in response to the rising of FB by their respective gate voltages being pulled to ground, in turn increasing power dissipation. Thus, through feedback, the duration of the gate voltages G1-G4 driving the transistors M1-M4 are adjusted so that the output pulse duration of the regtifier 25 is just long enough to provide the requisite power but just short enough to dissipate excess power.

Figure 12:
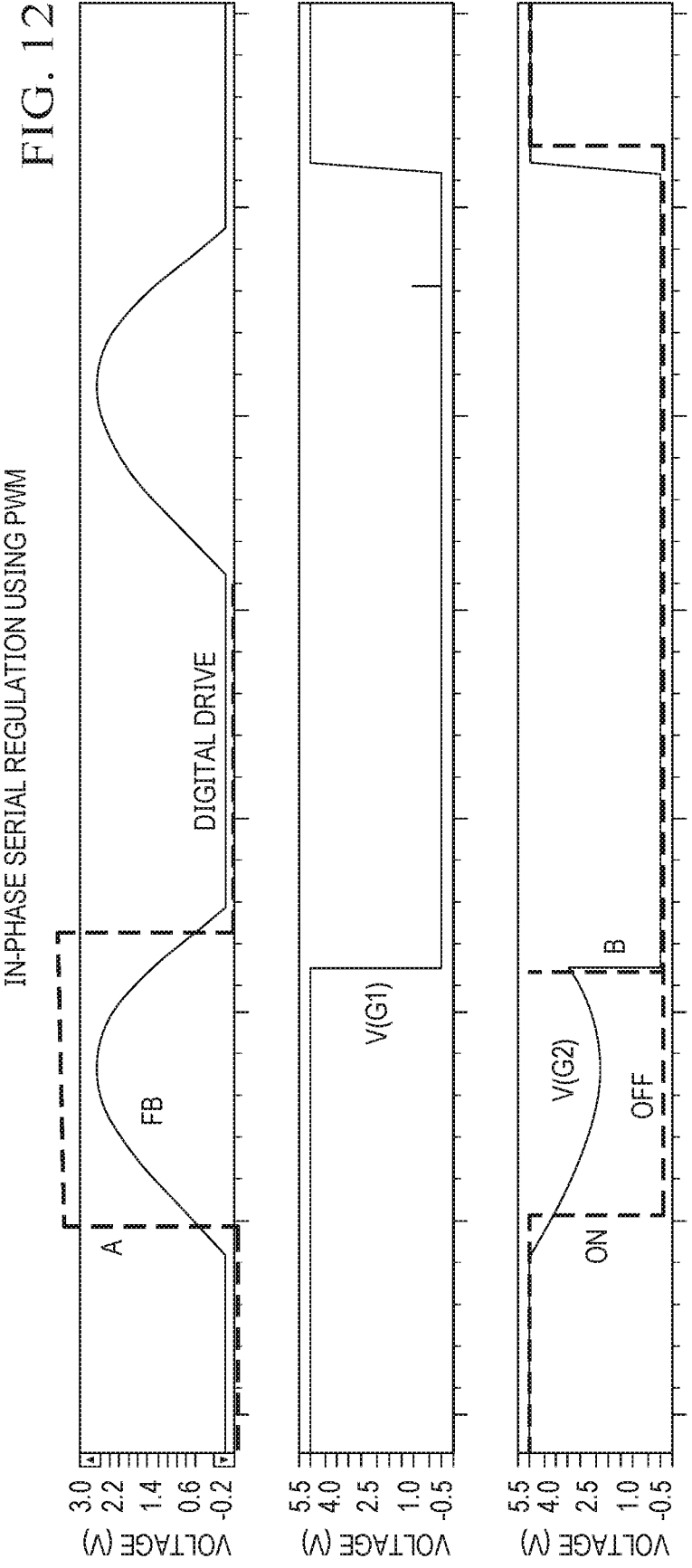
FIG. 12 is a timing diagram showing the digitization of the feedback signal FB and the PWM control of the modulated transistors, when operating using PWM based in-phase serial voltage regulation.
Figure 13:
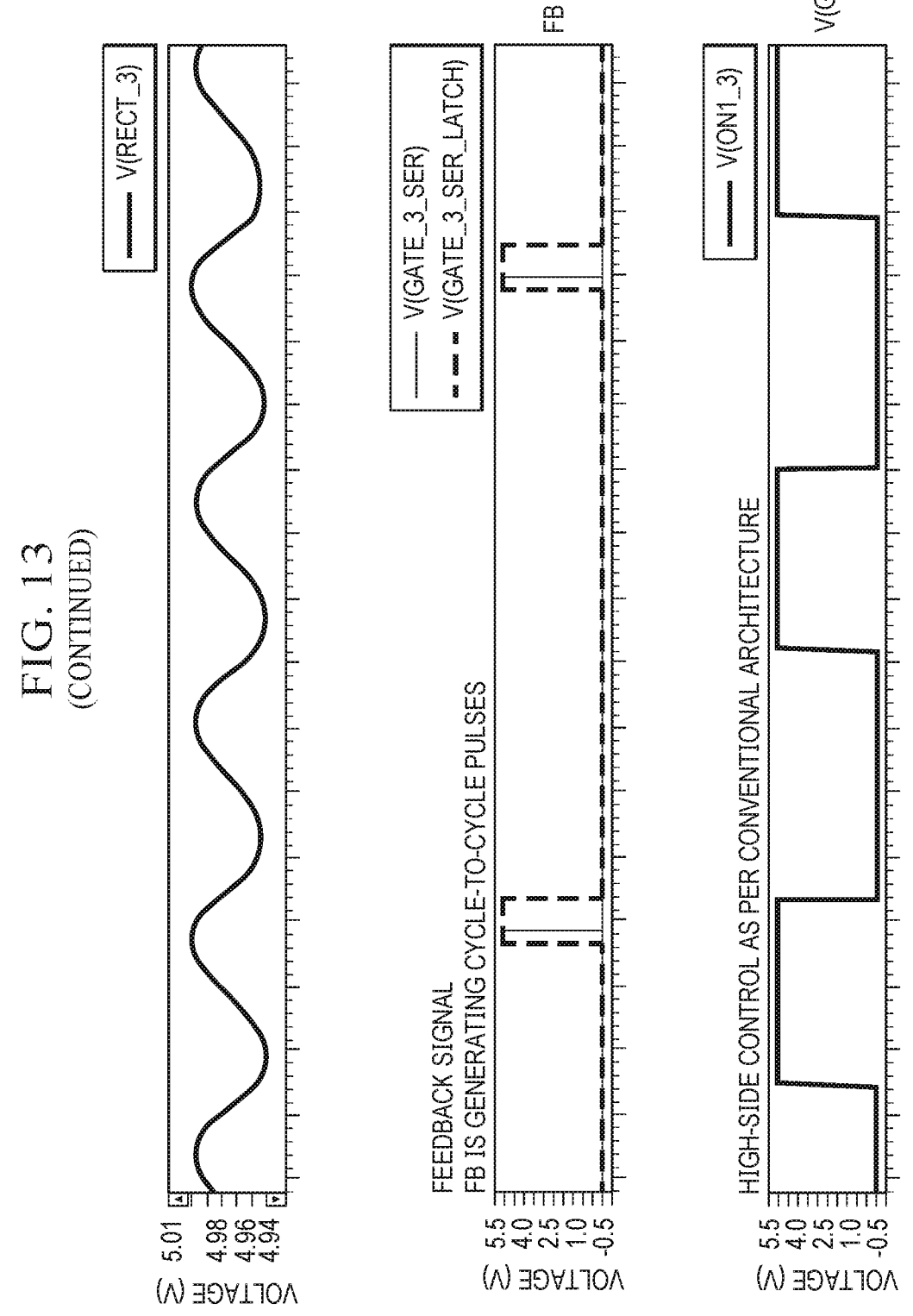
FIG. 13 is a timing diagram showing voltages of the wireless power transmission system of FIG. 2 in operation, when the feedback loop is controlling the bridge rectifier to perform low-side PWM based in-phase serial voltage regulation.

A simple example of this technique as compared to the non-PWM in-phase serial voltage rectification technique can be seen in the traces of FIGS. 12-13, where it can be seen that here the feedback signal FB is digitized, that the gate voltage G1 is maintained as fully high during Phase A, and that the gate voltage G2 is pulled low approximately halfway through Phase A to increase the drain to source resistance of the transistor M2 to increase power dissipation. Note that as shown, spikes may occur in the gate voltage G2 being modulated, and these spikes may be filtered by the control circuitry 24, such as by using a debouncing function.

Figures 14, 15:
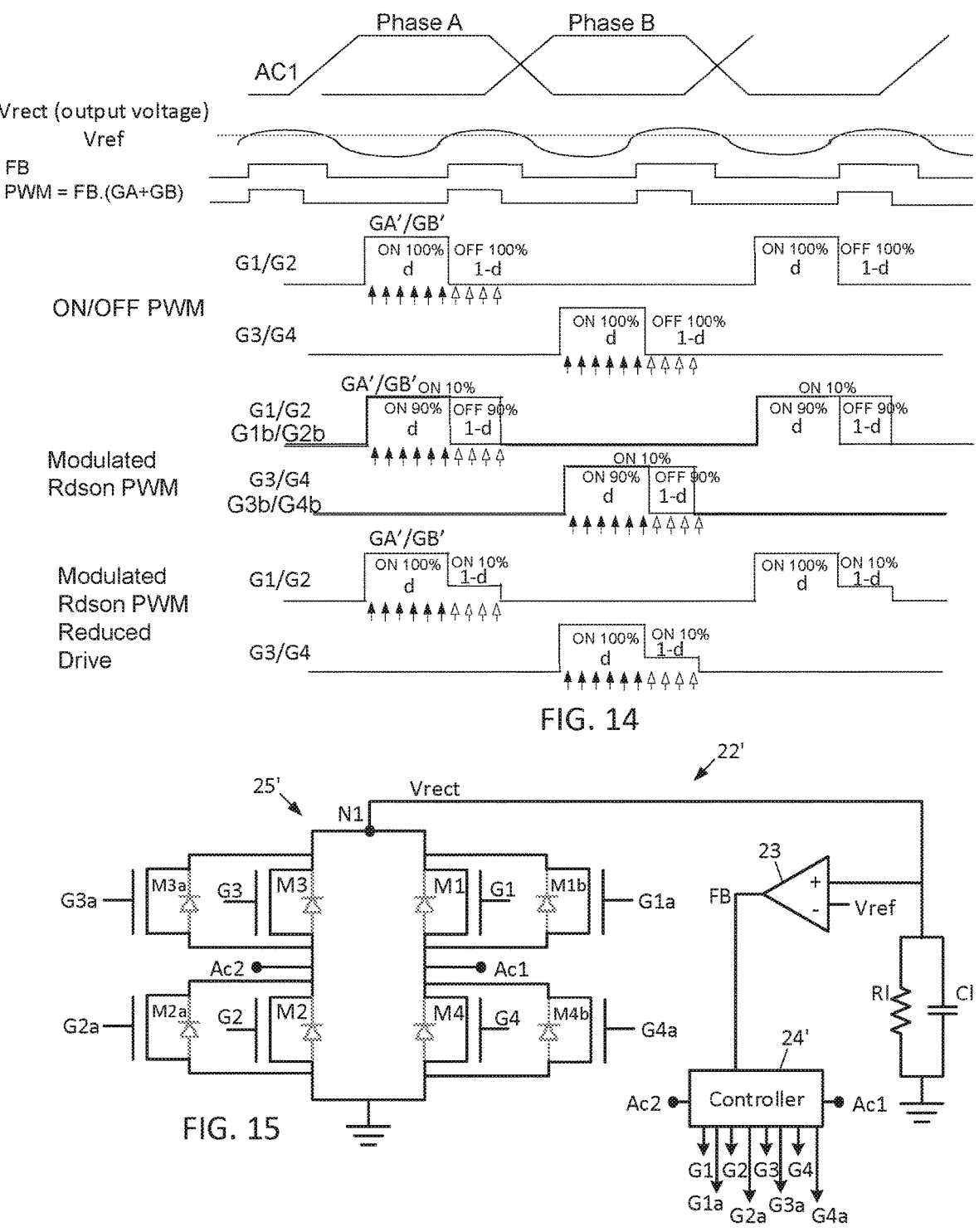
FIG. 14 are timing diagrams showing the three different PWM control techniques available when the feedback loop is controlling the bridge rectifier to perform low-side PWM based in-phase serial voltage regulation.
FIG. 15 is a schematic diagram of an alternate configuration for the regtifier of FIG. 2.

In the example of FIG. 13, the gate voltages G2 and G4 of the low side transistors (M2 and M4) are modulated while the gate voltages G1 and G3 of the high side transistors (M1 and M3) are not. However, both low side and high side transistors may be modulated. As shown in FIG. 14, during phase A, so as to provide for voltage regulation, the gate voltages G1 and G2 are fully turned off (in response to the feedback signal FB rising, which as can be seen, occurs when Vrect exceeds Vref) earlier than they would otherwise be using a conventional wireless power transmission system, maintaining the output voltage Vrect at a desired level and dissipating excess power. Similarly, during phase B, so as to provide for voltage regulation, the gate voltages G3 and G4 are fully turned off (in response to the feedback signal FB rising) earlier than they would otherwise be using a conventional wireless power transmission system, maintaining the output voltage Vrect at a desired level and dissipating excess power.

A second way in which to operate the gates of the transistors from among M1-M4 to be regulated involves modifying the regtifier itself to produce a modified regtifier 25'. As can be seen in FIG. 15, each transistor of the regtifier 25' has been divided into two parallel coupled transistors having different W/L ratio as one another so as to provide different resistivities when controlled individually, with the sum of the widths and lengths of the transistors of each parallel coupled pair being equal to the width and length of the corresponding transistor of the regtifier 25, so as to provide a total the same as the regtifier 25 resistivity when fully ON. Therefore, the regtifier 25 is comprised of: n-channel transistors M1 and M1b coupled in parallel, with their drains coupled to node N1, their sources coupled to node Act, and their gates respectively coupled to receive the gate voltages G1 and G1a; n-channel transistors M4 and M4b coupled in parallel, with their drains coupled to node Ac1, their sources coupled to ground, and their gates respectively coupled to receive the control signals M4 and M4a; n-channel transistors M3 and M3a coupled in parallel, with their drains coupled to node N1, their sources coupled to node Ac2, and their gates respectively coupled to receive the gate voltages G3 and G3a; and n-channel transistors M2 and M2$a$ coupled in parallel, with their drains coupled to node Ac2, their sources coupled to ground, and their gates respectively coupled to receive the gate voltages G2 and G2$a$.

The area of the transistor M1 in the regtifier 25' is 90% of the area of the transistor M1 in the regtifier 25 and the area of the transistor M1$a$ in the regtifier 25' is 10% of the area of the transistor M1 in the regtifier 25; the area of the transistor M2 in the regtifier 25' is 90% of the area of the transistor M2 in the regtifier 25 and the area of the transistor M2$a$ in the regtifier 25' is 10% of the area of the transistor M2 in the regtifier 25; the area of the transistor M3 in the regtifier 25' is 90% of the area of the transistor M3 in the regtifier 25 and the area of the transistor M3$a$ in the regtifier 25' is 10% of the area of the transistor M3 in the regtifier 25; and the area of the transistor M4 in the regtifier 25' is 90% of the area of the transistor M4 in the regtifier 25 and the area of the transistor M4$a$ in the regtifier 25' is 10% of the area of the transistor M4 in the regtifier 25. Note that the relative sizes of the transistors M1-M4 described above may change, and that, for example, the transistors M1-M4 of the regtifier 25' may be 80% of the area of the transistors M1-M4 of the regtifier 25, while the transistors M1$a$-M4$a$ of the regtifier 25' may be 20% of the area of the transistors M1-M4 of the regtifier 25.

Together with this, the control circuitry 24' is also modified, as shown in FIG. 15, to output the gate voltages G1$a$-G4$a$ in addition to the gate voltages G1-G4.

Figure 16:
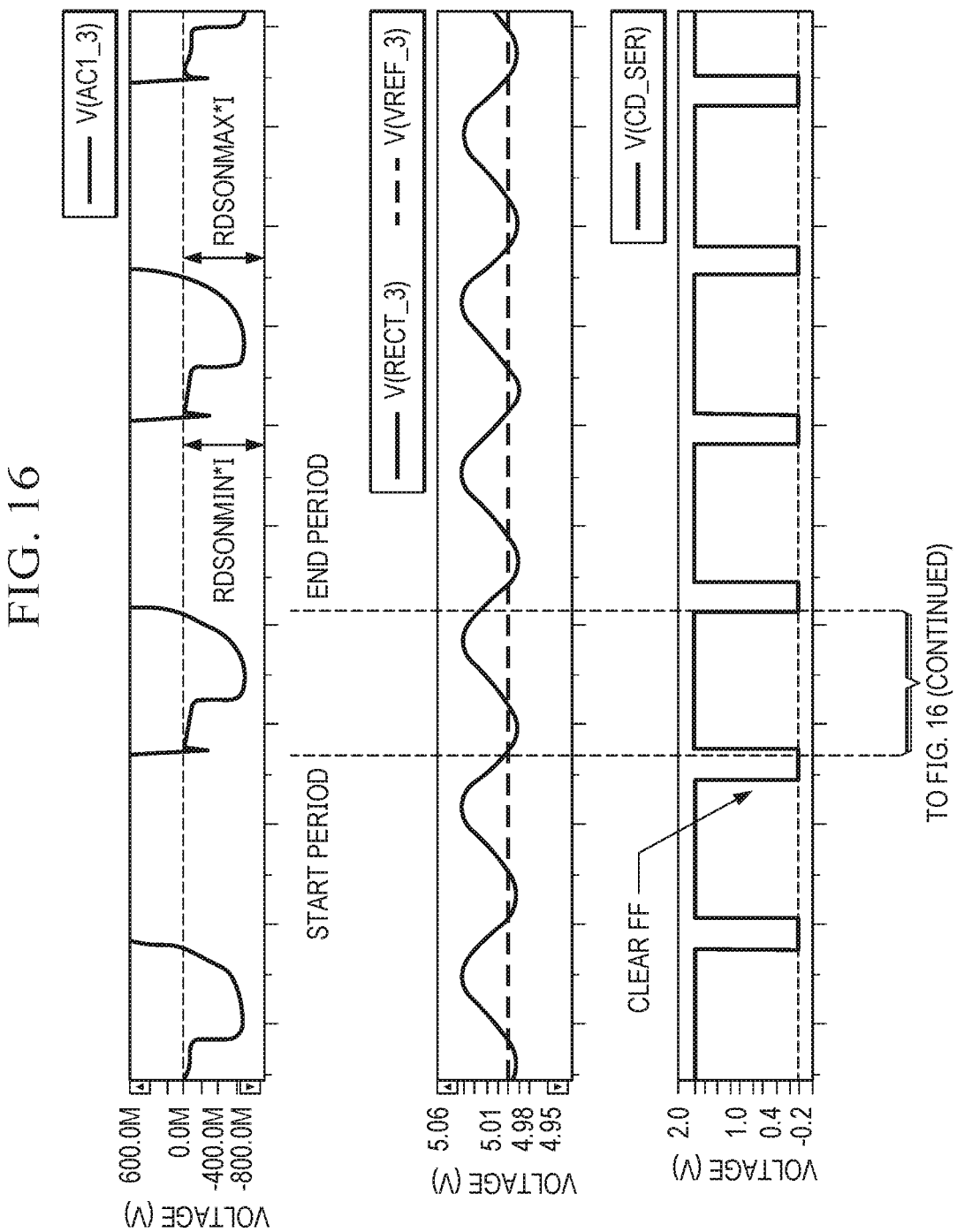
FIG. 16 is a timing diagram showing one of the PWM control techniques available when the feedback loop is controlling the bridge rectifier to perform low-side PWM based in-phase serial voltage regulation using the regtifier of FIG. 16.
Figure 16:
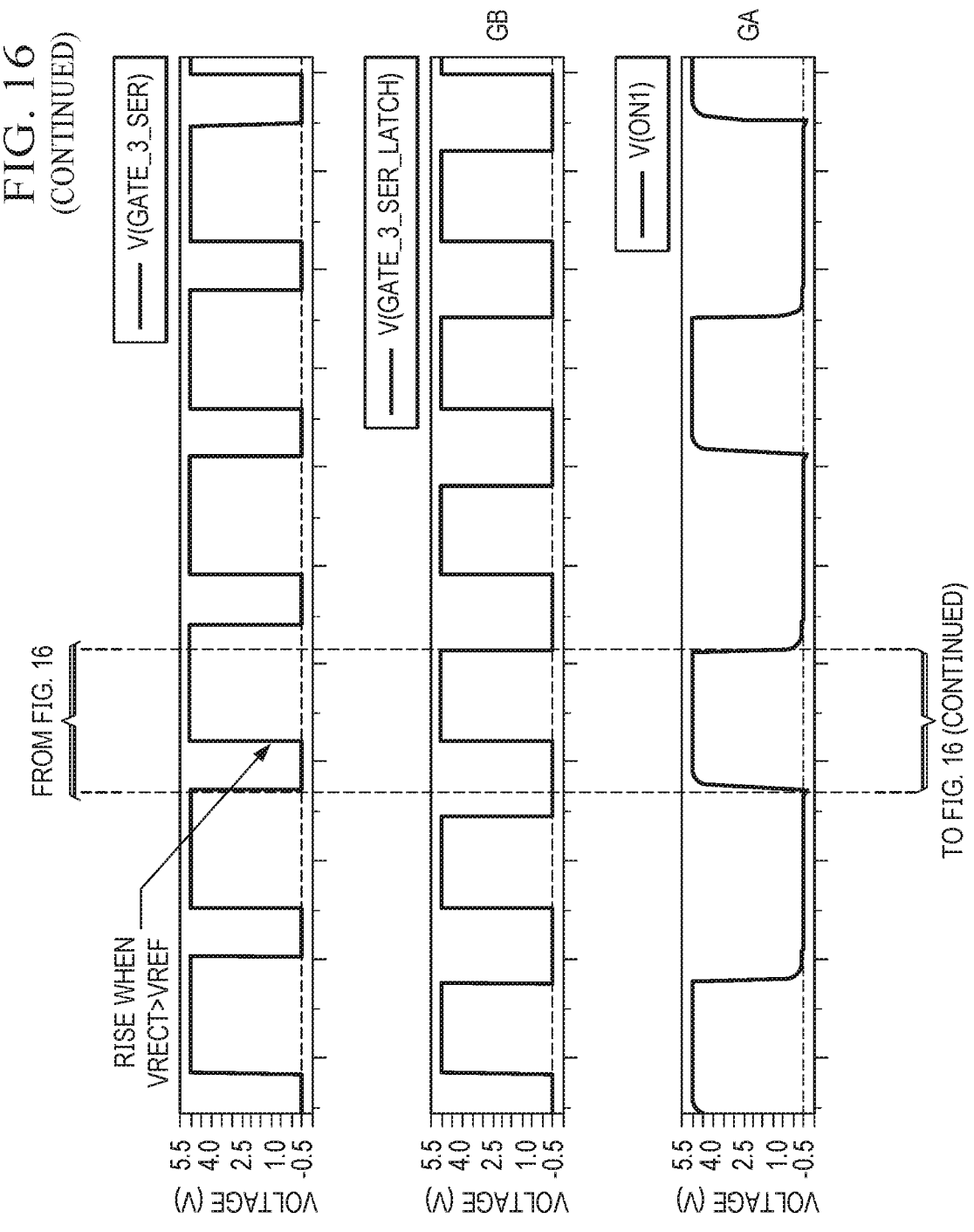
Figure 16:
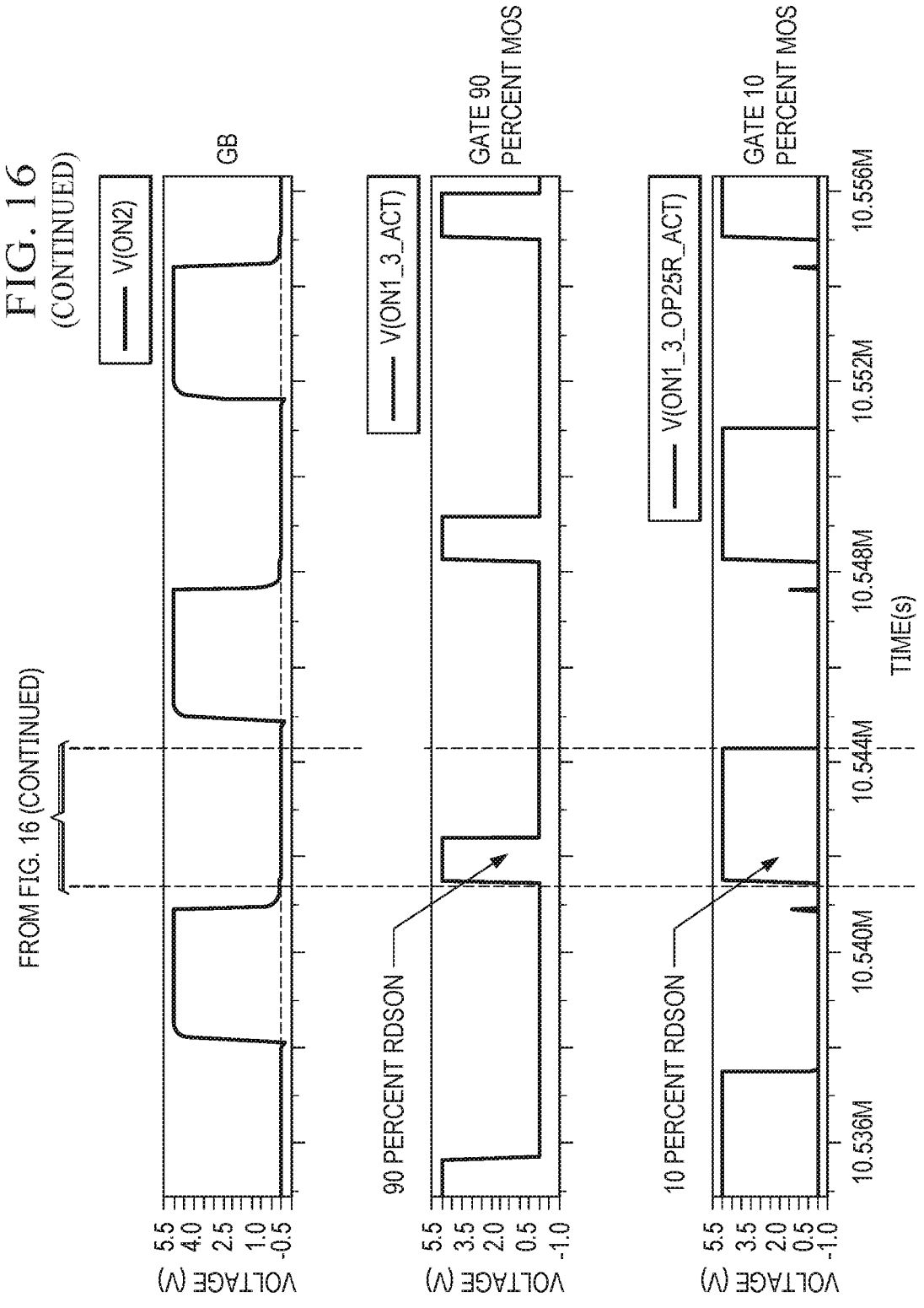

With this modified regtifier 25', as can be seen in FIGS. 14 and 16, during phase A, the gate voltages G1$a$ and G2$a$ are fully high for the entire phase, while the gate voltages G1 and G2 are fully high for a first portion of the phase and then fall low for the remainder of the phase. Similarly, during phase B, the gate voltages G3$a$ and G4$a$ are fully high for the entire phase, while the gate voltages G3 and G4 are fully high for a first portion of the phase and then fall low for the remainder of the phase. Using this technique helps avoid the inducing of noise that can result when a transistor that is fully on is turned off, since the transistors G1$a$ and G2$a$ remain on for the remainder of Phase A when the transistors G1 and G2 are turned off, and since the transistors G3$a$ and G4$a$ remain on for the remainder of Phase B when the transistors G3 and G4 are turned off.

A third way in which to operate the gates of the transistors from among M1-M4 to be regulated involves switching the gate voltages G1-G4 between first and second pre-determined constant drive voltages. As shown in FIG. 14 during phase A, the gate voltages G1 and G2 are fully high (the first constant drive voltage) for a first portion of the phase and then fall to the second constant drive voltage for the remainder of the phase. Similarly, during phase B, the gate voltages G3 and G4 are fully high (the first constant drive voltage) for a first portion of the phase and then fall to the second constant drive voltage for the remainder of the phase. The first portion of Phases A and B may be about 90% of the total elapsed time of those phases, while the second portion of Phases A and B may be the remainder of the total elapsed time of those phases.

It is to be noted that while the first way of operating the gates in FIG. 14 may induce noise that can result when a transistor is turned off, while the second way may lead to high current density in the small device (10%) during repeated lapses of time, the third way has the benefit of simplicity of the digital approach as it uses only two drive levels, but also allows minimization of the current density in the devices as would the analog method.

Note that the feedback loop formed by the amplifier 23 and the control circuitry 24 may be operated at a sufficient speed so that its duty cycle reacts on a cycle-to-cycle basis, enabling the control circuitry 24 to alter the generation of the gate voltages G1-G4 on a cycle to cycle basis when performing in-phase serial voltage regulation. This feedback technique can be observed in the graph of FIG. 9, where the feedback signal FB is generated during each phase, enabling the gate voltages G1-G4 to be altered on a cycle-to-cycle basis.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, leading to a slow-moving duty cycle, allowing the gates of the transistors M1-M4 to be driven pseudo-statically.

C. Operation Using Anti-Phase Parallel Voltage Regulation

Operation of the wireless power transmission system 20 under an anti-phase parallel voltage regulation scheme controlled by the control circuitry 24 is now described.

Shown in the graph of FIG. 6 are waveform traces of the signals at the nodes Ac1 and Ac2. Notice that when the signal at Ac1 is high, it is labeled as Phase A, that when the signal at Ac2 is high, it is labeled as Phase B, and that the signals at Ac1 and Ac2 are 180° out of phase with one another.

During Phase A, the gate voltages G1 and G2 are driven, fully turning on transistors M1 and M2, while during Phase B, the gate voltages G3 and G4 are driven, instead fully turning on transistors M3 and M4. Conventionally, the transistors from among M1-M4 not turned on during a given phase are fully turned off.

However, with the anti-phase parallel voltage regulation scheme, when the incoming power delivered by the regtifier 25 to the load is greater than the amount of load consumed by the load, the voltage Vrect at node N1 rises to be greater than the reference voltage Vref, causing the feedback signal FB to rise. When the feedback signal FB rises, the control circuitry 24 modulates the appropriate gate voltages from among G1-G4 to turn on one or more of the two transistors M1 and M2, or M3 and M4 that would conventionally be off during the current phase and place those transistors in the saturation region of operation. The result is that these transistors M1 and M2, or M3 and M4 that are additionally turned on draw a moderate current but have a large drain to source voltage hence inducing sufficient power losses to consume the excess incoming power.

In greater detail, as shown in FIG. 6, in phase A, the gate voltages G1 and G2 are high to turn transistors M1 and M2 fully on and maintain those transistors fully on during phase A. However, here, the gate voltages G3 and G4 are also driven, albeit at a lesser voltage magnitude than the gate voltages G1 and G2, to thereby sufficiently turn on transistors M3 and M4 with a drain to source voltage and associated impedance sufficient to dissipate additional power over conventional operation Similarly, in phase B, the gate voltages G3 and G4 are high to turn transistors M3 and M4 fully on and maintain those transistors fully on during Phase B. However, here, the gate voltages G1 and G2 are also driven, albeit at a lesser voltage magnitude than the gate voltages G3 and G4, to thereby sufficiently turn on transistors M1 and M2 with a drain to source voltage and associated impedance and drain to source current sufficient to dissipate additional power over conventional operation.

Figure 7:
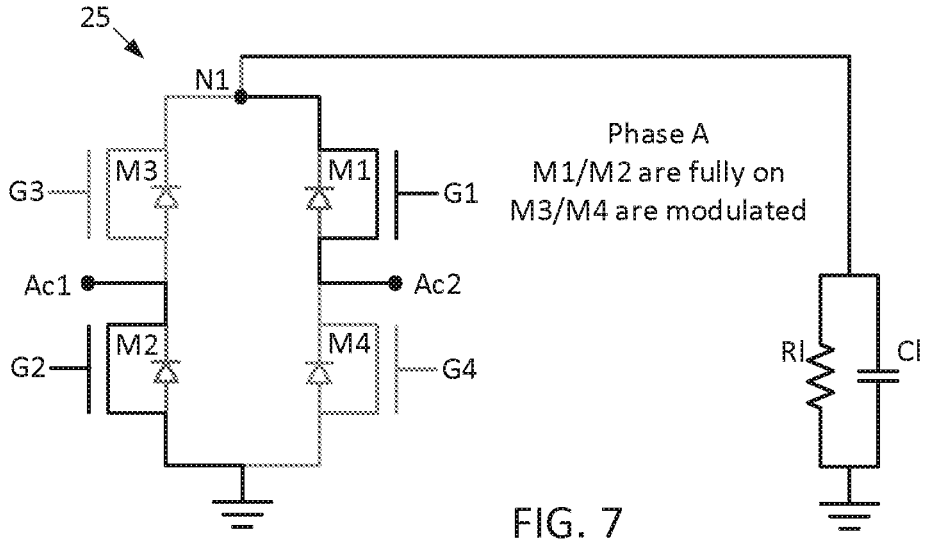
FIG. 7 is a schematic block diagram of the wireless power transmission system of FIG. 2 showing its operation during phase A of the anti-phase parallel voltage regulation of FIG. 6.
Figure 8:
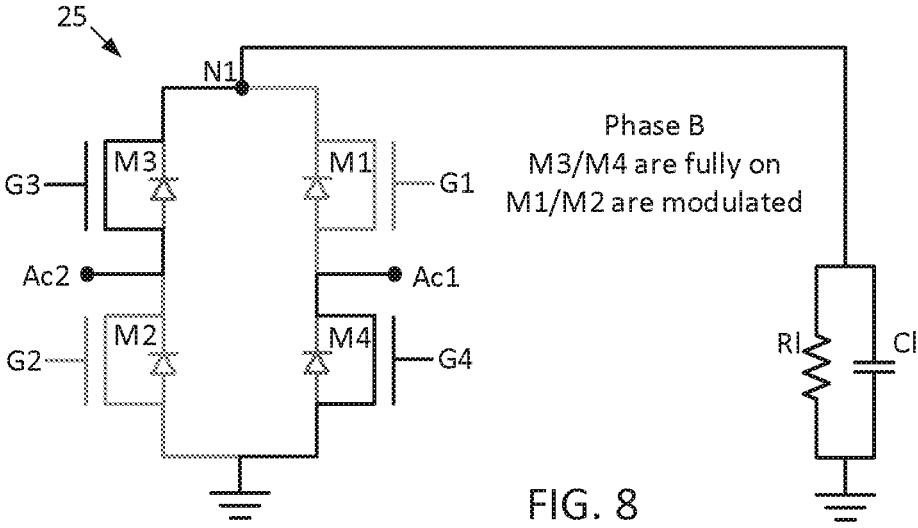
FIG. 8 is a schematic block diagram of the wireless power transmission system of FIG. 2 showing its operation during phase B of the anti-phase serial voltage regulation of FIG. 6.

This operating scheme is referred to as anti-phase parallel regulation because the transistors M1-M4 that are conventionally fully on during a given phase remain fully on while the transistors from among M1-M4 that are conventionally off during the given phase are turned on enough to dissipate the excess power not consumed by the load, and because, as shown in FIGS. 7-8, the power dissipation is achieved by increasing the conductivity of the elements and creating an additional current path in devices which are OFF in conventional operation and which are actually in parallel with the main current path while turned ON when operating using the described method.

Note that during Phase B, the gate voltages G1 and G2 need not both be modulated to turn on their respective transistors M1 and M2 in the linear mode of operation while the gate voltages G3 and G4 remain high to maintain their respective transistors M3 and M4 fully turned on, and instead only one of the gate voltages G1 or G2 can be modulated while the other gate voltage can remain off to keep its respective transistor M1 or M2 fully off.

Similarly, during Phase A the gate voltages G3 and G4 need not both be modulated while the gate voltages G1 and G2 remain high to maintain their respective transistors M1 and M2 fully turned on, and instead only one of the gate voltages G3 or G4 can be modulated while the other gate voltage can remain off to keep its respective transistor M3 or M4 fully off.

Figure 10:
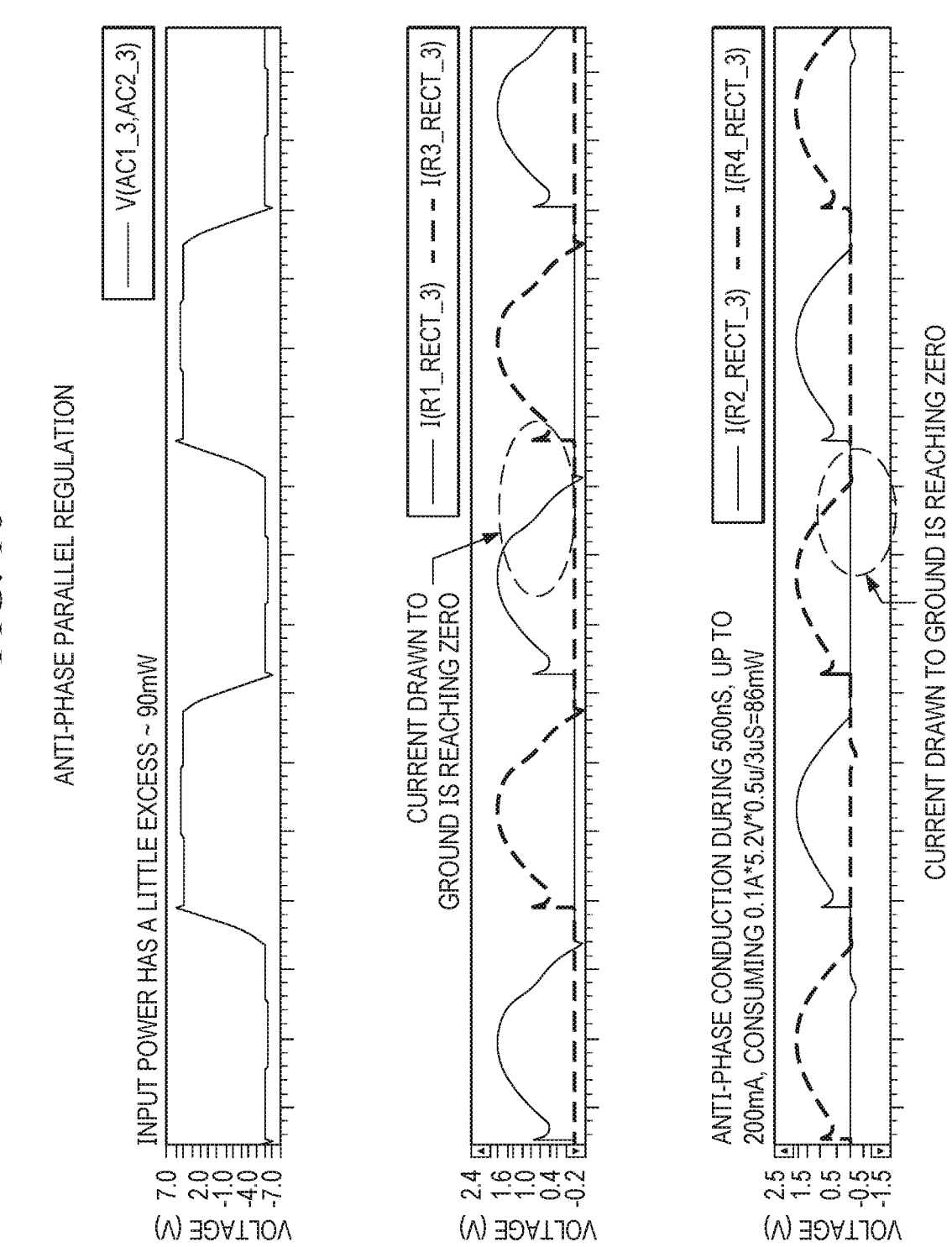
FIG. 10 is a timing diagram showing voltages of the wireless power transmission system of FIG. 2 in operation, when the feedback loop is controlling the bridge rectifier to perform low-side anti-phase parallel voltage regulation.
Figure 10:
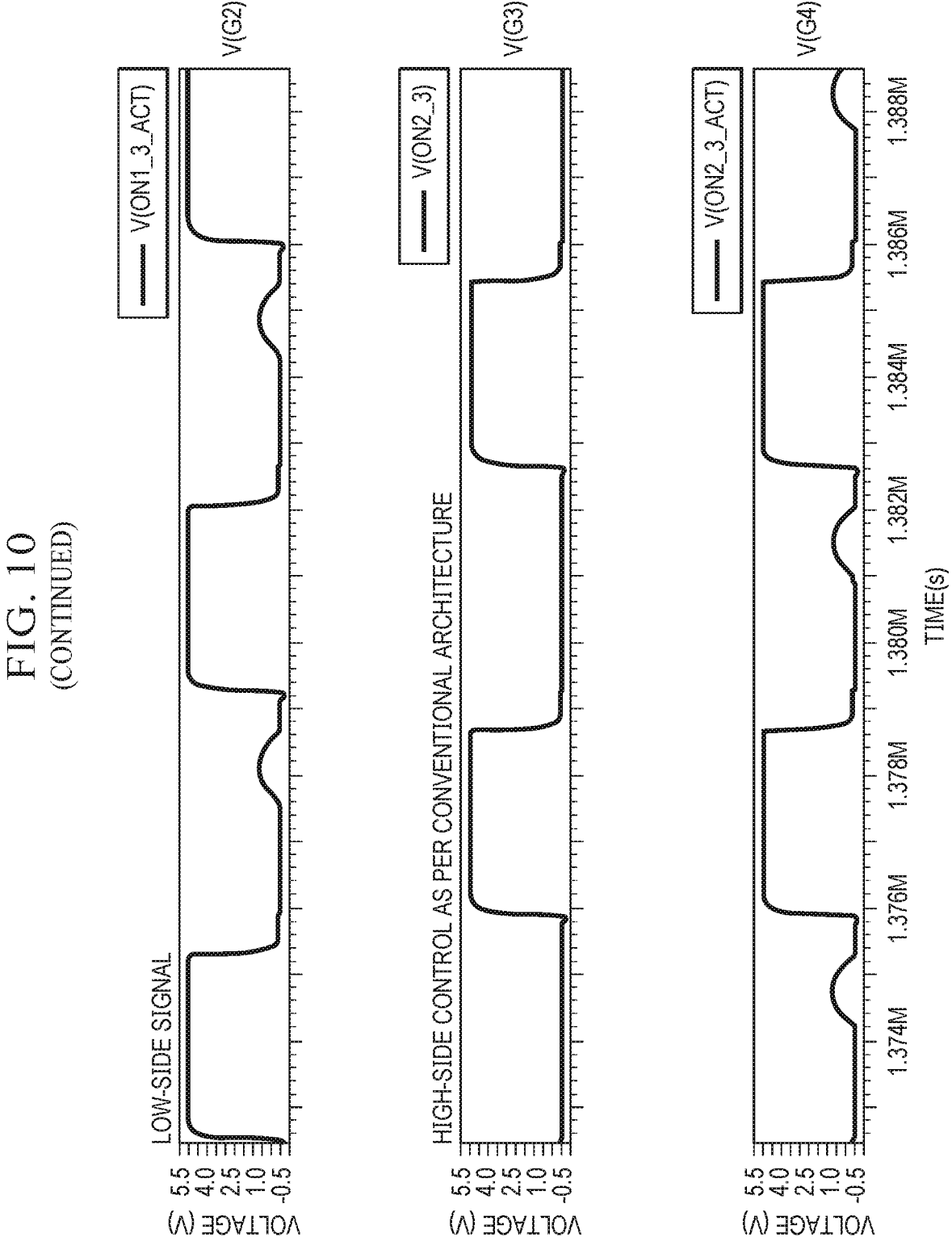

As an example of this form of operation where one transistor M1-M4 is modulated during the phase when it would conventionally be fully off, shown in FIG. 10 are additional waveforms of the wireless power transmission system 20 operating using anti-phase parallel regulation. Here, it can be seen that the feedback signal FB is generated during each phase, and that during Phase A, the gate voltages G1 and G2 are fully high to turn on the transistors M1 and M2, while the gate voltage G4 rises to about 1V to turn on the transistor M4 with a drain to source resistance sufficient to dissipate additional power over conventional operation. It can also be seen that during Phase B, the gate voltages G3 and G4 are fully high to turn on the transistors M3 and M4, while the gate voltage G2 rises to about 1V to turn on the transistor M2 with a drain to source resistance sufficient to dissipate additional power over conventional operation.

The anti-phase parallel voltage regulation scheme described above is particularly suited to use where the voltage output Vrect by the regtifier 25 is not relatively low and where the expected excess power to be dissipated is also not relatively low. Therefore, when operated using the anti-phase parallel voltage regulation scheme, the regtifier 25 is able to dissipate substantial excess power while maintaining the transistors of the regtifier 25 within their safe operating limits Note that the feedback loop formed by the amplifier 23 and the control circuitry 24 may be operated at a sufficient speed so that it reacts on a cycle-to-cycle basis, enabling the control circuitry 24 to alter the generation of the gate voltages G1-G4 on a cycle to basis when performing anti-phase parallel voltage regulation. This feedback technique can be observed in the graph of FIG. 10 where the feedback signal FB is generated during each phase, enabling the gate voltages G1-G4 to be altered on a cycle-to-cycle basis.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, allowing the gates of the transistors M1-M4 to be driven pseudo-statically.

D. Combination of In-Phase Serial and Anti-Phase Parallel Voltage Regulation Since the in-phase serial voltage regulation described above involves modulating the gate voltage of one or both of the transistors conventionally on during a given phase, and since the anti-phase parallel voltage regulation described above involves modulating the gate voltage of one or both of the transistors conventionally off during that given phase, it should be appreciated that these two techniques may be utilized simultaneously. Therefore, the gate voltage of one or two transistors of the regtifier 25 may be modulated according to the in-phase serial regulation scheme, while the gate voltage of one or two other transistors of the regtifier may be modulated according to the anti-phase parallel regulation scheme, and while non-modulated transistors of the regtifier 25 are operated conventionally.

In addition, in some cases, the in-phase serial voltage regulation scheme and the anti-phase parallel voltage regulation scheme may be used separately. For example, the in-phase serial voltage regulation scheme may be used during one phase and the anti-phase parallel voltage regulation scheme may be used during the following phase.

As another example of the combination of the in-phase serial voltage regulation and the anti-phase parallel voltage regulation, the in-phase serial voltage regulation scheme may be used for a given number of phases (e.g., for one phase A and the successive phase B) and then the anti-phase parallel voltage regulation scheme may be used for a given number of phases (e.g., for the next phase A and the successive phase B).

As another example of the combination of the in-phase serial voltage regulation and the anti-phase parallel voltage regulation, the in-phase serial voltage regulation scheme may be used on one or both of the high side transistors (transistors M1 and M3) while the anti-phase parallel voltage regulation scheme may be used on one or both of the low side transistors (transistors M2 and M4), or vice versa.

As yet another example, which of the in-phase serial voltage regulation and the anti-phase parallel voltage regulation schemes is used may be switched depending upon the extra power to be dissipated. The gate voltages G1-G4 may be generated so as to operate the regtifier using the in-phase serial voltage regulation scheme when the extra power to be dissipated is below a certain threshold, and the gate voltages G1-G4 may then switch to being generated so as to operate the regtifier 25 using the anti-phase serial voltage regulation scheme, when the extra power to be dissipated is above the threshold.

E. Control Signal Generation and Feedback Loop

Figure 19:
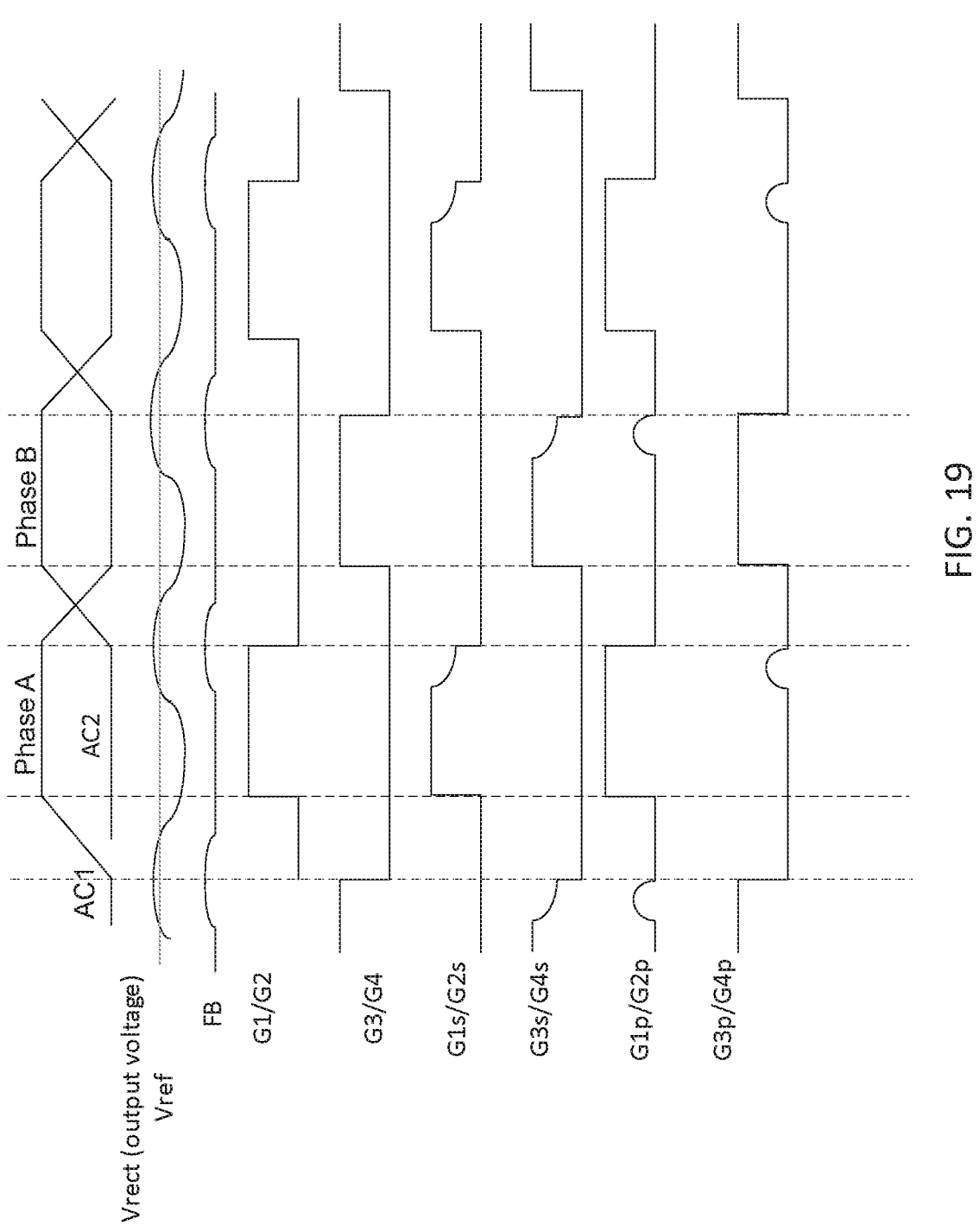
FIG. 19 is a timing diagram showing voltages of the wireless power transmission system of FIG. 2 in operation, when the feedback loop is controlling the bridge rectifier to perform in-phase serial voltage regulation as well as anti-phase parallel voltage regulation.

Now described with reference to FIGS. 17 and 19 is the control circuitry 24. First, the generation of the control signals GA and GB will be described, and thereafter, the generation of the gate voltages for the transistors M1-M4 from the gate voltages GA and GB will be described.

The control circuitry 24 includes a hysteretic comparator 51 having a non-inverting terminal coupled to node Ac1, an inverting terminal coupled to ground, and an output which produces GA.

The control circuitry 24 includes a hysteretic comparator 54 having a non-inverting terminal coupled to node Ac2, an inverting terminal coupled to ground, and an output which produces GB.

Figure 17A:
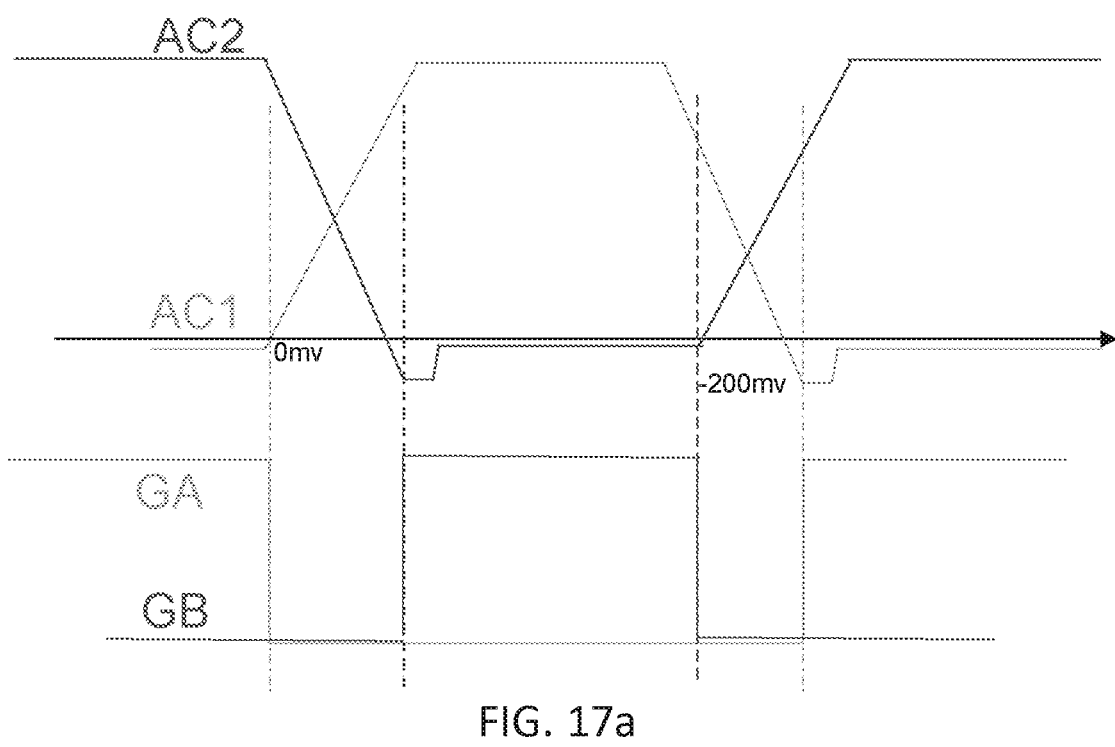
FIG. 17a is a timing diagram of the AC1 and AC2 signals and associated produced GA and GB signals within the controller of FIG. 2.
Figure 17B:
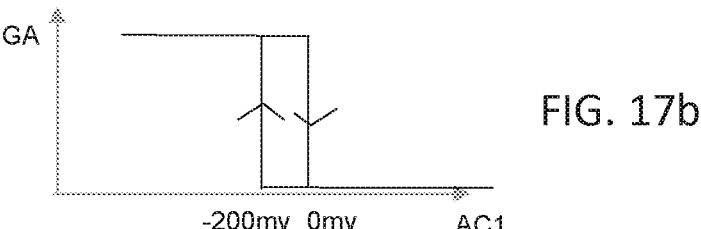
FIG. 17b is an output/input transfer function of a hysteretic comparator used within the controller of FIG. 2 for producing the GA and GB signals.
Figure 17C:
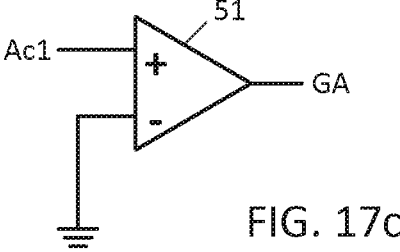
FIG. 17c is a schematic of a hysteretic comparator used for producing the GA signal.
Figure 17D:
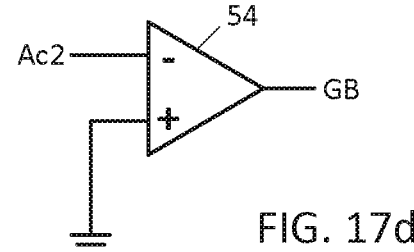
FIG. 17d is a schematic of a hysteretic comparator used for producing the GB signal.

Referring to FIG. 17a, the operation of the control circuitry 24 when generating the control voltages GA and GB is therefore that when the AC signal at node Ac1 rises to become greater than the first threshold (0 mV in this example) of the hysteretic comparator 51 (referring to FIG.

17c), the output GA of the comparator 51 is pulled low. Similarly, when the AC signal at node Ac2 falls (which occurs when the AC signal at node Act rises) and is less than the second threshold (−200 mV in this example) of the hysteretic comparator 54 (referring to FIG. 17d), the output GB of the comparator 54 is pulled high.

Conversely, when the AC signal at node Ac1 falls and as a result is less than the second threshold of the hysteretic comparator 51, the output GA of the comparator 51 is pulled high. Similarly, when the AC signal at node Ac2 rises to become greater than first threshold of the hysteretic comparator 54, the output of the comparator 54 is pulled low.

Figure 18A:
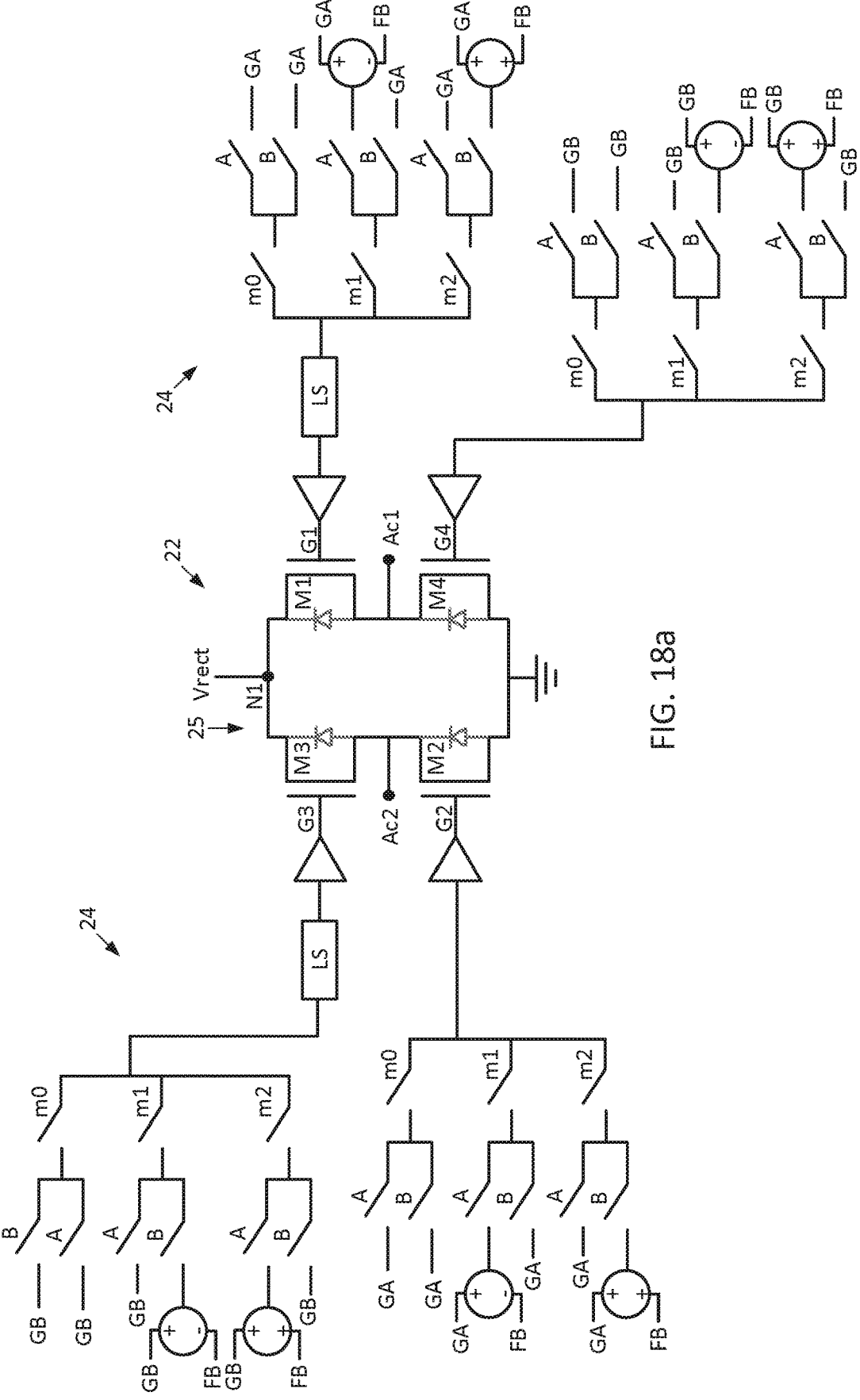
FIG. 18a is a schematic diagram illustrating mode selection circuitry within the controller of FIG. 2 for switching the regtifier of FIG. 2 between in-phase serial voltage regulation and anti-phase parallel voltage regulation.

Now referring to FIGS. 18a-19, the remainder of the control circuitry 24 is described for the cases where PWM control of the transistor gates are not used.

It is to be noted that as a general practice for low-side drive techniques, the signals for driving the gates of M2 and M4 are buffered. Also, it is to be noted that as a general practice for high-side drive techniques, the signals for driving the gates M1 and M3 are level shifted and buffered. For sake of simplification the following description will assume that GA, GB and any composite signal derived from GA, GB, FB are directly coupled to the gates, while in actual implementation buffer and level shifting technique are to be used consistently with the above mentioned techniques for low-side and high-side driving techniques.

When switches m0 are closed, indicating that the regtifier 25 is to operate as a standard rectifier, the control signal GA is coupled to the gates of transistors M1 and M2 as gate voltages G1 and G2 regardless of phase, and the control signal GB is coupled to the gates of transistors M3 and M4 as gate voltages G3 and G4 regardless of phase. Therefore, during phase A, the transistors M1 and M2 are fully turned on while the transistors M3 and M4 are fully turned off, and during phase B, the transistors M3 and M4 are fully turned on while the transistors M1 and M2 are fully turned off.

When switches m1 are closed, indicating that the regtifier 25 is to operate so as to perform in-phase serial voltage regulation, in phase A: the feedback voltage FB is subtracted from the control signal GA, and the result is coupled to the gate of the transistor M1 as gate voltage G1; the feedback voltage FB is subtracted from the control signal GA, and the result is coupled to the gate of the transistor M2 as gate voltage G2; the control signal GB is coupled to the gate of the transistor M3 as gate voltage G3; and the control signal GB is coupled to the gate of the transistor M4 as gate voltage G4. In phase B: the feedback voltage FB is subtracted from the control signal GB, and the result is then coupled to the gate of the transistor M3 as gate voltage G3; the feedback voltage FB is subtracted from the control signal GB, and the result is then coupled to the gate of the transistor M4 as the gate voltage G4; the control signal GA is coupled to the gate of the transistor M1 as gate voltage G1; and the control signal GA is coupled to the gate of the transistor M2 as gate voltage G2. Therefore, during phase A, the transistors M3 and M4 are fully off, while the gate voltages of the transistors M1 and M2 are reduced by the feedback voltage FB to thereby increase the drain to source resistances of the transistors M1 and M2 sufficiently to dissipate excess power Similarly, during phase B, the transistors M1 and M2 are fully off, while the gate voltages of the transistors M3 and M4 are reduced by the feedback voltage FB to thereby increase the drain to source resistances of the transistors M3 and M4 sufficiently to dissipate excess power.

When the switches m2 are closed, indicating that the regtifier 25 is to operate so as to perform anti-phase parallel voltage regulation, in phase A: the voltage FB is added to the control signal GB, and the result is then coupled to the gate of the transistor M3 as gate voltage G3; the voltage FB is added to the control signal GB, and the result is then coupled to the gate of the transistor M4 as gate voltage G4; the control signal GA is coupled to the gate of the transistor M1 as gate voltage G1; and the control signal GA is coupled to the gate of the transistor T2 as gate voltage G2. In phase B: the voltage FB is added to the control signal GA, and the result is coupled to the gate of the transistor M1 as gate voltage G1; the voltage FB is added to the control signal GA, and the result is coupled to the gate of the transistor M2 as gate voltage G2; the control signal GB is coupled to the gate of the transistor M3 as gate voltage G3; and the control signal GB is coupled to the gate of the transistor M4 as gate voltage G4. Therefore, during phase A, the transistors M1 and M2 are fully on, while the gates of the transistors M3 and M4 are driven sufficiently cause dissipation of excess power by transistors M3 and M4 but not sufficiently to impede rectification Similarly, during phase B, the transistors M3 and M4 are fully on, while the gates of the transistors M1 and M2 are driven sufficiently cause dissipation of excess power by transistors M1 and M2 but not sufficiently to impede rectification.

Figure 18B:
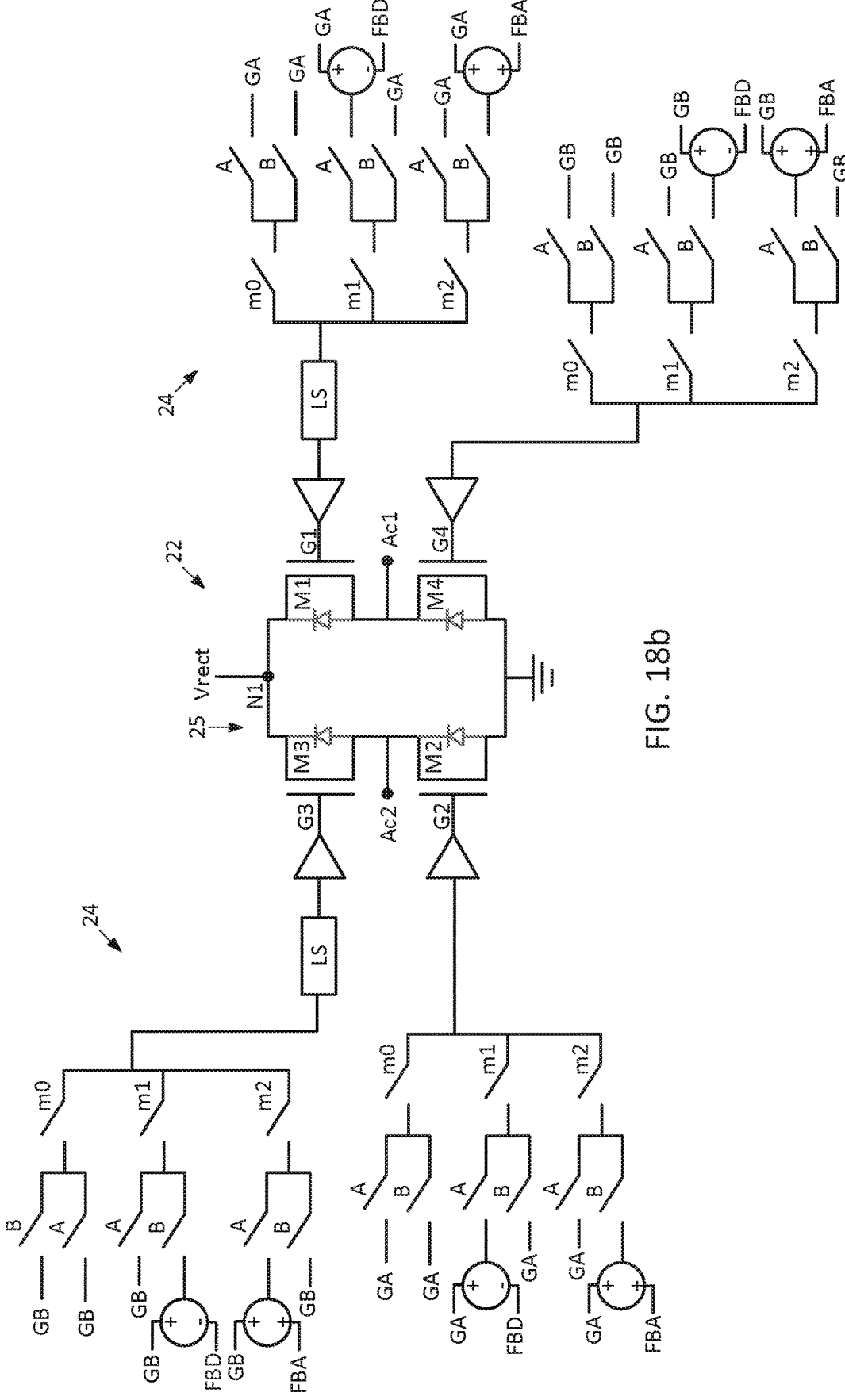
FIG. 18b is a schematic diagram illustrating mode selection circuitry within the controller of FIG. 2 for switching the regtifier of FIG. 2 between in-phase serial voltage regulation and anti-phase parallel voltage regulation and supporting PWM based in-phase serial voltage regulation.
Figure 18C:
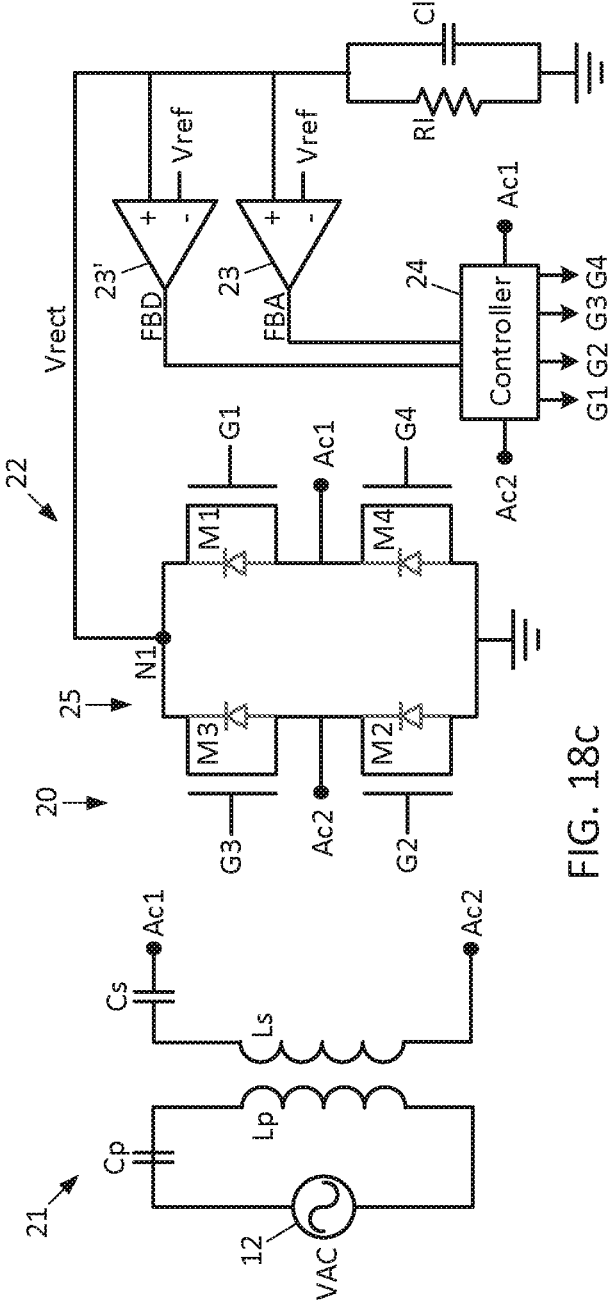
FIG. 18c is a schematic diagram illustrating the presence of an amplifier and a comparator as feedback loops.

Now referring to FIG. 18b and FIG. 18c, the remainder of the control circuitry 24 is described for the cases where PWM control of the transistor gates are used as per first and second ways of operating the gates in FIG. 14. The feedback signal FB as per FIG. 18a has been split in two, with FBA being the output of the feedback amplifier 23 named FB on FIG. 24 and FBD being the output of the digitized feedback provided by a comparator 23' and generating signal accordingly to timing diagrams as per FIG. 12. During operation FBD may take two levels, noted FBD_H and FBD_L. Assume now that the drive strength of GA, GB is VDD, the signal GA-FBD (resp. GB-FBD) will provide two levels VDD−VGH and VDD−VGL. Therefore, in the case where VGH=VDD and VGL=0 are used, the signal GA-FBD (resp. GB−FBD) will provide two levels of drive strength, 0 and VDD, so as to drive according to the first way of operating the gates on FIG. 14.

Now, in the case where VGH=VDD−V1 and VGH=0 are used, the signal GA-FBD (resp. GB−FBD) will provide two levels of drive strength, V1 and VDD so as to drive according to third way of operating the gates on FIG. 14.

It is to be noted that when the regtifier 25' is in serial mode controlled by m1, or in parallel mode controlled by m2, and if the FB signals (resp. FBA and FBD) are gated to zero, the regtifier 25' behaves exactly similarly to the regtifier 25' in conventional mode controlled by m0, because GA+FBD, GB+FBD, GA−FBA, GB−FBA are equal to GA, GB when FBA and FBD are gated to zero, which may occur for example when Vrect is far below the target.

Those skilled in the art will appreciate from FIG. 15 how to generalize FIG. 18b for supporting the third way of operating the gates.

Hardware and techniques for automatically switching the regtifier 25' between in-phase serial voltage regulation using PWM and anti-phase parallel voltage regulation is now described.

Figure 20:
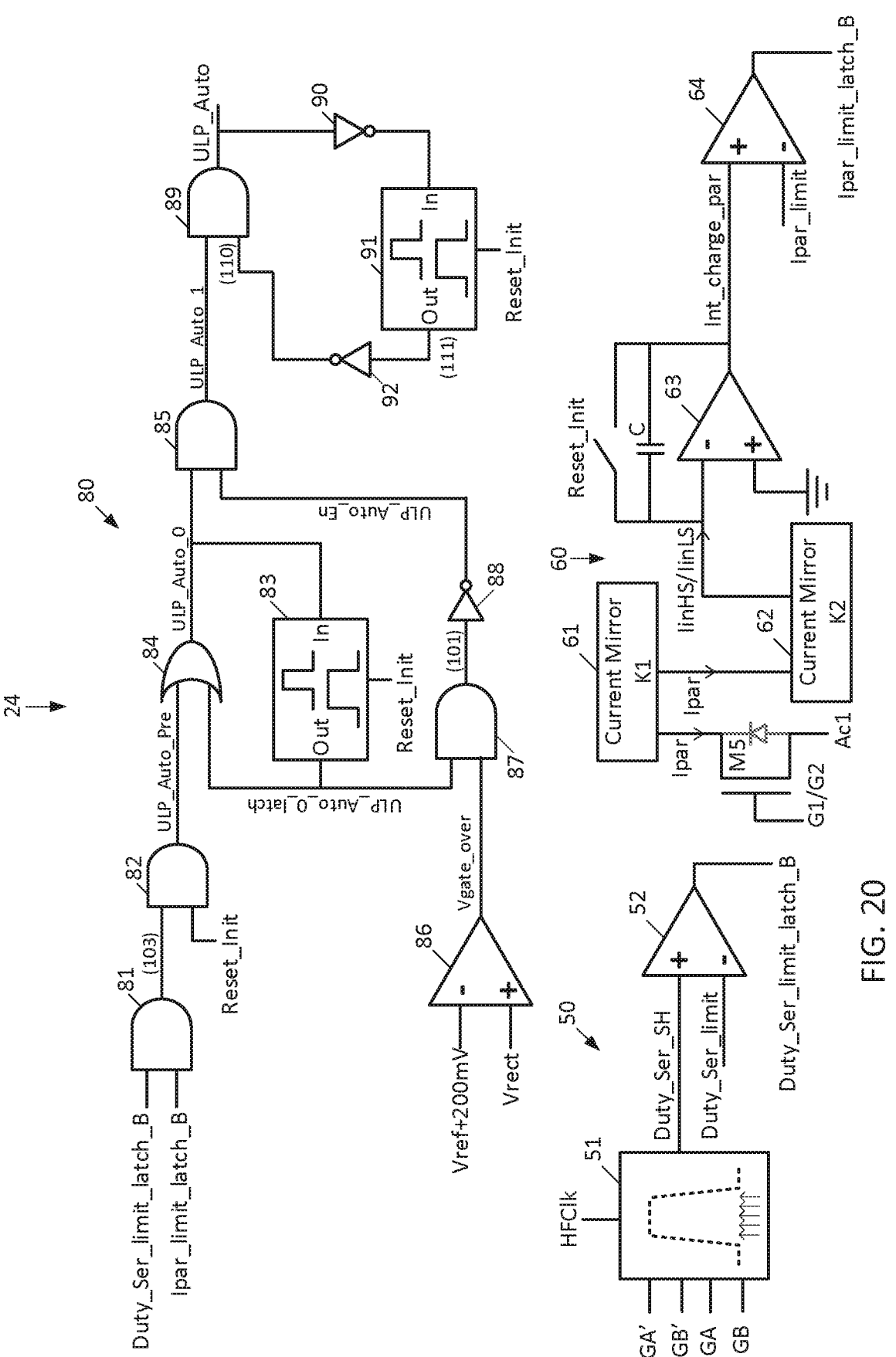
FIG. 20 is a block diagram showing components of the controller for performing on the fly mode switching between in-phase serial voltage regulation and anti-phase parallel voltage regulation.

Refer now to FIG. 20, illustrating the hardware included within the controller 24 for automatically switching the regtifier 25' between in-phase serial voltage regulation using PWM and anti-phase parallel voltage regulation. Serial monitoring circuit 50 includes a duty cycle determination circuit that utilizes counters to determine the duty cycle of control signals GA and GB (from which the gate voltages G1-G4 are determined) during performance of PWM in-phase serial voltage regulation, and therefore the duty cycle of the output of the regtifier 25', by counting a number of pulses of a high frequency counter clock HFClk within each pulse of the control signals GA and GB, by counting a number of pulses of the high frequency counter clock within each pulse of the control signals GA' and GB' (from which the gate voltages G1a-G4a are determined), and dividing the number of pulses of the high frequency clock HFClk within each pulse of control signals GA and GB by the number of pulses of the high frequency clock within each pulse of control signals GA' and GB'. The duty cycle will be referred to hereinafter as as Duty_Ser_SH; for example, if the duty cycle of the regtifier 25' is found to be 90%, then Duty_Ser_SH will be 90%. The serial monitoring circuit 50 also includes a digital comparator 52 that compares each occurrence of Duty_Ser_SH to an established duty cycle limit, Duty_Ser_limit, and latches then asserts the Duty_Ser_limit_latch_B signal when the current occurrence of Duty_Ser_SH is greater than Duty_Ser_limit. When the current occurrence of Duty_Ser_SH is less than the duty cycle limit Duty_Ser_limit, the digital comparator 52 deasserts the Duty_Ser_limit_latch_B signal. It is to be noted that Duty_Ser_limit_latch_B signal is always asserted high during anti-phase parallel mode.

The controller 24 also includes a parallel monitoring circuit 60 including an n-channel transistor M5 that is a replica of one of the transistors in the regtifier 25' (illustratively a replica of either G1 or G2) that receives the corresponding gate voltage G1 or G2 at its gate, has its source coupled to the node Ac1, and has its drain coupled to a first current mirror 61. The first current mirror 61 mirrors the current Ipar flowing through the replica transistor M5 during anti-phase parallel voltage regulation to a second current mirror 62, which in turn mirrors the current to the inverting terminal of amplifier 63 configured as an integrator as either IinHS (in the case where the transistor M5 is a replica of transistor M1 or M3) or IinLS (in the case where the transistor M5 is a replica of transistor M2 or M4). It is to be noted that the current mirror 61 can be advantageously supplied from the Vrect node, and that the power consumption by the current mirror is not critical as in any case it is contributing as part of the overall objective of consuming an excess of incoming power. As such it will be appreciated that the ratio K1 does not need to be very high and good matching performances of the mirror is doable. The inverting terminal of the integrator 63 is coupled to ground, and a capacitor C and reset switch are coupled in parallel between the inverting terminal and output of the integrator 63. The integrator 63 output is the Int_charge_par signal, which is compared to the limit current Ipar_limit by a latchable comparator 64, and the result latched by the comparator 64 and thereafter inverted by the inverter 65 to produce the Ipar_limit_latch_B signal. It is to be noted that the Ipar_limit_latch_B signal is by design always asserted high during in-phase serial mode as there is no current flowing in the anti-phase parallel regulation HW.

Mode switch control circuitry 80 includes an AND gate 81 that receives the Duty_Ser_limit_latch_B and Ipar_limit_latch_B signals, performs a logical AND operation, and produces the signal 103 as output. Given that Duty_Ser_limit_latch_B signal is always asserted high during anti-phase parallel mode and signal Ipar_limit_latch_B is by design also always asserted high during in-phase serial mode, the AND gate 81 does always have one of its two inputs which is at a logical one. The AND gate 81 is therefore the entry point of the automatic switching between the two modes.

An AND gate 82 receives the signal 104 and an initialization signal Reset_Init as input, performs a logical AND operation, and produces the ULP_Auto_Pre signal as output. An OR gate 84 receives the ULP_Auto_Pre signal from the AND gate 82 as input, and receives the ULP_Auto_0_latch signal from a non-retriggerable monostable 83 as input, performs a logical OR operation, and produces the ULP_Auto_0 signal as output. The monostable 83 receives the ULP_Auto_0 signal as input and produces the ULP_Auto_0_latch signal as output.

A comparator 86 receives the output voltage Vrect at its non-inverting terminal and the reference voltage Vref+200 mv at its inverting terminal, and produces the Vgate_over signal as output. An AND gate 87 receives the Vgate_over signal and the ULP_Auto_0 signal as input, performs a logical AND operation, and generates the signal 101 as output, which is in turn inverted by the inverter 88 to produce the ULP_Auto_En signal as output. An AND gate 85 receives the ULP_Auto_0 and ULP_Auto_En signals as input, performs a logical AND operation, and generates the ULP_Auto_1 signal as output. An AND gate 89 receives the ULP_Auto_1 signal from the AND gate 85 as input, as well as the signal 110, which is the output of an inverter gate 92 which receives its input from the output 111 of a non-retriggerable monostable 91. The AND gate 89 performs a logical AND operation to produce the ULP_Auto signal as output, which is inverted by the inverter 90 and passed to the input of the monostable 91.

The non-retriggerable monostables 83 and 91 receive the initialization signal Reset_Init, which is asserted when it is desired to reset the monostables 83 and 91 to be triggerable again one time.

As will be explained, when the ULP_Auto signal is a logical one, the controller 24 generates the gate voltages G1-G4 and G1a-G4a of the transistors M1-M4 and M1a-M4a to cause the regtifier 25' to perform in-phase serial voltage regulation, and when the ULP_Auto signal is a logical zero, the controller 24 generates the gate voltages G1-G4 and G1a-G4a of the transistors M1-M4 and M1a-M4a to cause the regtifier 25' to perform anti-phase parallel voltage regulation.

Figure 21:
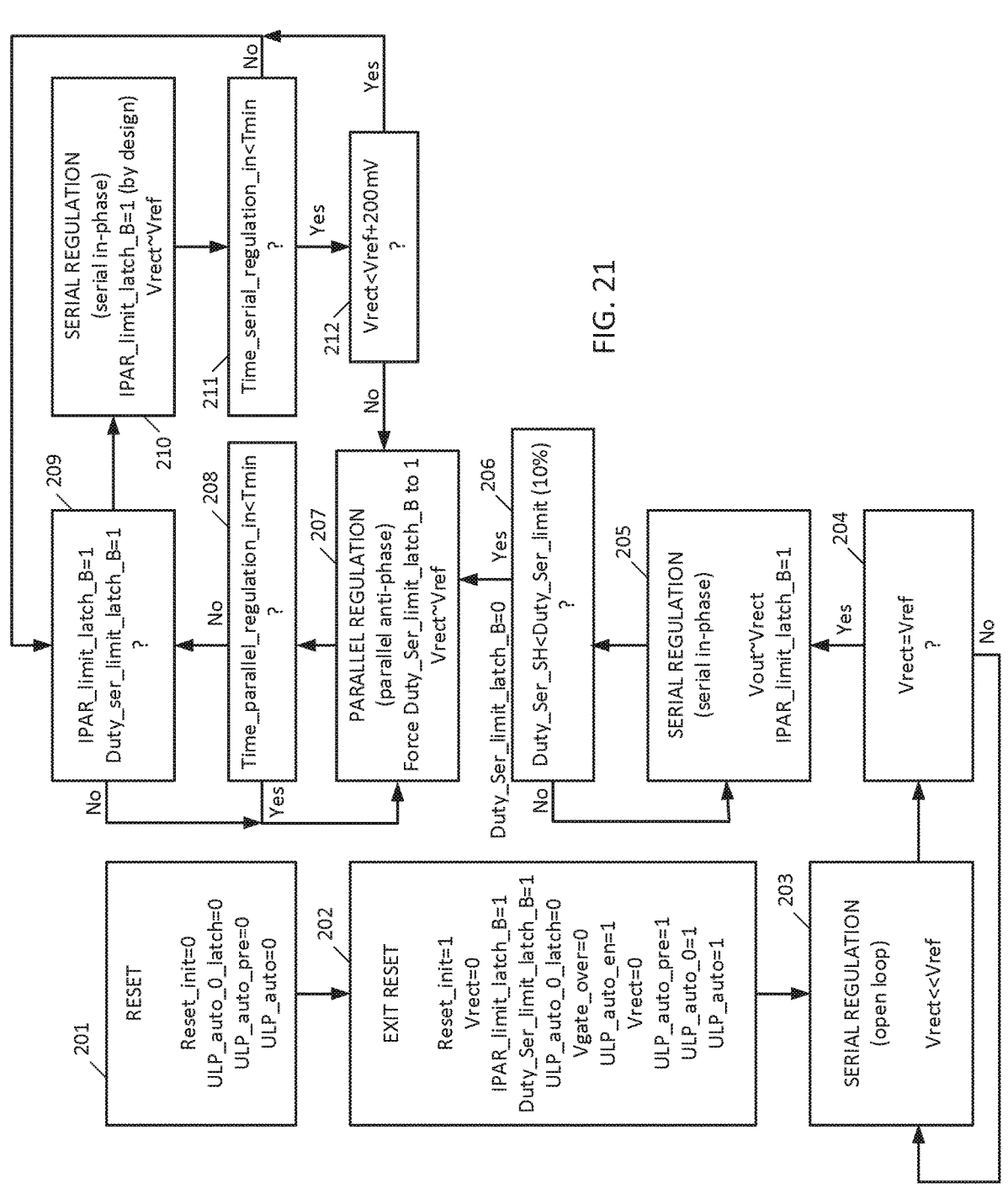
FIG. 21 is a flowchart of a method of operating the mode switching circuitry of FIG. 20 to switch the regtifier between performing in-phase serial voltage regulation and anti-phase parallel voltage regulation.

The operation of the mode switch control circuitry 80 will now be described with additional reference to FIG. 21.

At power-up and/or reset, the Reset_Init signal is set to a logical zero, resetting the monostables 83 and 91, as well as the integrator 63 (Block 201) by closing its switch. As a result, the AND gate 82 outputs the ULP_Auto_Pre signal as a logical zero and the monostable 83 outputs ULP_Auto_0_latch as a logical zero, resulting in the OR gate 84 outputting the ULP_Auto_0 signal as a logical zero. Since the ULP_Auto_0 signal is a logical zero, the AND gate 85 will output the ULP_Auto_1 signal as a logical zero, and in turn the AND gate 89 will output the ULP_Auto signal as a logical zero. It is to be noted that input 110 has no effect at this point, as ULP_Auto_1 is a logical 0. Input 110 would however hold ULP_Auto to logical 0 for a while, should ULP_Auto_1 have just transitioned from logical one to logical zero.

Next, to exit the reset, the Reset_Init signal is set to a logical one (Block 202). At this point in time, power transfer has not begun, and therefore the control signals GA, GB, GA', and GB' are zero. The result of the control signals GA, GB, GA', and GB' being zero is that the gate voltages G1-G4 and G1a-G4a are generated as being zero.

The result of G1-G4, G1a-G4b being zero is that the regtifier 25' is operating as a conventional 4 diodes rectifier in asynchronous mode, and the Vrect is free to rise under the effect of the incoming power, which in turn supplies the controller 24', which in turn generates the signals G1-G4, G1a-G4b.

At this point, and because the Vrect voltage is still low and below the target, the regtifier 25' is operating as conventional rectifier as highlighted previously, and as a first result the Duty_Ser_SH signal is high and the comparator 52 outputs Duty_Ser_limit_latch_B signal as a logical one.

As a second effect of the regtifier 25' operating as per conventional rectifier, the currents Ipar and IinHS/IinLS are zero, as no anti-phase conduction is occurring, with the result being that the amplifier 63 outputs the Int_charge_par signal as being zero. As a result of the Int_charge_par signal being zero, Ipar_limit is greater than Int_charge_par, and the comparator 64 will latch and output a logical zero, which is inverted by the inverter 65 to produce the Ipar_limit_latch_B signal at a logical one.

Since Duty_Ser_limit_latch_B and Ipar_limit_latch_B are both at a logical one, the signal 103 output by the AND gate 81 is a logical one, and since the Reset_Init signal is at a logical one, the ULP_Auto_Pre signal output by the AND gate 82 is a logical one. As a result of the ULP_Auto_Pre signal being a logical one, the ULP_auto_0 signal output by the OR gate 84 as a logical one, which in turn causes the ULP_Auto_0_latch signal to rise to a logical one, which in turn triggers the monostable 83, which in turn applies a logical one to the ULP_Auto_0_latch which remains at logical one during the duration of the monostable 83 pulse, which guarantees a logical one on ULP_Auto_0 during the duration of the pulse generated by the monostable 83. The system therefore has the capability to self-lock the ULP_Auto_0 logic to logical one during a minimum duration set by the monostable pulse duration, each time ULP_Auto_0 transitions from logical zero to logical one.

Since the output voltage Vrect will be lower than Vref, the reference voltage Vref+200 mV is larger than Vrect, resulting in the Vgate_over signal output by the comparator 86 being a logical zero, and in turn, the signal 101 output by the AND gate 87 being a logical zero and inverted by the inverter 88 to produce the ULP_Auto_En signal as being a logical one. In other words, the Vgate_over signal does not have any incidence during this phase. The relevance of the function will be explained further.

Note that since ULP_Auto was produced as a logical zero during reset, the inverter 90 outputs a logical one, causing the monostable 91 to produce a logical one at its output as signal 110. Since the ULP_Auto_0 is a logical one and since the ULP_Auto_En signal is a logical one, the ULP_Auto_1 signal output by the AND gate 85 is produced as being a logical one. Since the ULP_Auto_1 signal is a logical one and since the signal 110 is a logical one, the ULP_Auto signal at this point will be output by the AND gate 89 as a logical one.

The ULP_Auto signal being at a logical one causes the controller 23 to generate GA, GB, GA', and GB' so that on top of conventional operation of rectification of the currents induced in the secondary coil Ls, it performs in-phase serial regulation (Block 203). Initially, the output voltage Vrect will be substantially less than Vref and therefore the comparator 23 will not assert the feedback signal FB.

Operation continues in this open-loop fashion while the output voltage Vrect remains less than the reference voltage Vref (Block 204). As operation continues, the output voltage Vrect will rise. Once the output voltage Vrect becomes superior or equal to the reference voltage Vref (Block 204), the feedback signal FB is asserted by the comparator 23, and closed loop serial in-phase regulation begins (Block 205). At this point, the closed loop serial in-phase regulation using PWM continues, as described above in detail, and continues until the Duty_ser_limit_latch_B signal is pulled to a logic low (Block 206). This occurs when the duty cycle Duty_Ser_SH of the regtifier 25' falls below 10% (meaning that the Duty_Ser_SH signal falls below 10% to become lesser than Duty_Ser_limit, which is set at 10%, resulting in the comparator 52 outputting Duty_Ser_limit_latch_B as a logical zero.

Duty_ser_limit_latch_B being output as a logical zero in turn causes the signal 103 output by the AND gate 81 to become a logical zero, causing the ULP_Auto_Pre signal output by the AND gate 82 to become a logical zero, resulting in the OR gate 84 outputting the ULP_Auto_0 signal as a logical zero (because ULP_Auto_0 is a logical zero), in turn resulting in the ULP_Auto_1 signal being output by the AND gate 85 as a logical zero, and therefore the ULP_Auto signal being output by the AND gate 89 as a logical zero.

The ULP_Auto signal being output as a logical zero causes the controller 23 to generate GA, GB, GA', and GB' so as to rectify currents induced in the secondary coil Ls while performing anti-phase parallel regulation (Block 207).

It is to be noted that the transition of ULP_Auto from logical one to logical zero, after inversion by the inverter gate 90, does trigger the monostable 91, the output of which, once inverted by the inverter gate 92, secures a logical zero on input 110 and ensures that logical zero on AND gate 89 is maintained during the duration of the non-retriggerable monostable 91.

Therefore, until an elapsed time starting from the beginning of anti-phase parallel regulation becomes greater than a minimum time (Block 208), the anti-phase parallel regulation continues. If the elapsed time becomes greater than the minimum time (Block 208), but the IPAR_limit_latch_B and Duty_ser_limit_latch_B signals are not both a logical one, then ULP_Auto continues to be output as a logical zero, and anti-phase parallel regulation continues. However, if both the IPAR_limit_latch_B and Duty_ser_limit_latch_B signals become equal to a logical one (Block 209), then the controller 23 again generates GA, GB, GA', and GB' so as to rectify currents induced in the secondary coil Ls while performing in-phase serial regulation (Block 210).

The system remains in serial in-phase regulation until the elapsed time becomes greater than the minimum time (Block 211). Once this has occurred, the system continues checking if the IPAR_limit_latch_B and Duty_ser_limit_latch_B signals are both at a logical one, and if the two conditions are still true then it continues with in-phase serial regulation.

However, if the output exceeds the reference voltage plus a tolerance margin (set at 200 mV in the example Block 212) while the time has not yet elapsed, the signal 101 rises to logical one and ULP_Auto_En falls to zero and then the controller 23 returns to generating the control signals G1-G4 and G1a-G4a so as to cause the transistors M1-M4 and M1a-M4a of the regtifier 25' to perform anti-phase parallel regulation. The system therefore also has the capability of self-exiting the in-phase serial loop with the highest priority in the event that Vrect is too high, which helps guarantee that if the system entered the in-phase serial regulation for less than the elapsed time, but the incoming power is getting too high by coincidence, the system is yet able to exit the in-phase serial mode and enter the anti-phase parallel anti-phase mode.

This way, the regtifier 24' is switched between in-phase serial voltage regulation and anti-phase parallel voltage regulation on the fly, with the in-phase serial voltage regulation being used from powerup/reset and until the closed loop in-phase serial regulation has the regtifier 24' operating at less than a 10% duty cycle (indicated by the Duty_Ser_SH signal falling below the Duty_Ser_Limit signal), at which point anti-phase parallel voltage regulation is used. The continues until anti-phase parallel voltage regulation has been used for a given period of time as well as until the anti-phase parallel current falls below a current threshold (the duty cycle limit detection Duty_Ser_Limit_Lacth_B being asserted by default during parallel regulation), at which point serial regulation is returned to. Then, if serial regulation has not yet been used for a given period of time but the output voltage Vrect becomes greater than the reference voltage Vref+200 mv, parallel voltage regulation is returned to. Otherwise the serial regulation remains and loop until the duty cycle falls too low.

Therefore, in summary, in-phase serial voltage regulation is used until the duty cycle of the regtifier 25' fall below 10%, meaning that 90% of the power dissipation capability of the regtifier 25' is being utilized. At that point, anti-phase parallel voltage regulation is used for its additional power dissipation capabilities. Parallel voltage regulation has the capability to cease serial regulation in case the regulated voltage becomes too high during a given time window, and anti-phase voltage regulation is used until the current it draws fall below a defined limit This advantageously allows for the proper voltage regulation scheme to be used given the current operation conditions.

F. Advantages

The in-phase serial voltage regulation and anti-phase parallel voltage regulation schemes offer a variety of advantages, including the significant area savings provided by eliminating a separate discrete voltage regulator (including a power transistor and a tank capacitor) such as a low dropout amplifier, as well as power savings when the wireless power transmission system 20 is operating at equilibrium. In addition, these schemes spread excess power consumption over four devices (transistors M1-M4), instead of all excess power consumption being absorbed by a single power transistor within an additional voltage regulator. Still further, these schemes permit easy utilization of the receiver 22 as a transmitter, since direct access to node N1 (at which the voltage Vrect is developed) is available.

Efficiency differences between a prior art wireless power transmission system and the wireless power transmission system 20 are illustrated in the table below:

| Value | Rectifier + Regulator | Regtifier |
|---|---|---|
| Vrect | 5.2 V | 4.99 V with 50 mV ripple |
| Power Delivered by TX | 5.84 W | 5.63 W |
| Power Received by RX | 5.43 W | 5.23 W |
| Power Deliverd to Load | 4.97 W | 4.97 W |
| Efficiency of Rectifier + Regulator | 91.57% | NA |
| Efficiency of Regtifier | NA | 95.11% |
| Power lost | 457 mW | 255 mW |
| System efficiency | 85.11% | 87.88% |

Figure 11:
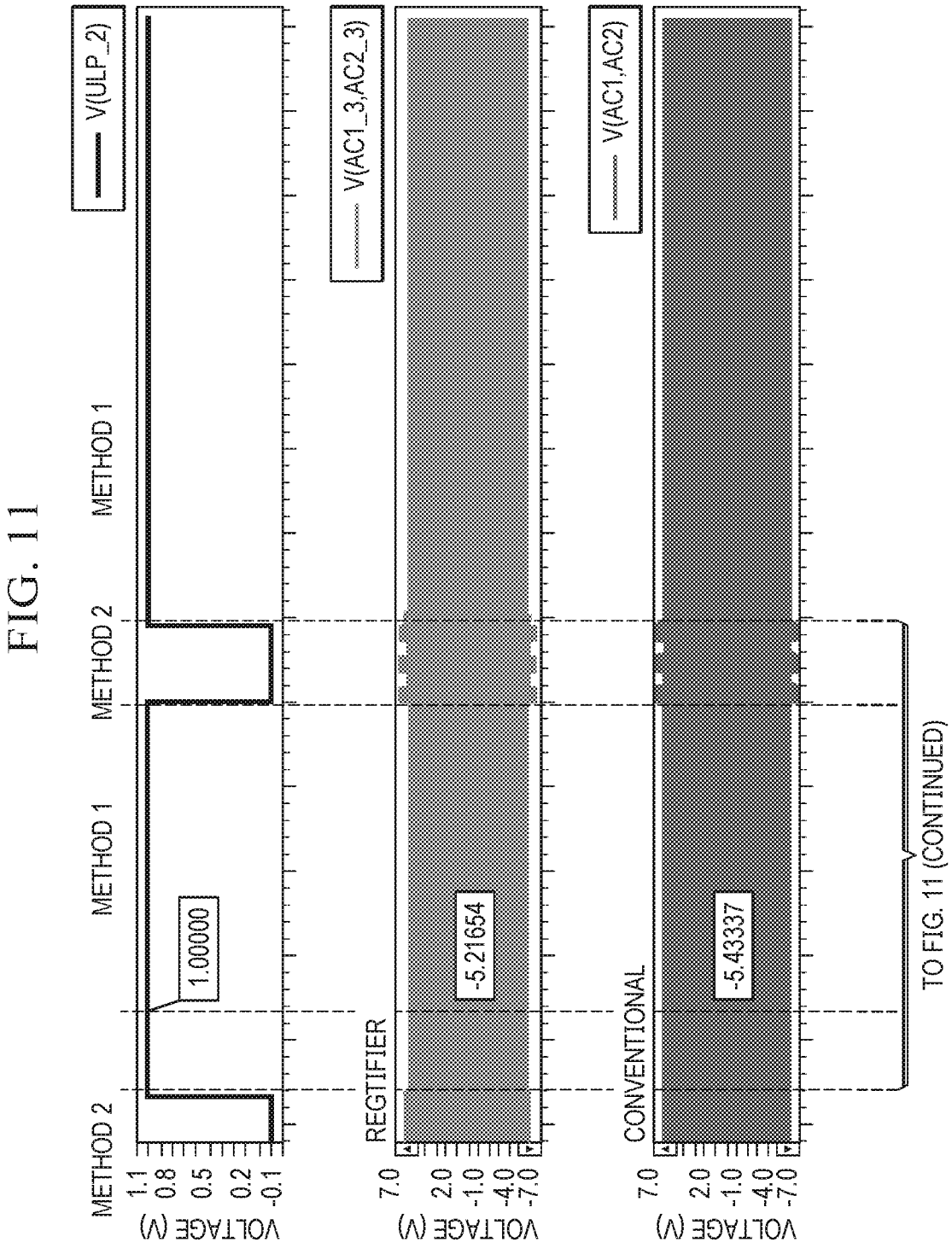
FIG. 11 is a timing diagram showing voltages of the wireless power transmission system of FIG. 2 in operation, wherein the feedback loop switches between controlling the bridge rectifier to perform in-phase serial voltage regulation and controlling the bridge rectifier to perform anti-phase parallel voltage regulation illustrating ASK symbols transmitted during power transmission.
Figure 11:
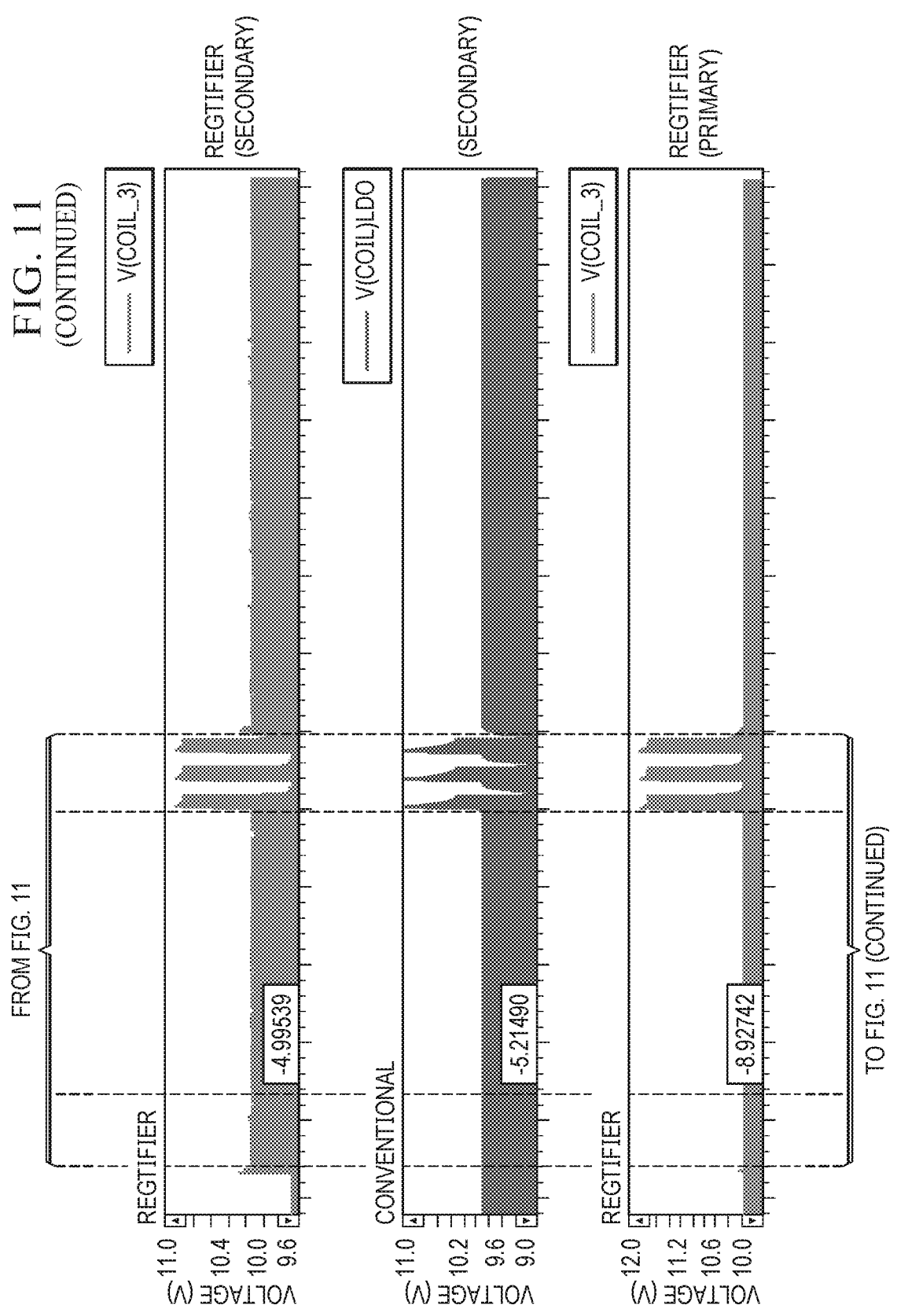
Figure 11:
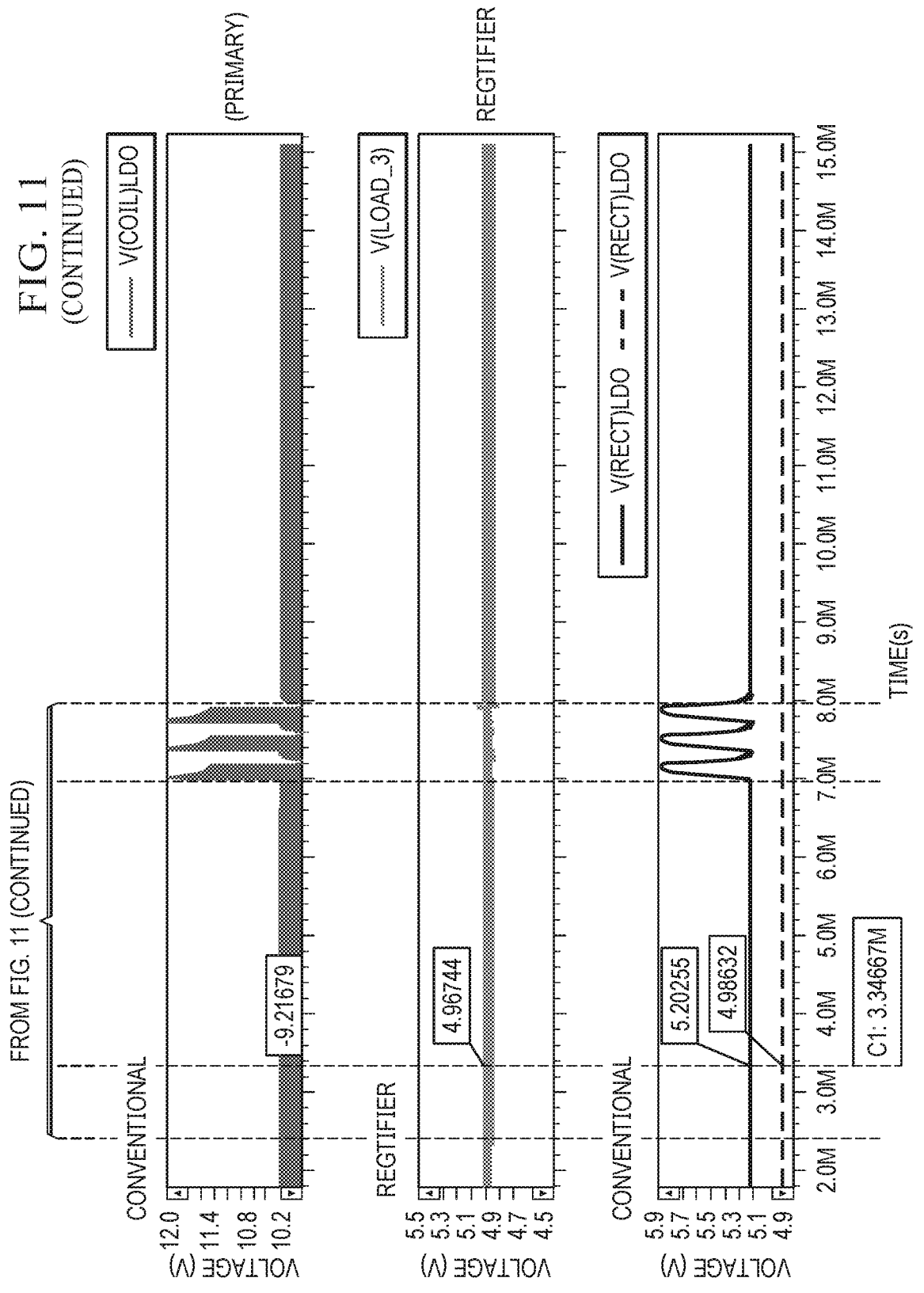

Among other advantages, note that the system efficiency increases by nearly 3% Another advantage provided is that when the operation of the wireless power transmission system 20 includes data communication together with power transfer, such as by using amplitude shift keying (ASK) when data transmission is from the receiver 22 to the transmitter 21, the data symbols (ASK symbols) received by the transmitter 21 are cleaner. This can be seen in FIG. 11, where the signal received by the transmitter 21 (labeled as Vcoil LDO primary) using a prior art wireless power transmission system 20 contains decreasing amplitude peaks in its pulses, but where the signal received by the transmitter 21 (labeled as Vcoil_3 Regtifier) contains flat amplitude peaks in its pulses using the wireless data transmission system 20, which is easing the symbols extraction at primary side.

Also, when ASK data transmission is performed using a prior art power transmission system, the modulation depth changes depending upon the incoming power and the magnitude of the output voltage Vrect, since the drain to source resistance of the power transistor of a discrete voltage regulator will vary greatly depending upon the incoming power and the magnitude of the output voltage Vrect. However, when using the wireless data transmission system 20 described herein, the drain to source resistance of the four transistors M1-M4 of the regtifier varies far less than that of the single power transistor of a discrete voltage regulator, maintaining the modulation depth at a generally constant level.

G. Description of Further Embodiment Utilizing Current and Voltage Feedback

Figure 26:
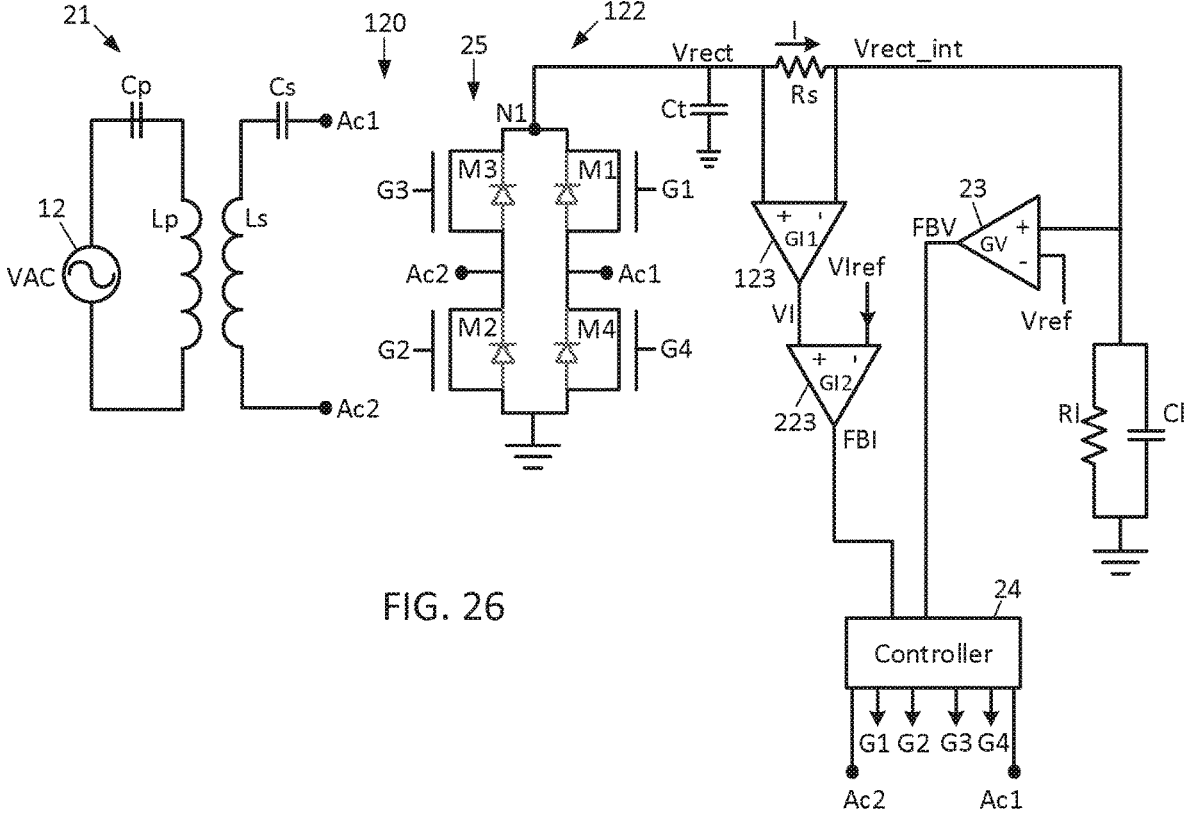
FIG. 26 is a schematic block diagram of a wireless power transmission system disclosed herein in which the bridge rectifier performs a regulation function based upon both voltage and current monitoring, enabling the lack of an additional voltage regulation circuit.

Now described with reference to FIG. 26 is a wireless power transmission system 120 similar to that of FIG. 2, but where feedback is provided based upon both the rectified output voltage Vrect and an output current I.

The wireless power transmission system 120 includes a transmitter 21 and a receiver 122. The transmitter 21 is comprised of an AC voltage source 12 coupled to a serial resonant transmitter coil Lp and capacitance Cp. The receiver 122 includes a serial resonant receiver coil Ls and capacitance Cs coupled between nodes Ac1 and Ac2, and a "regtifier" 25 (a bridge rectifier also capable of voltage regulation when controlled using techniques described herein) formed by transistors M1-M4 coupled between node N1 and ground.

The regtifier is formed by: an n-channel transistor M1 having a drain connected to node N1, a source connected to node Ac1, and a gate coupled to receive a control signal G1; an n-channel transistor M4 having a drain connected to node Ac1, a source connected to ground, and a gate coupled to receive a control signal G4; an n-channel transistor M3 having a drain connected to node N1, a source connected to node Ac2, and a gate coupled to receive a control signal G3; and a an n-channel transistor M2 having a drain connected to node Ac2, a source connected to ground, and a gate coupled to receive a control signal G2.

An optional tank capacitor Ct is coupled between node N1 and ground, and a rectified output voltage Vrect is formed across the tank capacitor Ct. A sense resistor Rs is connected between node N1 and a load represented by resistor R1 and capacitor C1, and an intermediate rectified output voltage Vrect_int is formed across the load.

An amplifier 23 with a gain of GV has an inverting input terminal coupled to receive a reference voltage Vref (which is set to be equal to a desired voltage target at node N1, taking note that the voltage drop across the sense resistor Rs is negligible), a non-inverting input terminal coupled to node N1 through the negligible sense resistor Rs, and an output coupled to control circuitry 24 and generating a voltage feedback signal FBV.

An amplifier 123 with a gain of GI1 has a non-inverting input terminal coupled to a first terminal of the sense resistor Rs (said first terminal being connected to node N1), an inverting input terminal coupled to a second terminal of the sense resistor Rs (said second terminal being connected to the load), and an output. An amplifier 223 with a gain of GI2 has a non-inverting input terminal coupled to receive the output of the amplifier 123 and an inverting input coupled to receive a voltage VIref representative of a reference current Iref, the amplifier 223 generating a current feedback signal FBI.

The control circuitry 24 receives input from the voltage feedback signal FBV and current feedback signal FBI, and based thereupon, generates the control signals G1-G4 for the transistors M1-M4.

As will be explained in detail below, the control circuitry 24 generates the control signals G1-G4 so as to cause the regtifier 25 to both rectify the AC current induced in the receiver coil Ls to produce a rectified output voltage Vrect, while at the same time suitably modulating one or more of the control signals G1-G4 so as to dissipate excess power to thereby regulate the output voltage Vrect. By dissipating excess power, the power delivered to the load by the regtifier 25 can be controlled and kept within a desired level, without the use of a separate discrete voltage regulation circuit. To that end, the amplifier 23 and the control circuitry 24 form a voltage feedback loop, and the amplifiers 123/223 and control circuitry 24 form a current feedback loop, with both loops being used to control the power delivered to the load.

As explained above in great detail in Section B of this disclosure, such feedback may be used by the control circuitry 24 to cause the regtifier 25 to both rectify the AC current and dissipate excess power to produce a regulated output voltage Vrect by reducing the driving of turned-on in-phase transistors M1/M2 or M3/M4 (M1/M2 being turned on is one phase and M3/M4 being turned on is the other phase). As also explained above in great detail in Section C of this disclosure, such feedback may be used by the control circuitry 24 to cause the regtifier to both rectify the AC current and dissipate excess power to produce a regulated output voltage Vrect by lightly driving anti-phase transistors M1/M2 or M3/M4 (M1/M2 being lightly turned on when transistors M3/M4 are fully turned on and performing rectification, or M3/M4 being lightly turned on when transistors M1/M2 are fully turned on and performing rectification). And, as explained above in great detail in section D of this disclosure, such feedback may be used by the control circuitry 24 to cause the regtifier 25 to both rectify the AC current and dissipate excess power to produce a regulated output voltage Vrect by performing both in-phase regulation and anti-phase regulation at the same time.

In the below description, one will assume first that the two loops do operate independently, and the operating mode of each loop will be described.

When the incoming current from nodes Ac1/Ac2 is too high, the regulated output voltage Vrect rises (and therefore Vrect_int rises), with the result being that this voltage becomes greater than the reference voltage Vref, and therefore the voltage feedback signal FBV produced by the amplifier 23 increases, which is in turn read by the controller 24 and used to modify generation of the control signals G1-G4 according to the desired control scheme (in-phase regulation, anti-phase regulation, or both in-phase regulation and anti-phase regulation) so as to reduce the regulated output voltage Vrect to the desired level (e.g., to be equal to Vref). The voltage FBV can be calculated as:

$$FBV=GVx(Vrect-Vref)$$

When the outgoing current from the bridge formed by transistors M1-M4 (the current I through the sense resistor Rs) is too high, the voltage difference of Vrect-Vrect_int across the sense resistor Rs increases, with the result being that the output voltage of the amplifier 223 rises to become more than the voltage VIref (which represents a reference current Iref), and therefore the current feedback signal FBI produced by the amplifier 223 increases, which is read by the controller 24 and used to modify generation of the control signals G1-G4 according to the desired control scheme (in-phase regulation, anti-phase regulation, or both in-phase regulation and anti-phase regulation) so as to consume power and induce an associated reduction of the output voltage Vrect to a lower level, hence reducing the output current until it reaches the desired level (e.g., to be equal to VIref). The voltage FBI can be calculated as:

$$FBI=GI2x(VI-VIref)$$

As mentioned previously the two loops were assumed not to interfere, but as one may foresee, it is a conditional assumption.

Figure 27:
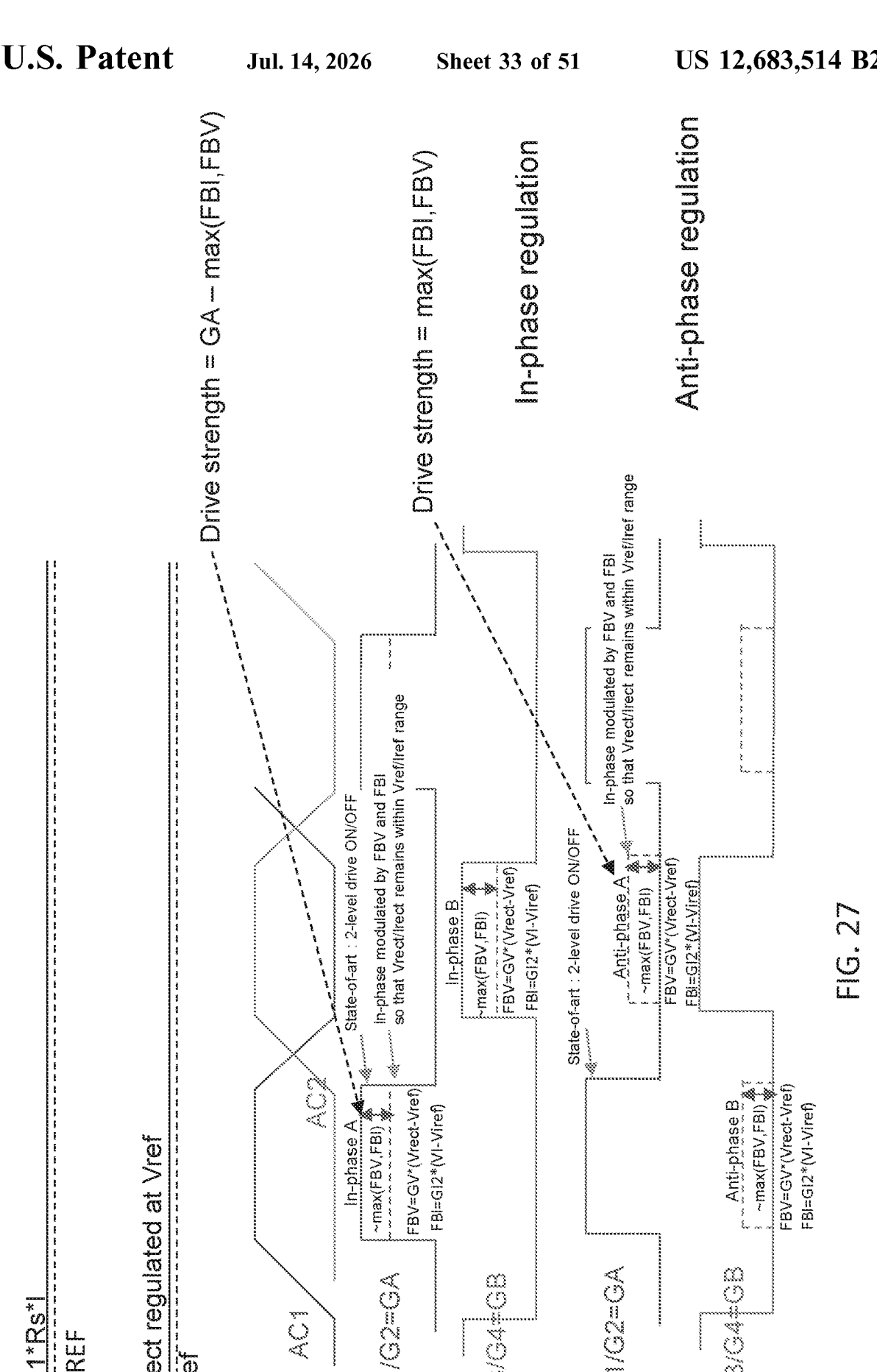
FIG. 27 is a timing diagram showing voltages of the wireless power transmission system of FIG. 26 in operation, when both voltage feedback loop and current feedback loop are simultaneously and concurrently controlling the bridge rectifier to perform in-phase regulation based upon voltage and current feedback, as well as when both voltage feedback loop and current feedback loop are simultaneously and concurrently controlling the bridge rectifier to perform anti-phase regulation based upon voltage and current feedback.

The interplay between the voltage feedback (feedback loop formed by amplifier 23 and control circuitry 24) and the current feedback (feedback loop formed by amplifiers 123/223 and control circuitry 24) will be described in detail with additional reference to FIG. 27.

In the waveforms illustrated for performing in-phase regulation, instead of the first phase drive signal GA (drive signals G1/G2) being equal to what GA would be in the absence of regulation, the first phase drive signal GA is reduced by whichever of the feedback signals FBI or FBV is greater, and instead of the second phase drive signal GB (drive signals for G3/G4) being equal to what GB would be in the absence of regulation, the second phase drive signal GB is reduced by whichever of the feedback signals FBI or FBV is greater.

In the waveforms illustrated for performing anti-phase regulation, the first anti-phase drive signal GA (drive signals G1/G2 when transistors M3/M4 are on and performing rectification) is equal to whichever of the feedback signals FBI or FBV is greater, and the second anti-phase drive signal GB (drive signals G3/G4 when transistors M1/M2 are on and performing rectification) is equal to whichever of the feedback signals FBI or FBV is greater.

The voltage VIref representing the reference current Iref is set to be a threshold amount higher than a voltage representing an expected nominal current I (for example, 10% greater than the expected nominal current I) through the sense resistor Rs. Therefore, regulation performed based upon the feedback signal FBV via the feedback loop formed by the amplifier 23 and the controller 24 is used for steady state operation, with regulation or limitation performed based upon the feedback signal FBI via the feedback loop formed by the amplifiers 123/223 and the controller 24 being used to control transients, and act as a safety measure and help avoid the situation where the load current exceeds values which could be detrimental in a particular application.

Figure 28:
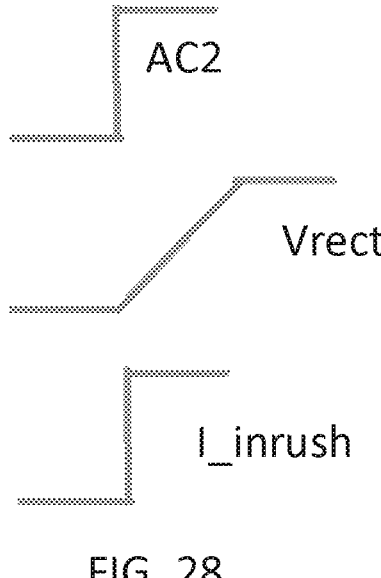
FIG. 28 is a graph showing the sharp rise in inrush current in the regtifier of FIG. 28 at startup despite the fact that the rectified output voltage has not yet reached its steady state level.
Figure 29:
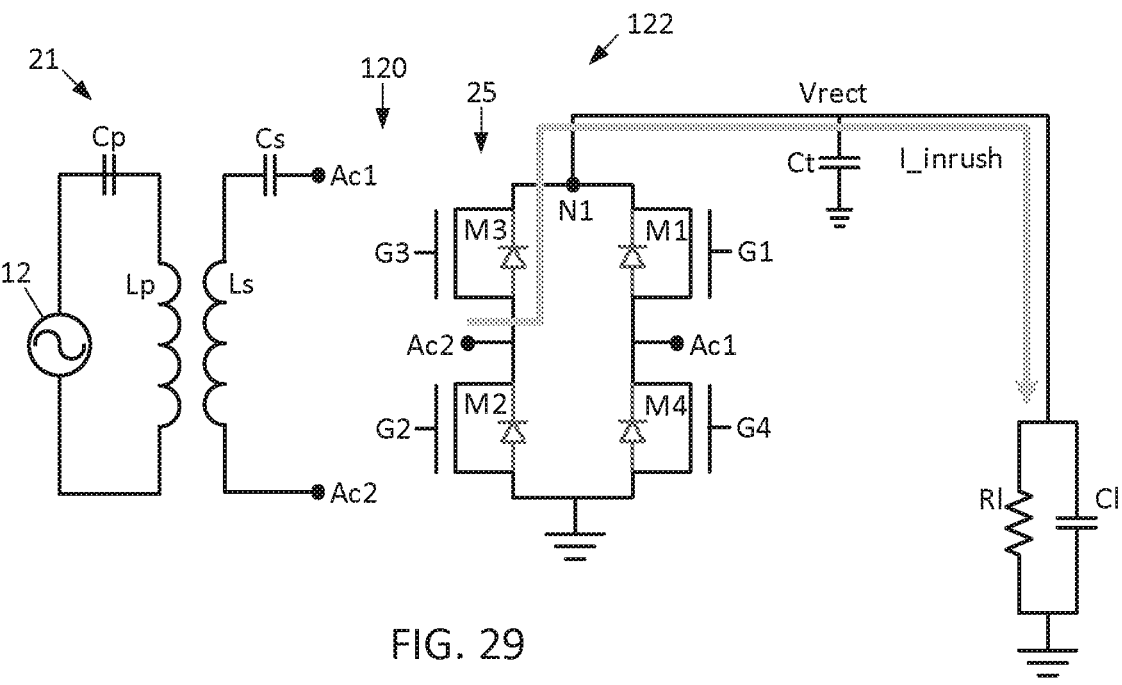
FIG. 29 is a schematic diagram of the transmitter and regtifier of FIG. 26 during startup, illustrating the path the inrush current takes.

It is useful for the wireless power transmission system 120 to be capable of regulation based upon both FBV and FBI, not only to control transients, but also at startup. As can be observed in the graph of FIG. 28, during startup (before steady state operation is reached), the inrush current I_inrush can rise to a high level even though the regulated output voltage Vrect is still below the threshold voltage Vth. Shown in FIG. 29 is the regtifier 25, and the path of the resulting inrush current I_inrush during startup.

Figure 30:
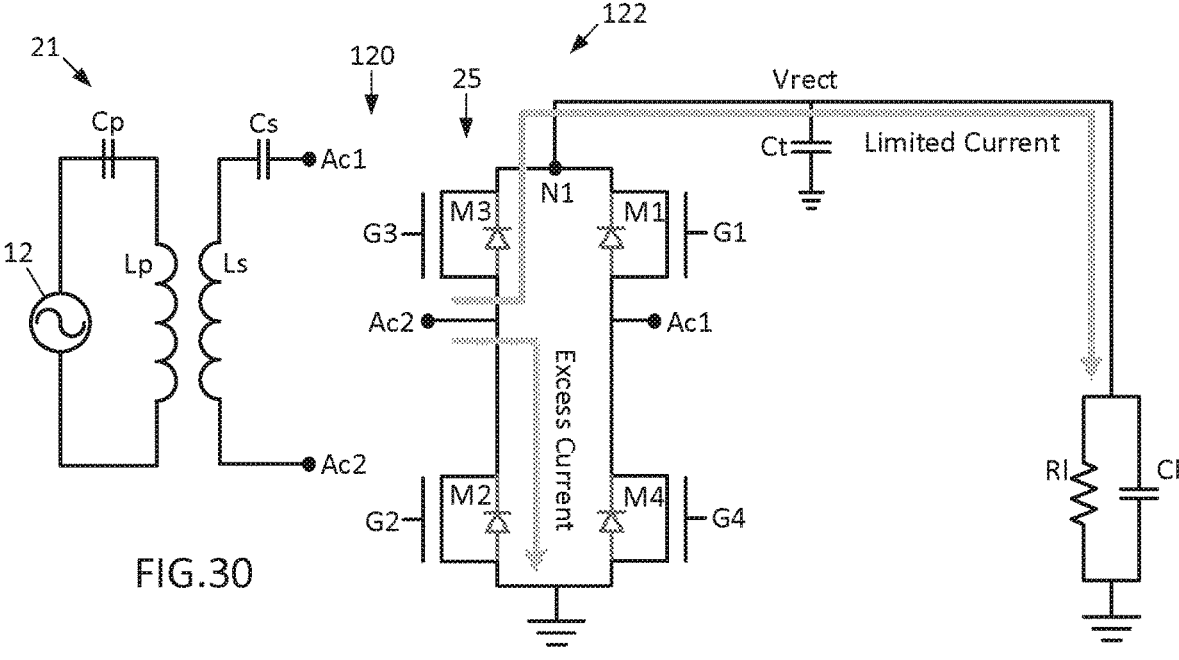
FIG. 30 is a schematic diagram of the transmitter and regtifier of FIG. 26 during startup, illustrating the control of the inrush current using anti-phase regulation based upon current feedback.

To prevent damage or issues arising from this high inrush current I_inrush, the regulation based upon the feedback signal FBI via the feedback loop formed by the amplifiers 123/223 and the controller 24 is used. The in-phase regulation mode would be unable to limit the inrush current I_inrush, as the body diode of the transistor M1/M3 would conduct the inrush current I_inrush even if the regulation were to turn off the transistor M1/M3. However, as can be observed in the regtifier 25 of FIG. 30, the excess inrush current can be limited using the anti-phase regulation. As shown, excess inrush current is shunted to ground through the anti-phase transistors (here, by control signals G2/G4 being set to the maximum of FBI or FBV, which in this case is the feedback signal FBI, when the transistors M1/M3 are the in-phase transistors on performing rectification). Once steady state operation is reached, regulation based upon the voltage feedback signal FBV may then be used in either in-phase or anti-phase mode, with regulation based upon FBI being used to control transients.

Figure 31:
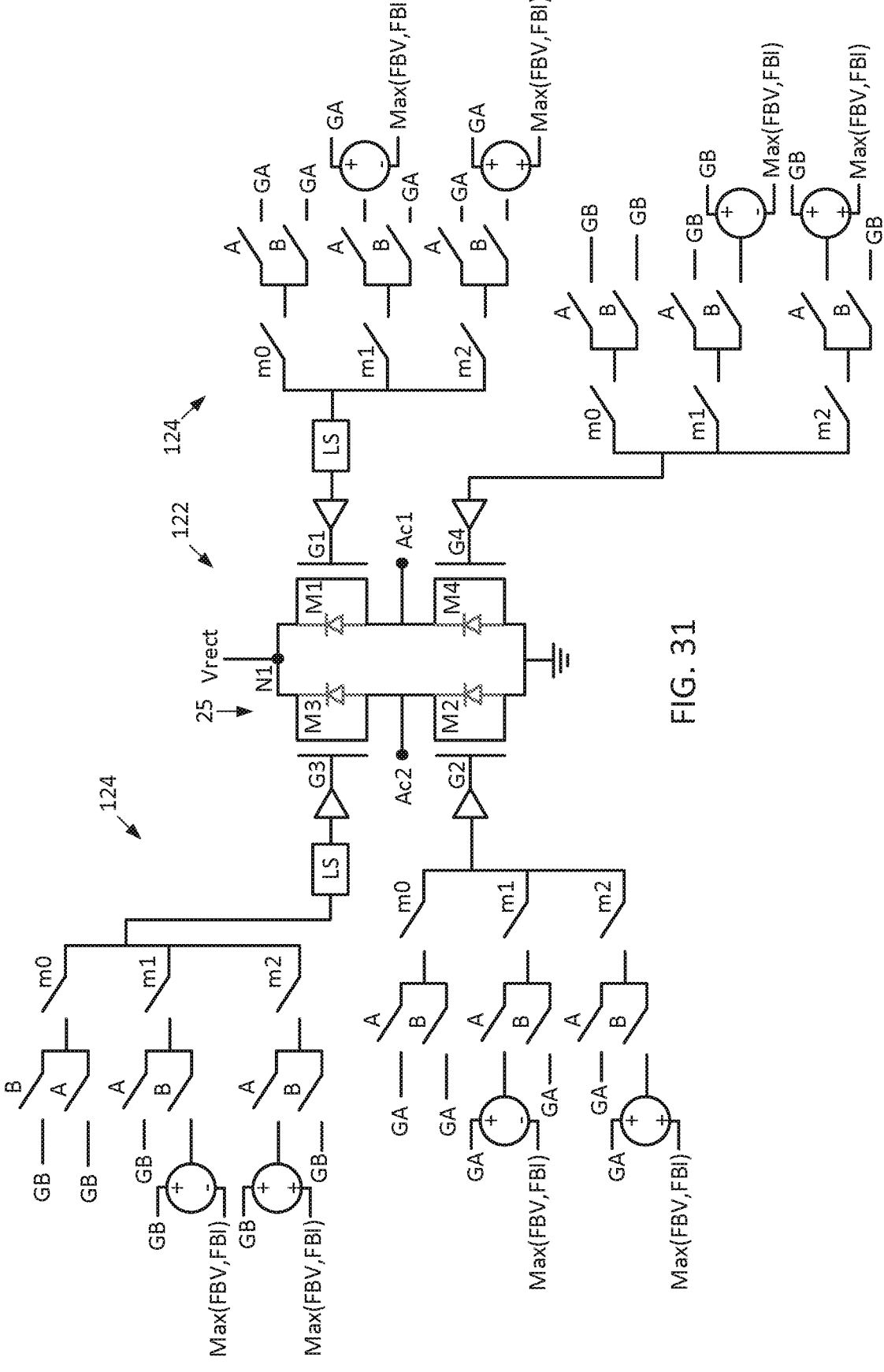
FIG. 31 is a schematic diagram illustrating mode selection circuitry within the controller of FIG. 26 for switching the regtifier of FIG. 26 between in-phase regulation and anti-phase regulation.

As explained, it is desired to start operation using anti-phase regulation based upon the current feedback signal FBI. Shown in FIG. 31 is a schematic diagram illustrating mode selection circuitry within the controller 24 of FIG. 26 for switching the regtifier 25 between in-phase regulation and anti-phase regulation, enabling a system that utilizes anti-phase regulation based upon the current feedback signal FBI during startup, and that utilizes in-phase regulation based upon the voltage feedback signal FBV during steady state operation, with either in-phase regulation or anti-phase regulation based upon the voltage feedback FBV or current feedback signal FBI being utilized to control transients that occur. This circuit shown in FIG. 31, and its operation, is analogous to that of FIG. 18a described above, except that the feedback signal FB is replaced with whichever of the feedback signals FBI or FBV is greater, and that the anti-phase mode is selected during startup.

H. Further Embodiment Utilizing Current and Voltage Feedback after Power Conversion Consider the case where the load is a battery of a portable electronic device. In such a situation, the battery requires a substantially lower voltage than that of the rectified output voltage Vrect for charging, and such voltage is to be precisely delivered. For example, the battery may require 4.5V for charging, but the voltage produced by rectification (without regulation) is 18V.

Figure 32:
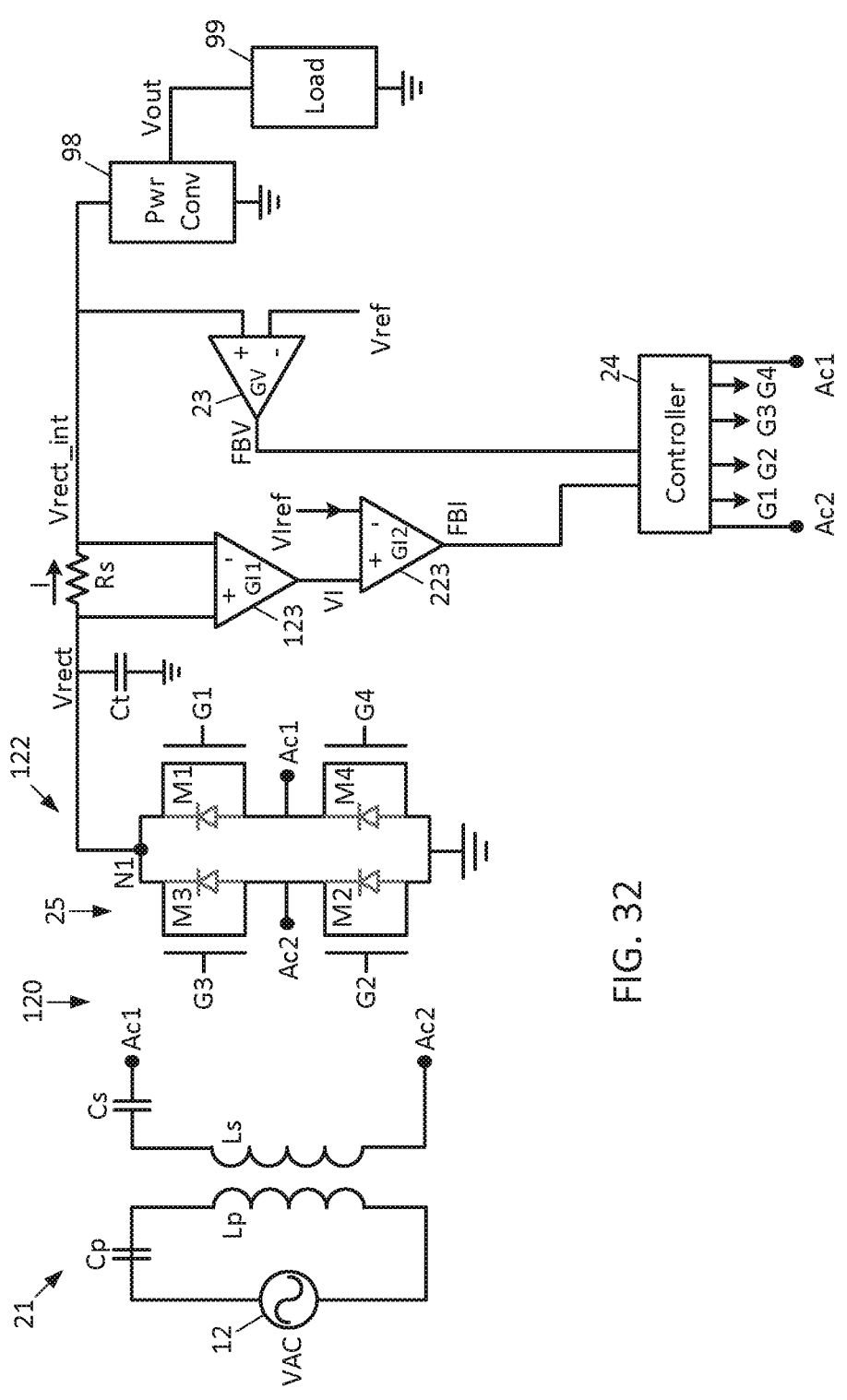
FIG. 32 is a schematic block diagram of a wireless power transmission system disclosed herein in which the bridge rectifier performs a regulation function based upon both voltage and current monitoring, used with an additional voltage converter to power a battery.

An embodiment effectuating this using the wireless charging system 120 is now described with reference to FIG. 32. Here, the structure and operation of the wireless power transmission system 120 is the same as described above with reference to FIG. 26, but the regtifier 25 is coupled through the sense resistor Rs to a DC-DC power converter 98 (such as a switched-capacitance converter), and the power converter 98 generates an output voltage Vout that is provided to a load 99 (such as a battery). In this example, in-phase regulation based on the voltage feedback signal FBV or current feedback signal FBI is used to regulate the rectified output voltage Vrect to 9V. The power converter 98 is a 2:1 converter and converts the rectified output voltage Vrect 9V to 4.5V to provide to the load 99.

While this wireless power transmission system 120 works reasonably well, the load current to the load 99 may vary (particularly where the load is a battery 99), causing the impedance of the power converter 98 to vary. Therefore, the exact conversion ratio of the power converter 98 does not remain constant. Since the rectified output voltage Vrect does remain constant due to the regulation of the regtifier 25, the output voltage Vout may therefore vary or try to vary resulting in unexpected variations of the output current in case the load is a battery.

In order to address this, the feedback used to control the regtifier 25 may instead be based upon the output voltage Vout, so that the rectified output voltage Vrect is regulated to ensure that the output voltage Vout stays at precisely the desired value. The approach involves taking into account the variations of the load impedance by integrating the power converter within the regulation loop.

Figure 33:
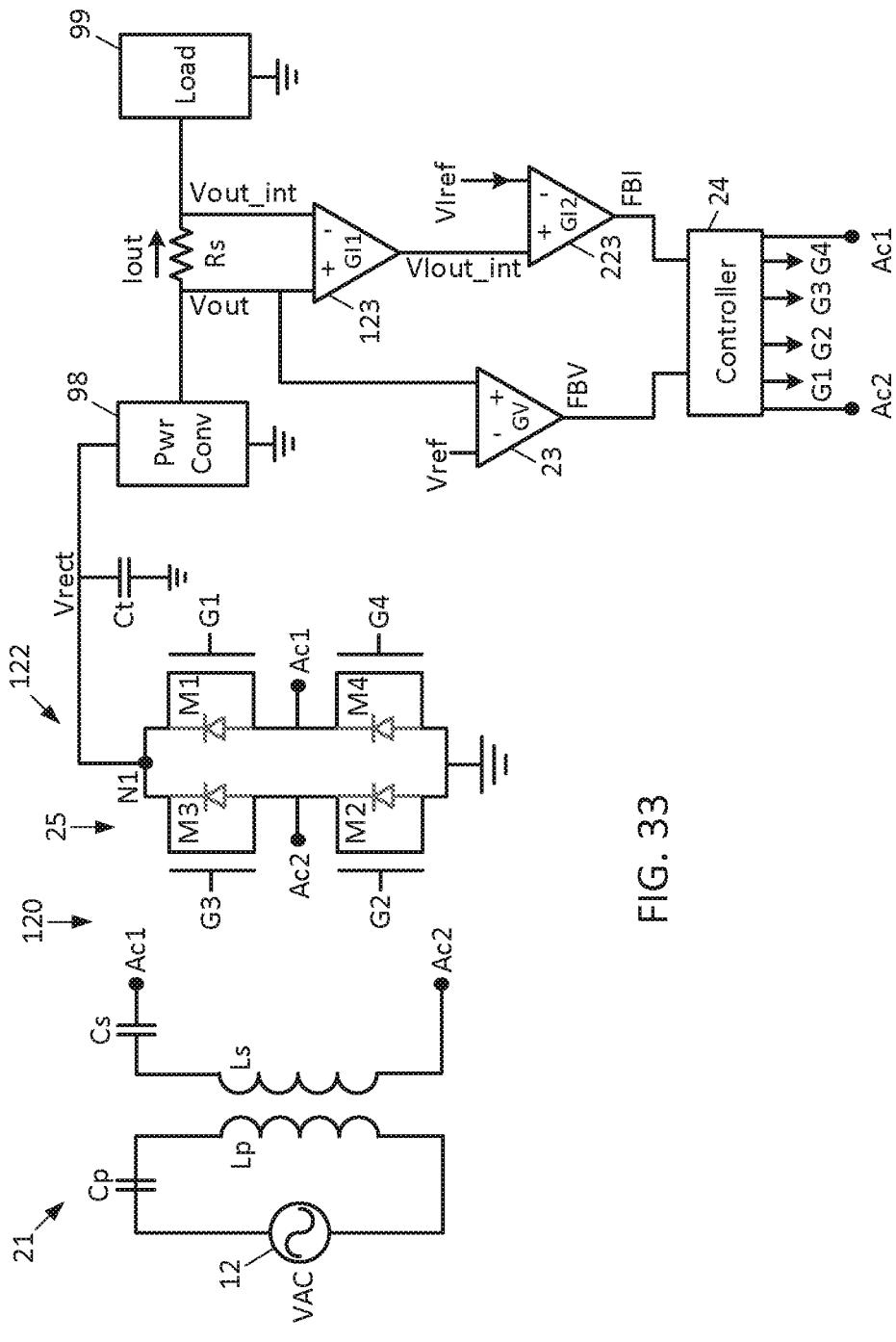
FIG. 33 is a schematic block diagram of a wireless power transmission system disclosed herein in which the bridge rectifier performs a regulation function based upon both voltage and current monitoring, used with an additional voltage converter to power a battery, in which feedback is taken from the output voltage and output current generated by the additional voltage converter.

Such an embodiment of the wireless charging system 120 is shown in FIG. 33. Here, notice that the power converter 98 is connected between node N1 and the sense resistor Rs, and that the load 99 is coupled to the power converter 98 through the sense resistor Rs. The amplifier 23 has its inverting input terminal coupled to receive the reference voltage Vref, its non-inverting input terminal coupled to the receive the output voltage Vout generated by the power converter 98, and its output coupled to control circuitry 24 to provide the voltage feedback signal FBV thereto. For further improving the precision of the control voltage of the load, a minor variation involves coupling the non-inverting input of the amplifier 23 directly to Vout_int instead of Vout.

The amplifier 123 has its non-inverting input terminal coupled receive the output voltage Vout, an inverting input terminal coupled to receive the intermediate output voltage Vout_int provided to the load (with Vout-Vout_int being representative of the output current Iout through the sense resistor Rs), and an output at which a voltage VIout_int representing an intermediate current feedback signal Iout_int is generated. The amplifier 223 has its non-inverting input terminal coupled to receive VIout_int and an inverting input coupled to receive a voltage VIref representative of a reference current Iref, and an output at which the current feedback signal FBI is generated.

The control circuitry 24 receives input from the voltage feedback signal FBV and current feedback signal FBI, and based thereupon, generates the control signals G1-G4 for the transistors M1-M4 according to the in-phase and/or anti-phase regulation schemes described above with reference to FIG. 26.

Here, the voltage FBV can be calculated as:

$$FBV=GV \times (Vout-Vref)$$

Similarly, FBI can be calculated as:

$$FBI=GI2 \times (VIout\_int-VIref)$$

By performing regulation based on the output voltage Vout and the output current Iout, the rectified output voltage Vrect is regulated such that the output voltage Vout provided to the load 99 remains at the desired value.

Figure 34:
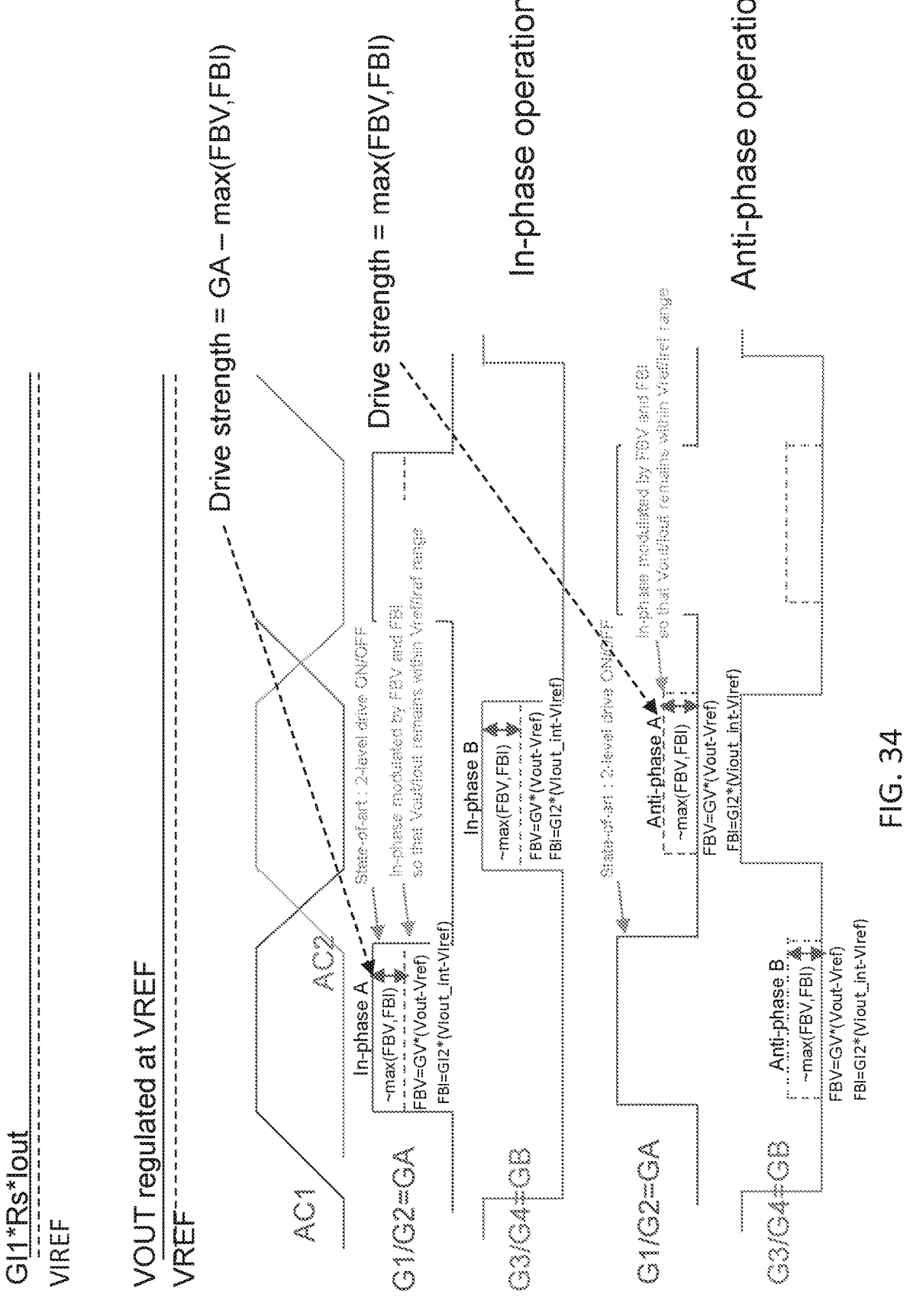
FIG. 34 is a timing diagram showing voltages of the wireless power transmission system of FIG. 33 in operation, when both voltage feedback loop and current feedback loop are simultaneously and concurrently controlling the bridge rectifier to perform in-phase regulation based upon voltage and current feedback, as well as when both voltage feedback loop and current feedback loop are simultaneously and concurrently controlling the bridge rectifier to perform anti-phase regulation based upon voltage and current feedback.

Waveforms showing the operation of the wireless power transmission system 120 are contained in FIG. 34. Waveforms for both in-phase regulation and anti-phase regulation are shown.

In the waveforms illustrated for performing in-phase regulation, the first phase drive signal GA (drive signals G1/G2) is reduced by whichever of the feedback signals FBI or FBV is greater, and the second phase drive signal GB (drive signals G3/G4) is reduced by whichever of the feedback signals FBI or FBV is greater. In the waveforms illustrated for performing anti-phase regulation, the first anti-phase drive signal GA is equal to whichever of the feedback signals FBI or FBV is greater, and the second anti-phase drive signal GB is equal to whichever of the feedback signals FBI or FBV is greater. As explained earlier with reference to the wireless power transmission system 120 of FIG. 26, the voltage VIref representing the reference current Iref is set to be a threshold amount higher than an expected nominal value of a voltage representing the current Iout (for example, 10% greater than the expected nominal current Iout) through the sense resistor Rs. Thus, the difference over the wireless power transmission system 120 of FIG. 26 is in where the feedback is taken, but the regulation scheme remains the same.

Figure 35:
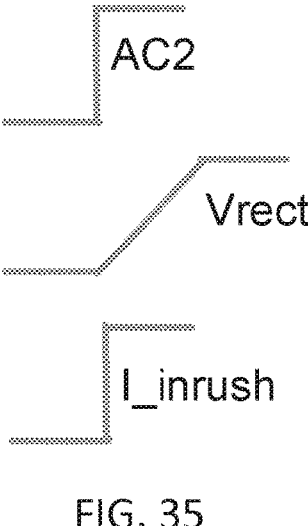
FIG. 35 is a graph showing the sharp rise in inrush current in the regtifier of FIG. 33 at startup despite the fact that the rectified output voltage has not yet reached its steady state level.
Figure 36:
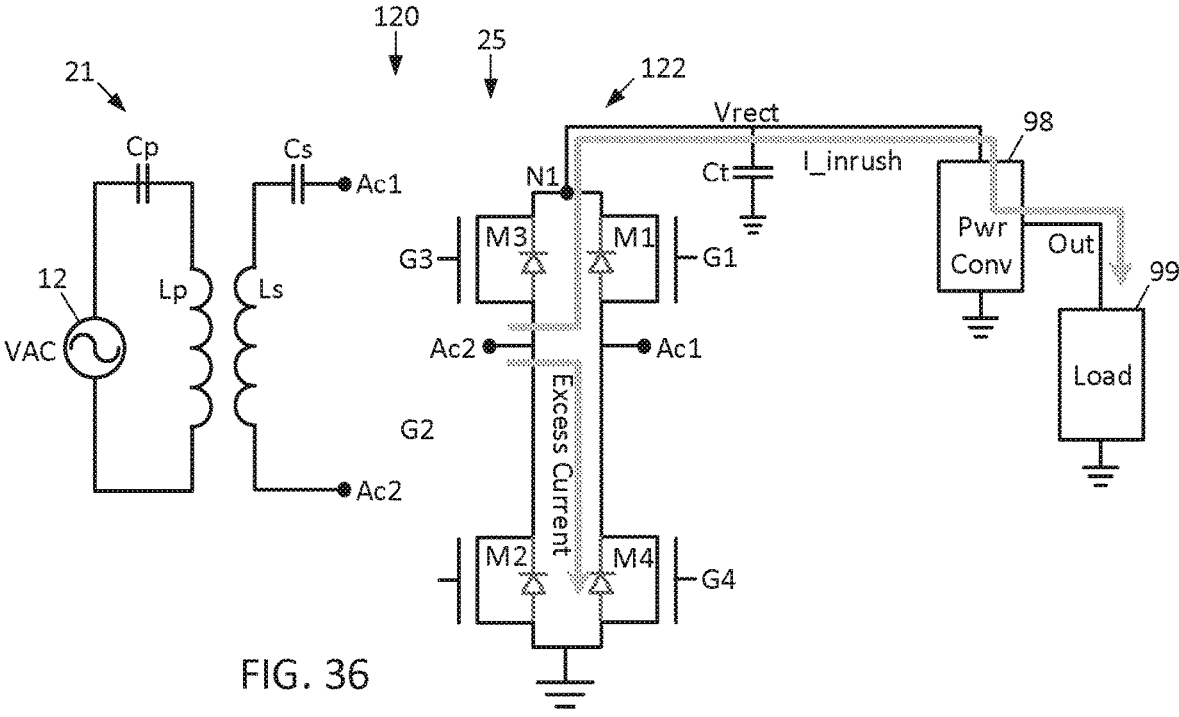
FIG. 36 is a schematic diagram of the transmitter and regtifier of FIG. 33 during startup, illustrating the control of the inrush current using anti-phase regulation based upon current feedback.

The use of anti-phase regulation based upon the current feedback signal FBI during startup to protect against a high inrush current also remains the same. Waveforms showing high inrush current I_inrush while the rectified output voltage Vrect is still below Vref are shown in FIG. 35, and the current paths for the inrush current I_inrush and the excess current dissipated by the regtifier 25 due to the anti-phase regulation during startup can be seen in FIG. 36. Once steady state operation is reached, regulation performed based upon the voltage feedback signal FBV is used, with regulation performed based upon the feedback signal FBI being used to control transients and act as a safety limit for the maximum current.

Figure 37:
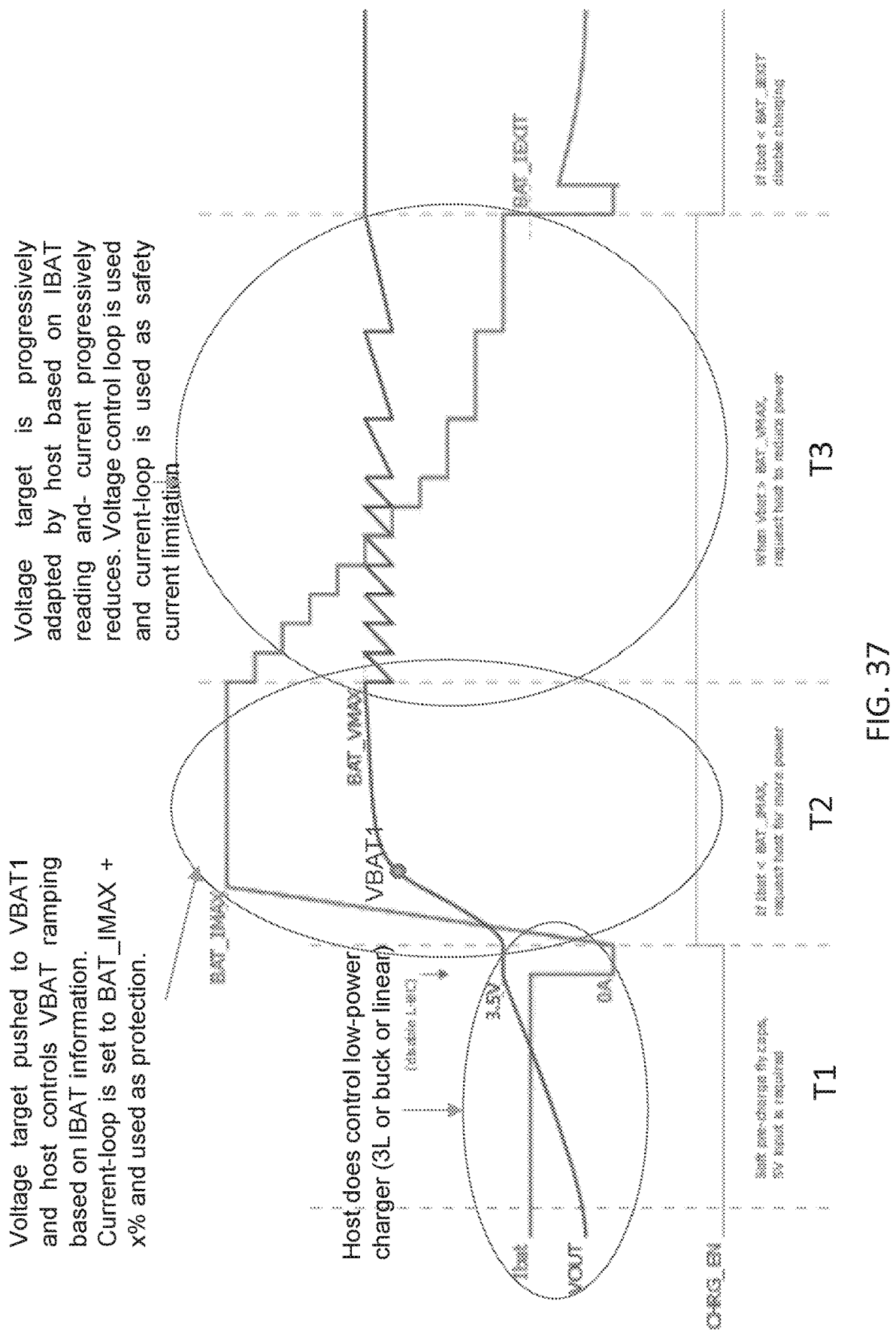
FIG. 37 is a graph of battery voltage and output voltage produced by the wireless power transmission system of FIG. 33 when charging a battery as a load.

Since the wireless power transmission system 120 is well suited to a situation where the load 99 is a battery, a battery charging profile utilizing the wireless power transmission system 120 has been improved and is now described with additional reference to the graph of FIG. 37. At the beginning of the charging cycle, shown as time interval T1, the host enables a low power charging system (not shown, but could be based upon a buck converter, linear converter, of 3 L converter) to charge the load 99 to a starting voltage, such as 3.5V. The low power charging system takes input power from the Vrect.

Once the starting voltage is reached, the time interval T2 begins, and the host enables the fast charging wireless power transmission system 120. In a conventional system the host is controlling the overall operation by progressively ramping the battery voltage from 3.5V to VBAT1. The control is performed by the main slow loop from the receiver 15 to the transmitter 10 and it takes few milliseconds of ASK communication with transmitter 10 before corrective actions is taken on the adjustment of the power level at the receiver 15 side.

Still referring to a conventional system, as the voltage Vout applied to the battery is a divided down version of the voltage at the input of the power converter 98 in case of a 2:1 converter for example, the host is to precisely control the input voltage of the power converter 98. Given that the power converter 98 input/output impedance is generally in the few tens of milliohms, a voltage error (overvoltage) of a few tens of millivolts at the input of the converter leads to an output current error (overcurrent) in the Ampere range. Also, it is likely that the input of the power converter 98 is not necessarily limited in power as it may be a regulator 17 output (since a LDO is generally cascaded after the rectifier) with a decoupling capacitance at its output which may be able to deliver high current peaks to the input of the power converter 98. This requires the regulator 17 output and the power converter 98 input to be equipped with current/voltage protections, and in the event the input voltage of the power converter 98 is not exactly what it should be, the power converter 98 may stop operating, or the regulator 17 may stop providing power. The effect of these protections kicking-in and out is that some over voltages or over currents may occur for example at the input of the power converter 98, and it has been seen that when the self-protection of one circuit (the LDO) triggers, it might induce the destruction of the other (power converter 98) and vice-versa. Ultimately, with such conventional systems, it takes significant hardware requirement and timing optimization efforts to properly bring-up the system, as well as to make attempts to ensure proper and safe operation in a variety of conditions, especially during transients when the wireless incoming power may surge. The main challenge is therefore to ensure that the load voltage/current is well-regulated despite the fact that the wireless incoming power may vary. The critical point with these conventional systems is the adaptation of impedance at power converter 98 input.

The wireless power transmission system described herein has a clear advantage in that it regulates the output Vrect of the regtifier 25 in a closed-loop such that the load 99 voltage Vout (battery voltage) is following a target, and cycle-to-cycle action can be taken if required, while in conventional systems the blocks (rectifier 16, regulator 17, power converter 98) are simply cascaded without a feedback loop other than the main loop slow loop from the receiver 15 to the transmitter 10, this main loop relying on slow ASK communication with transmitter 10 before corrective actions are taken at the receiver level 15.

The wireless power transmission system 120, when performing the charging shown in FIG. 37, operates as follows. The host targets stepping the voltage Vout from 3.5V to VBAT1. Anti-phase regulation with voltage feedback FBV is activated, with the voltage Vref being representative of a reference voltage set to a suitable value (for example, a few percent slightly above the host target from 3.5V to VBAT1), such that the voltage regulation is just at the limit for taking regulating action if called for, but the overall control of the level of power is left to the main loop through the transmitter 10. In other words, the transmitter 10 adapts the power such that the voltage Vout on the load is as per the expected voltage by the host, while Vref is set just higher. This operation is helping ensure that the power dissipation within the regtifier 25 and power converter 98 is low and the charging protocol is becoming closer to the objective of direct charging (direct charging here indicating a charging scheme in which the resistive path from input power to load is limited to a few resistive drops). Also, the system remains under supervision of the current feedback signal FBI, with the voltage VIref representative of a reference current being set to a suitable value (for example, 5% above the BAT_I-MAX current target) to limit inrush current to the load 99 so that the load 99 is not damaged but is quickly charged to a voltage VBAT1, with the output voltage Vout matching VBAT1. By setting Vref and VIref just above targets, the main loop adjusts the power as close as possible to the required power for obtaining the appropriate voltage/level on the load 99 without suffering any voltage drop in a regulator 17, and relying on the regtifier 25 for the features of ensuring that the load 99 is protected from excess of voltage and current.

Once the load 99 charge has been reached at the beginning of the time interval T3, the output voltage Vout has become greater than Vref, and regulation based upon the voltage feedback signal FBV takes over. The regulation at this point may be either in-phase or anti-phase. The reference voltage Vref is generated by the host and is adaptively adjusted so as to manage excess voltage transients and maintain the charge on the load 99 at or about BAT_VMAX, with current limitation based upon the current feedback signal FBI and decreasing VIref being used to control current transients, as the current to the load decreases within T3.

I. Embodiment Utilizing Low-Side Current Sensor

Figure 38:
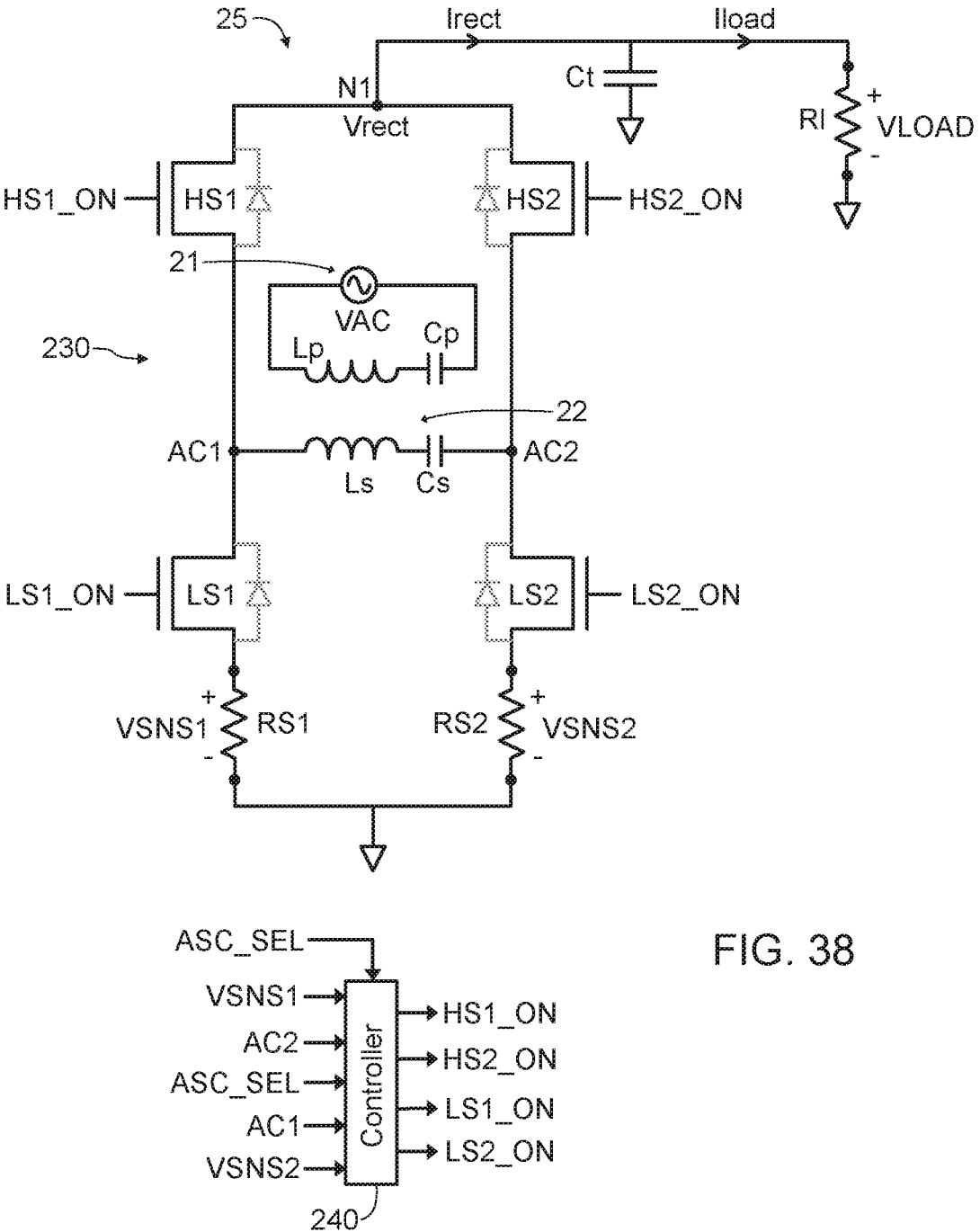
FIG. 38 is a schematic block diagram of a wireless power transmission system disclosed herein in which the bridge rectifier also performs a regulation function, in which low-side current sensing is performed to provide for feedback.

Now described with reference to FIG. 38 is a wireless power transmission system 230 utilizing low-side current sensing for feedback.

The wireless power transmission system 230 includes a transmitter 21 and a receiver 22. The transmitter 21 is comprised of an AC voltage source VAC coupled to a serial resonant transmitter coil Lp and capacitance Cp. The receiver 22 includes a serial resonant receiver coil Ls and capacitance Cs coupled between nodes Ac1 and Ac2, and a "regtifier" 25 (a bridge rectifier also capable of voltage regulation when controlled using techniques described herein) formed by transistors HS1, LS1, HS2, LS2 coupled between node N1 and ground.

The regtifier 25 is formed by: an n-channel transistor HS1 having a drain connected to node N1, a source connected to node Ac1, and a gate coupled to receive a control signal HS1_ON; an n-channel transistor LS1 having a drain connected to node Ac1, a source coupled to ground through sense resistor RS1, and a gate coupled to receive a control signal LS1_ON; an n-channel transistor HS2 having a drain connected to node N1, a source connected to node Ac2, and a gate coupled to receive a control signal HS2_ON; and a an n-channel transistor LS2 having a drain connected to node Ac2, a source coupled to ground through sense resistor RS2, and a gate coupled to receive a control signal LS2_ON.

An optional tank capacitor Ct is coupled between node N1 and ground, and a rectified output voltage Vrect is formed across the tank capacitor Ct. The load is resistive, and represented as resistor Rl coupled between node N1 and ground, with load current load being sourced to the load.

Control circuitry 240 monitors the voltage VSNS1 across sense resistor RS1 and the voltage VSNS2 across sense resistor RS2, and based thereupon estimates the power delivered to the load.

In greater detail, operation of the regtifier 25 proceeds in two phases. During a first phase, control signals HS1_ON and LS2_ON are asserted, turning on transistors HS1 and LS2, as shown in FIGS. 39A-39B. During a second phase, control signals HS2_ON and LS1_ON are asserted, turning on transistors HS2 and LS1, as shown in FIGS. 39A-39B. During both phases, one of the regtification techniques described above (e.g., in-phase serial voltage regulation, anti-phase parallel voltage regulation, combination of in-phase serial and anti-phase parallel voltage regulation) is performed by the controller 240 based on feedback. For example purposes in this description, assume that the anti-phase parallel voltage regulation technique (described hereinabove in Section C, labelled "C. Operation Using Anti-Phase Parallel Voltage Regulation") is utilized for regtification, as shown in FIG. 39B (with FIG. 39A showing the effect of a lack of this regtification in the rectified voltage Vrect and the load current load).

Figure 38A:
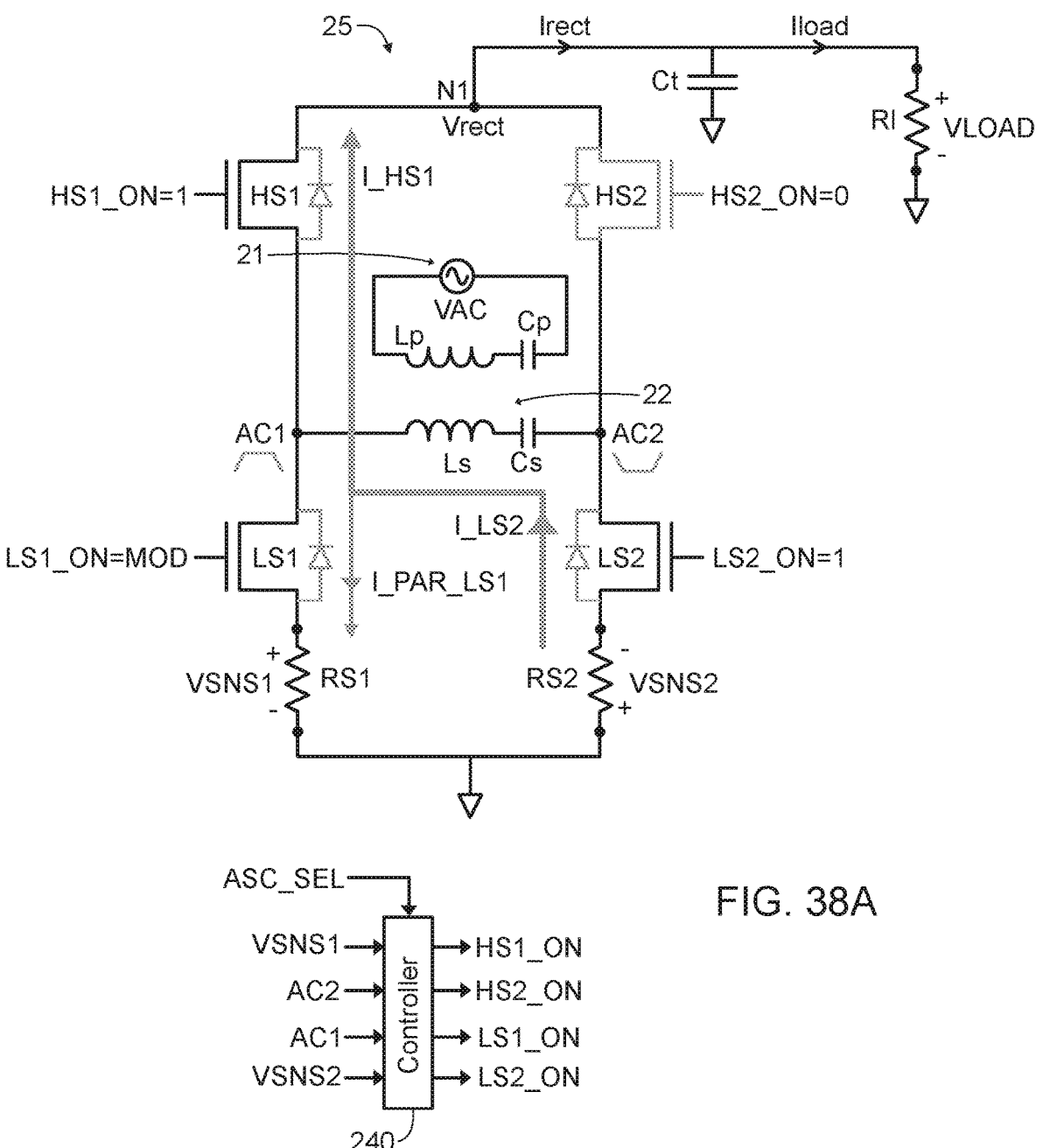
FIG. 38A is a version of FIG. 38 showing currents and voltages in operation during the first phase.

The first phase is now described in greater detail with additional reference to FIG. 38A and FIG. 39B, showing the wireless power transmission system 230 of FIG. 38 while operating in the first phase. During the first phase, as stated, control signals HS1_ON and LS2_ON are asserted by the controller 240, turning on transistors HS1 and LS2, and control signal LS1_ON is modulated by the controller 240 so as to modulate transistor LS1 to perform regtification. Observe that the current I_LS2 flowing through transistor LS2 is equal to the sum of the current I_HS1 flowing through transistor HS1 and the modulated current I_PAR_LS1 flowing through transistor LS1, with the modulated current I_PAR_LS1 being the excess of the incoming current sunk by the anti-phase parallel voltage regulation.

During this first phase, the modulated current I_PAR_LS1 and the load current load can be determined by the controller 240 based upon the voltages VSNS1 and VSNS2 across the sense resistors RS1 and RS2. This is perhaps understood mathematically, represented as:

$$I\_PAR\_LS1=VSNS1/RS1$$

$$I\_LS2=VSNS2/RS2$$

$$Iload=I\_LS2-I\_PAR\_LS1$$

Stated another way, during the first phase, to measure I_PAR_LS1, the voltage VSNS1 across resistor RS1 is measured and to measure load, the sum of the voltages VSNS1+VSNS2 across resistors RS1 and RS2 is measured. The operation to measure I_PAR_LS1 during the first phase is triggered by deassertion of the signal ASC_SEL, and the operation to measure load during the first phase is triggered by assertion of the signal ASC_SEL As an example implementation, the voltage VSNS1 may be measured during a first given number of instances of the first phase, and the sum of the voltages VSNS1+VSNS2 may be measured during a second given number of instances of the first phase occurring after (and/or before) the first given number of instances.

The excess power Pexcess withdrawn by transistor LS1 during the first phase can be estimated by the controller 240 based upon the modulated current I_PAR_LS1 and the voltage VAC1 at node AC1. Mathematically, this is represented as:

$$Pexcess=I\_PAR\_LS1\times VAC1$$

The power POUT delivered to the load can then be estimated by the controller 240 as:

$$POUT=Iload\times Vrect$$

Figure 1:
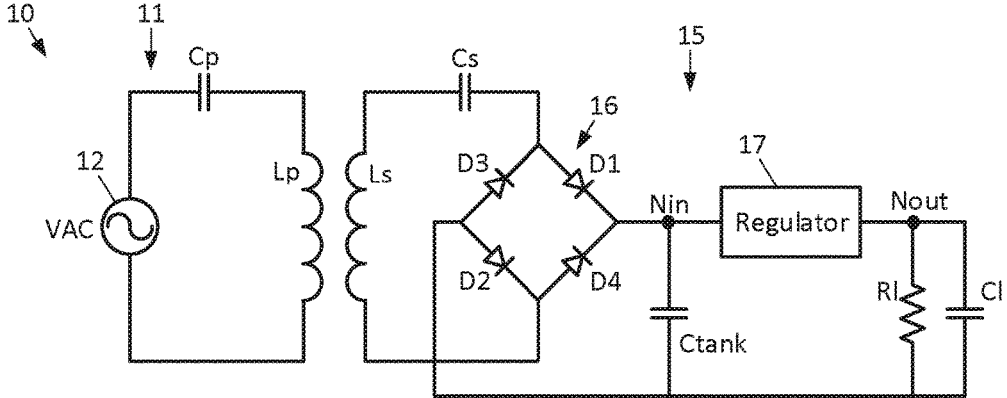
FIG. 1 is a schematic block diagram of a prior art wireless power transmission system.

Based on these determined values, the controller 240 performs the regtification during the first phase, modulating the control signal LS1_ON suitably to modulate the transistor LS1 so as to maintain the output voltage Vrect at the desired level. Additionally, the computation of Pexcess can be used by the receiver 15 (referring to FIG. 1) for instructing the transmitter 11 to vary its transmitted power.

Figure 38B:
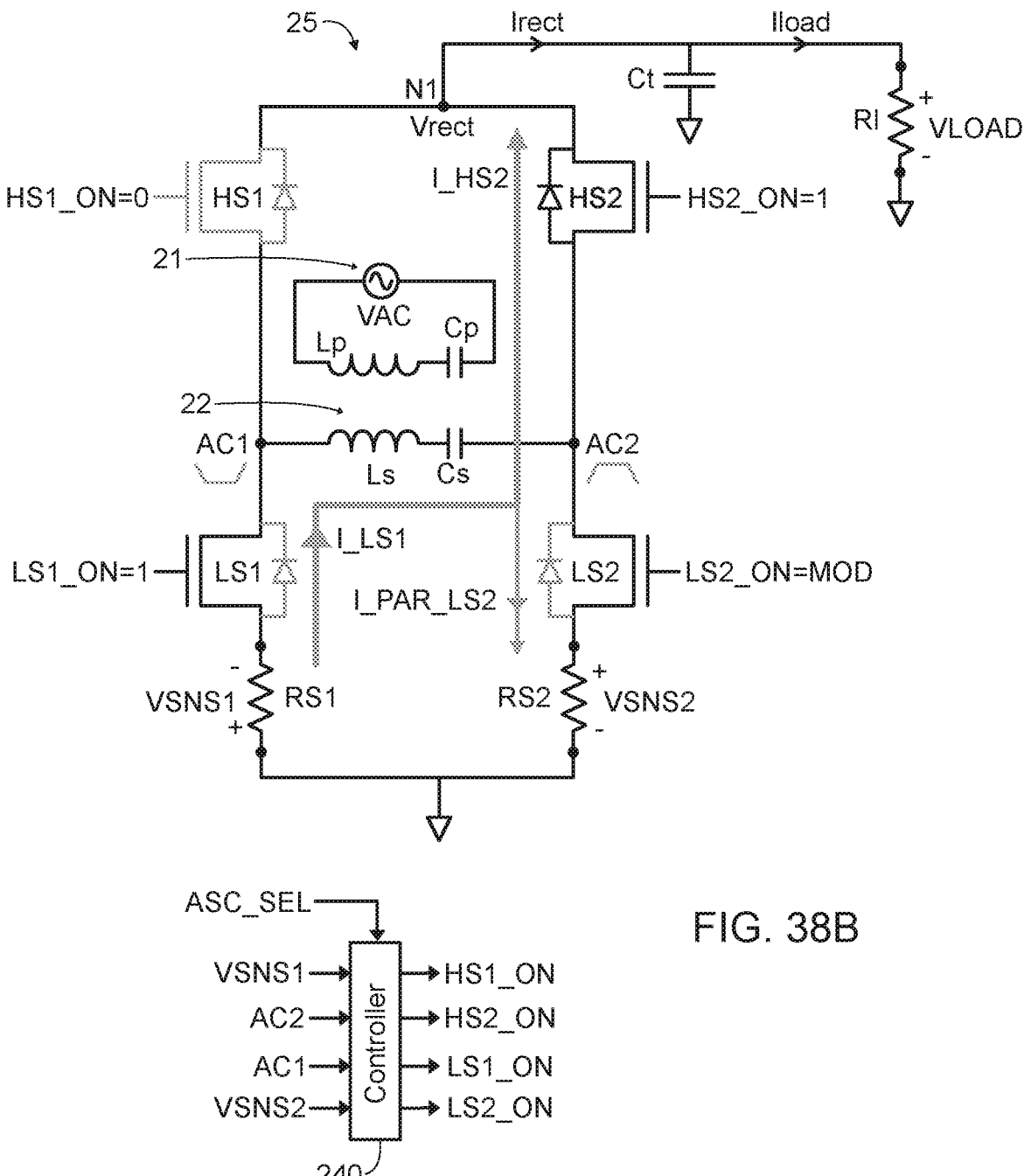
FIG. 38B is a version of FIG. 38 showing currents and voltages in operation during the second phase.

The second phase is now described in greater detail with additional reference to FIG. 38B and FIG. 39B, showing the wireless power transmission system 230 of FIG. 38 while operating in the second phase. During the second phase, as stated, control signals HS2_ON and LS1_ON are asserted by the controller 240, turning on transistors HS2 and LS1, and control signal LS2_ON is modulated by the controller 240 so as to modulate transistor LS2 to perform regtification. Observe that the current I_LS1 flowing through transistor LS1 is equal to the sum of the current I_HS2 flowing through transistor HS2 and the modulated current I_PAR_LS2 flowing through transistor LS2, with the modulated current I_PAR_LS2 being the excess of the incoming current sunk by the anti-phase parallel voltage regulation.

During this second phase, the modulated current I_PAR_LS2 and the load current load can be determined by the controller 240 based upon the voltages VSNS2 and VSNS1 across the sense resistors RS2 and RS1. This is perhaps understood mathematically, represented as:

$$I\_PAR\_LS2=VSNS2/RS2$$

$$I\_LS1=VSNS1/RS1$$

$$Iload=I\_LS1-I\_PAR\_LS2$$

Stated another way, during the second phase, to measure I_PAR_LS2, the voltage VSNS2 across resistor RS2 is measured, and to measure load, the sum of the voltages VSNS1+VSNS2 across resistors RS1 and RS2 is measured. As an example implementation, the voltage VSNS2 may be measured during a first given number of instances of the second phase, and the sum of the voltages VSNS1+VSNS2 may be measured during a second given number of instances of the second phase occurring after the first given number of instances.

The excess power Pexcess withdrawn by transistor LS2 during the second phase can be estimated by the controller 240 based upon the modulated current I_PAR_LS2 and the voltage VAC2 at node AC2. Mathematically, this is represented as:

$$Pexcess=I\_PAR\_LS2\times VAC2$$

The power POUT delivered to the load can then be estimated by the controller 240 as:

$$POUT=Iload\times Vrect$$

Based on these determined values, the controller 240 performs the regtification during the second phase, modulating the control signal LS2_ON suitably to modulate the transistor LS2 so as to maintain the output voltage Vrect at the desired level. Additionally, the computation of Pexcess can be used by the receiver 15 (referring to FIG. 1) for instructing the transmitter 11 to vary its transmitted power.

The advantages of the wireless power transmission system 230 utilizing the controller 240 to perform the low-side current sensing are evident. For example, Pexcess and Pout are measured utilizing the same hardware, and therefore the relationship between them can be more accurately correlated than if Pexcess and Pout were measured using different hardware (as the hardware itself could spoil the correlation to an extent). For this same reason, this design provides for hardware efficiency and layout area optimization. Still further, since the current measuring is performed on the low-side transistors LS1 and LS2, less protection circuitry is necessary, as the measurement is performed in a low-voltage domain.

Figure 40:
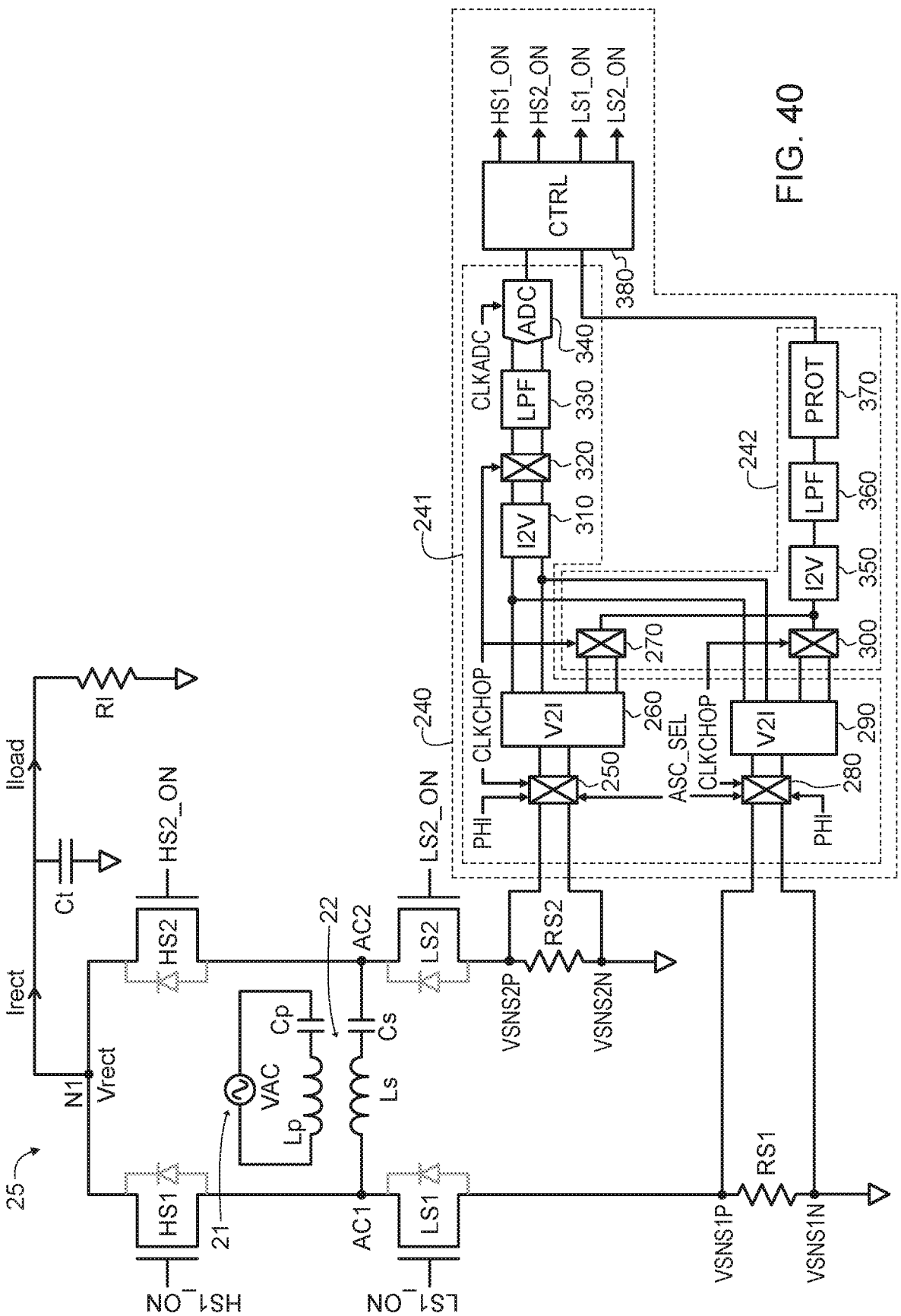
FIG. 40 is a schematic block diagram of the wireless power transmission system of FIG. 38, with block diagram level details of the control circuitry being shown.
Figure 41:
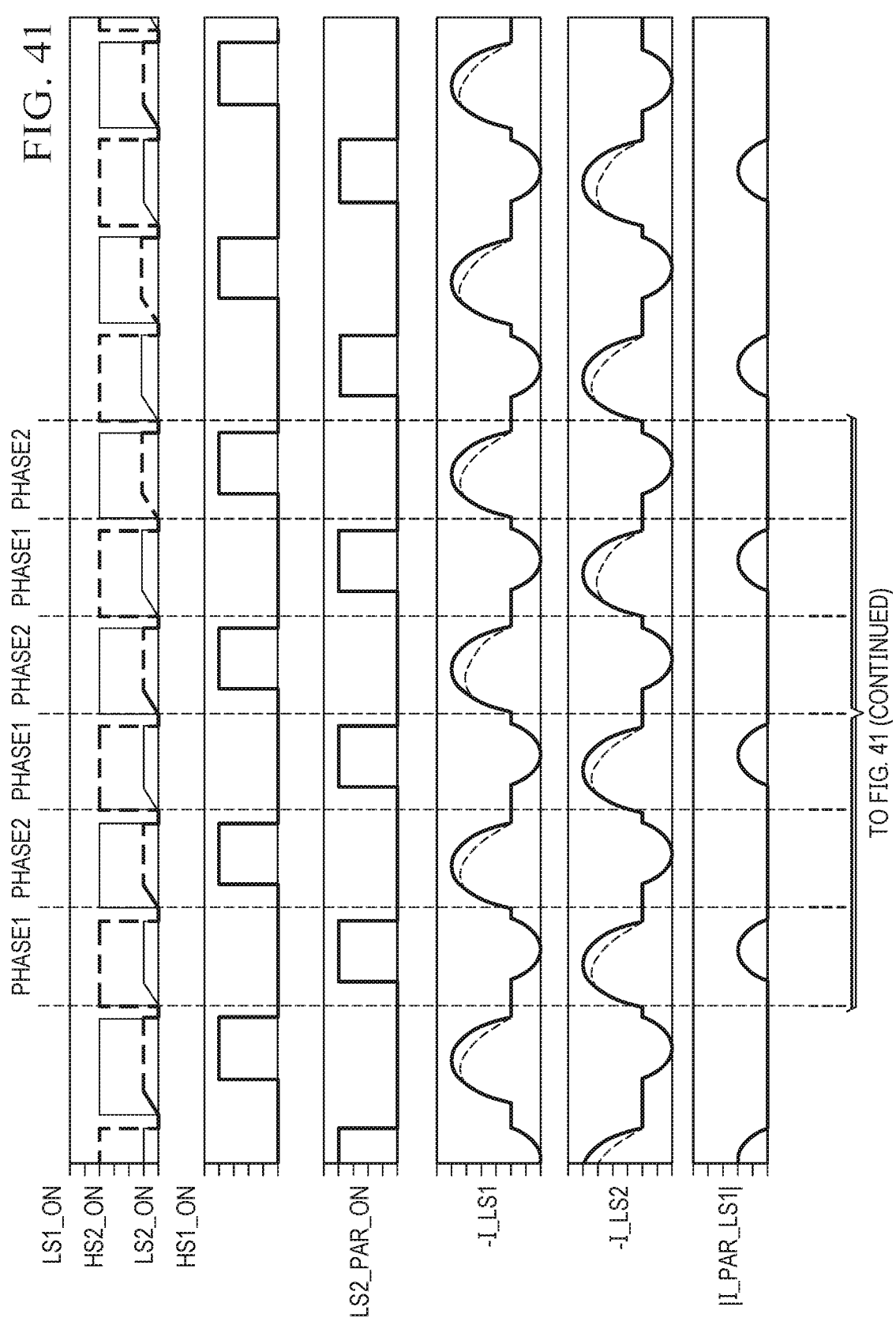
FIG. 41 includes waveforms showing currents and voltages of the wireless power transmission system of FIG. 40 in operation, including performance of the regulation function.
Figure 41:
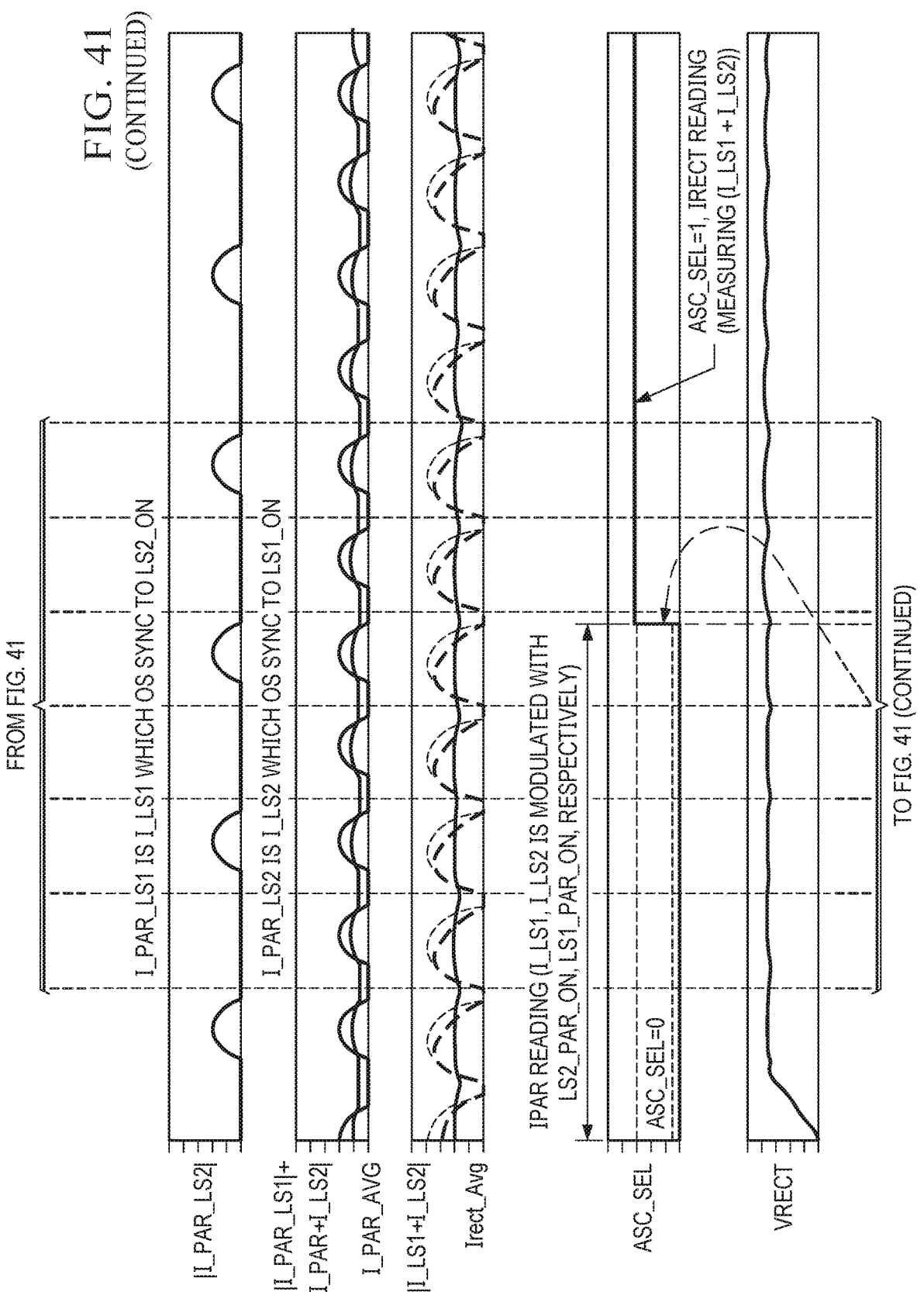
Figure 41:
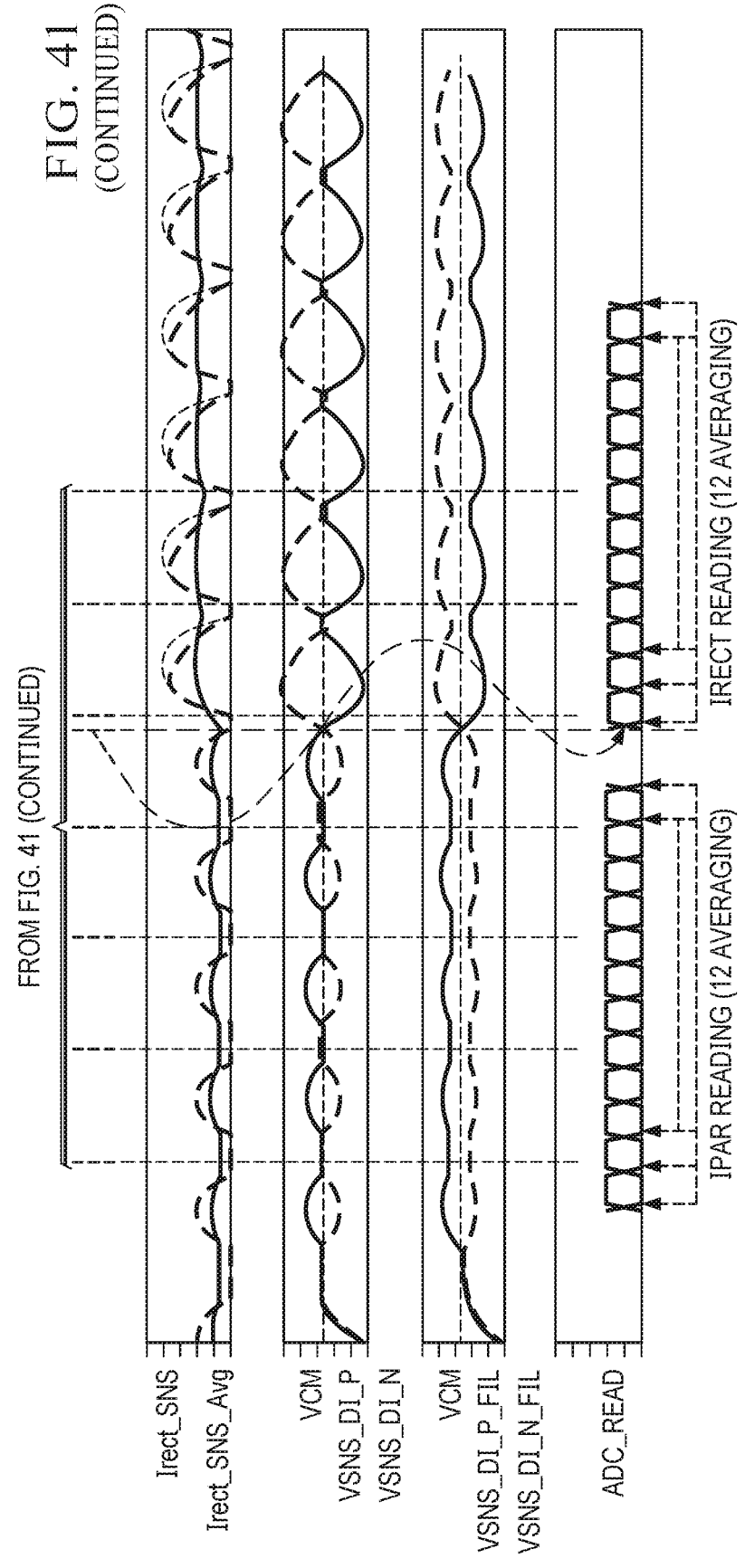

The controller 240 is shown in greater detail in FIG. 40 and voltages therein are shown during operation in FIG. 41. The controller 240 includes a differential channel 241 for current sensing and monitoring and a single-ended channel 242 for performing a fast current sense used for protection purposes.

The differential channel 241 includes a first chopper 250 (clocked by CLKCHOP) which has differential inputs connected to resistor RS2, chops the differential voltage across RS2, and provides the resulting chopped differential voltage to the differential inputs of voltage to current converter (V2I) 260. The V2I 260 converts the chopped differential voltage into two sets of differential output currents.

The differential channel 241 includes a second chopper 280 (clocked by CLKCHOP) which has differential inputs connected to resistor RS1, chops the differential voltage across RS1, and provides the resulting chopped differential voltage to the differential inputs of voltage to current converter (V2I) 290. The V2I 290 converts the chopped differential voltage into two sets of differential output currents.

The choppers 250 and 280 can be used for masking the VSNS1 or VSNS2 readings when desired. This can be achieved by shorting the two inputs of a chopper to a same voltage for forcing the output current of the associated V2I 260 or V2I 290 to deliver zero current. This is used for ignoring VSNS1 (or VSNS2) when ASC_SEL is deasserted and during Phase 2 (or Phase 1), shown in FIG. 41 during the first two labelled instances of Phase 1 and Phase 2.

When ASC_SEL is deasserted, during Phase 2 (or Phase 1), it causes the chopper 280 (or 250) to block passage VSNS1 (or VSNS2), the first set of differential current outputs by V2I 260 (or the first set of differential currents output by VI 290) is converted to a differential voltage by the current to voltage (I2V) converter 310.

When ASC_SEL is asserted, during Phase 1 or Phase 2, it causes both choppers 250 and 280 to pass VSNS2 and VSNS1 through V2I 290 and V2I 260 (shown in FIG. 41 during the third instances of Phase 1 and Phase 2), and the first set of differential currents output by the V2I 260 is summed with the first set of differential currents output by V2I 290 and converted to a differential voltage by the current to voltage (I2V) converter 310.

The resulting differential voltage at I2V 310, which is the combined value from VSNS1 and/or VSNS2, is de-chopped by de-chopper 320 (clocked by CLKCHOP), filtered by low-pass filter 330, and digitized by ADC 340 (clocked by CLKADC) prior to being passed to the control circuitry 280.

The single-ended channel 242 takes its inputs from the second set of output currents of V2I 260 and second set of output currents of V2I 290. The second set of V2I 260 differential output currents is de-chopped by de-chopper 270 to produce a single, non-differential output current that is provided to the input of the single-ended and shared current to voltage converter (I2V) 350. The second set of V2I 290 differential output currents is de-chopped by de-chopper 300 to produce a single, non-differential output current that is provided to the input of the single-ended shared current to voltage converter (I2V) 350.

The resulting single-ended voltage at I2V 350, which is combined value from VSNS1 and/or VSNS2, is filtered by low-pass filter 360 and provided to protection circuitry 370, which generates protection control signals passed to the control circuitry 380.

The control circuitry 380 generates the control signals HS1_ON, LS1_ON, HS2_ON, and LS2_ON for operating the regtifier 25 pursuant to the regtification principles described hereinabove.

Figure 42:
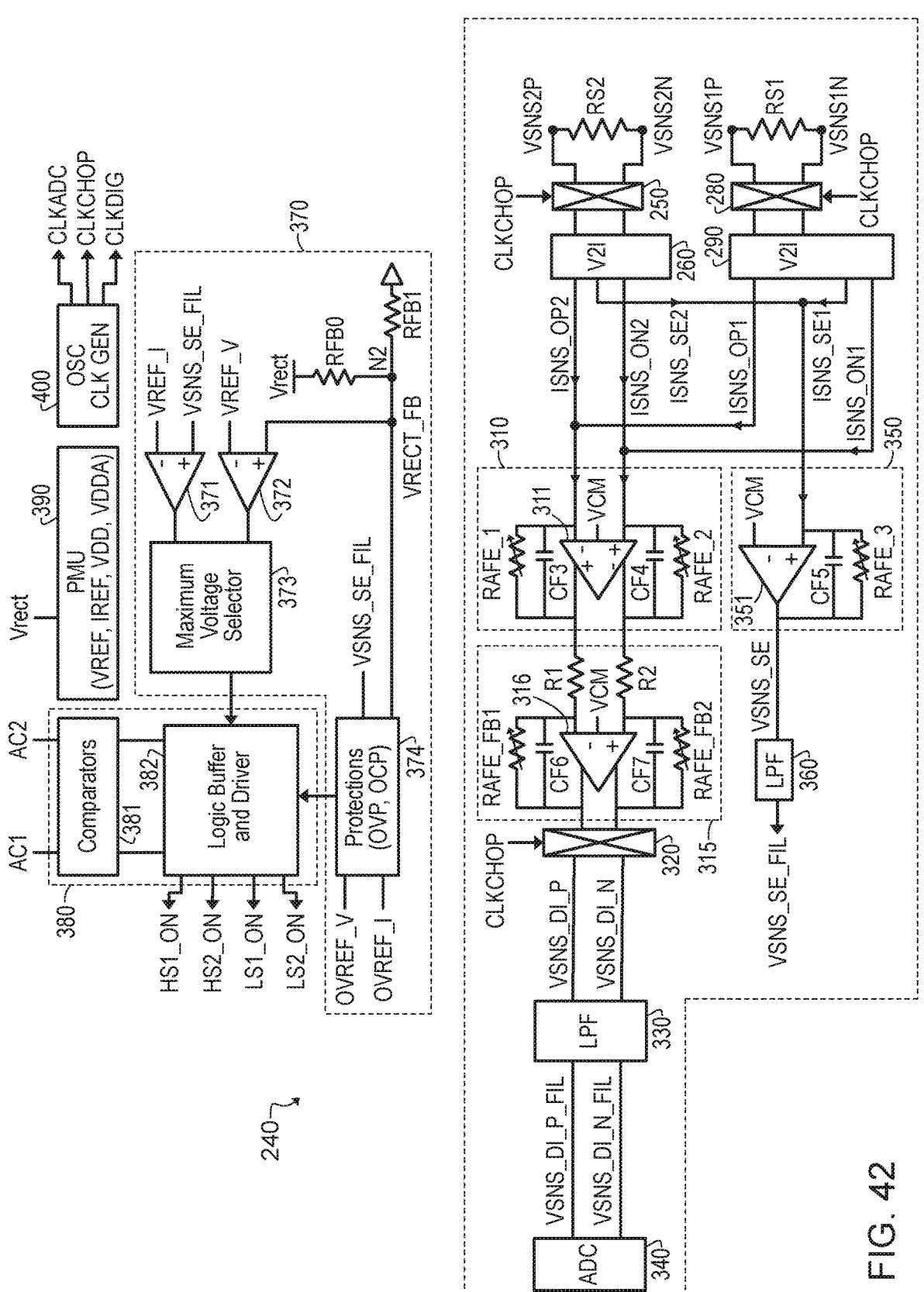
FIG. 42 is a schematic block diagram of the control circuitry of FIG. 40.

Now described with reference to FIG. 42 is an embodiment of the controller 240 similar to that of FIG. 38, but in which example specifics of the I2Vs 310 and 350 are shown, and in which a programmable gain amplifier (PGA) 315 amplifies the output of I2V 310 before chopping by the chopper 320.

Choppers 280 (clocked by CLKCHOP) pass the chopped differential voltage VSNS1P, VSNS1N formed across resistor RS1 during Phase 1 when ASC_SEL is deasserted and during both Phase 1 and Phase 2 when ASC_SEL is asserted. Chopper 250 (clocked by CLKCHOP) passes the differential voltage VSNS2P, VSNS2N formed across resistor RS2 during Phase 2 when ASC_SEL is deasserted and during both Phase 1 and Phase 2 when ASC_SEL is asserted.

The outputs of the chopper 250 are converted to differential currents ISNS_OP2, ISNS_ON2 by the V2I 260. In addition to these differential currents, the V2I 260 also outputs a single ended current ISNS_SE2.

The outputs of the chopper 280 are converted to differential currents ISNS_OP1, ISNS_ON1 by the V2I 290. In addition to these differential currents, the V2I 290 also outputs a single ended current ISNS_SE1.

ISNS_OP1, ISNS_ON1, ISNS_OP2, ISNS_ON2, ISNS_SE1, ISNS_SE2 reflect VSNS1 and VSNS2 when ASC_SEL is asserted. ISNS_OP1, ISNS_ON1, ISNS_OP2, ISNS_ON2, ISNS_SE1, ISNS_SE2 are nulled when ASC_SEL is deasserted and the index of the Phase is not the index of the current (i.e., ISNS_OP1, ISNS_ON1, ISNS_SE1 are nulled during Phase 2).

The I2V 310 is formed by a differential operational amplifier 311, which receives ISNS_OP2, ISNS_ON2, ISNS_OP1, ISNS_OP1 in all circumstances. Some of the currents (indexed 1 or indexed 2) may have been nulled at choppers 250 and chopper 280 level depending on index of Phase and the assertion status of ASC_SEL.

Capacitor CF3 and adjustable resistor RAFE_1 are connected in parallel between the inverting input terminal and the non-inverting output terminal of operational amplifier 311, and capacitor CF4 and adjustable resistor RAFE_2 are connected in parallel between the non-inverting input terminal and the inverting output terminal of operational amplifier 311.

The I2V 310 converts the differential currents at its input to a differential voltage VOUT_DIFF_P and VOUT_DIFF_N at its outputs provided to resistors R1 and R2 of programmable gain amplifier (PGA) 315.

The PGA 315 includes operational amplifier 316 having its inverting input terminal coupled to the non-inverting output terminal of operational amplifier 311 through resistor R1 and having its non-inverting input terminal coupled to the inverting output terminal of operational amplifier 311 through resistor R2. Capacitor CF6 and adjustable resistor RAFE_FB1 are connected in parallel between the inverting input terminal and the non-inverting output terminal of operational amplifier 316, and capacitor CF7 and adjustable resistor RAFE_FB2 are connected in parallel between the non-inverting input terminal and the inverting output terminal of operational amplifier 316. The PGA 315 applies a programmable gain to the differential voltages output by I2V 310, with the resulting amplified differential voltages being de-chopped by de-chopper 320 (clocked by CLKCHOP) to produce the differential voltages VSNS_DI_P and VSNS_DI_N. These differential voltages are amplified by the low-pass filter 330 to produce the differential voltages VSNS_DI_P_FIL and VSNS_DI_N_FIL, which are digitized by ADC 340 and provided to control circuitry 380. These differential voltages VSNS_DI_P_FIL and VSNS_DI_N_FIL, whether measured during assertion of ASC_SEL or deassertion of ASC_SEL, are indicative of the modulated current I_PAR_LS1/I_PAR_LS2 or the rectifier output current Irect generated by the regtifier 25 and are utilized by the control circuitry 380 in controlling the regtification process.

The I2V 350 includes single-ended operational amplifier 351 which receives the common mode voltage VCM of operational amplifiers 311 and 316 at its inverting input and the sum of voltages ISNS_SE2 and ISNS_SE1 at its non-inverting input. Capacitor CF5 and adjustable resistor RAFE_3 are connected in parallel between the non-inverting input and the output of the single-ended operational amplifier 351. The I2V 350 converts the sum of currents ISNS_SE1 and ISNS_SE2 to a voltage VSNS_SE, which is in turn filtered by low-pass filter 360 to produce voltage VSNS_SE_FIL, provided to the protection circuitry 370. Similarly to VSNS_DI_P_FIL/VSNS_DI_N_FIL, voltage VSNS_SE_FIL is indicative of the I_PAR_LS1/I_PAR_LS2 or the rectifier output current as determined by the single ended channel 242.

The response time requirements on differential channel 241 differ from those on single ended channel 242 in a sense that differential channel 241 is precise with noise insensitive differential circuitry, consequently filtering the TX incoming frequency and providing for conversion to digital domain Single ended channel 242 is mainly intended to be fast to report at the expense of absolute precision.

The protection circuitry 370 receives VSNS_SE_FIL, as well as reference voltages VREF_I (representative of a reference current) and VREF_V (representative of a reference voltage). In particular, the protection circuitry 370 includes a first feedback resistor RFB0 connected between node N1 (at which the rectified voltage Vrect is produced) and node N2, and a second feedback resistor RFB1 connected between node N2 and ground, with a feedback voltage VRECT_FB indicative of the rectified voltage VRECT therefore being produced at node N2. A protection block 374 receives the feedback voltage VRECT_FB, a reference voltage OVREF_V, and VSNS_SE_FIL and a reference current OVREF_I at its inputs, and generates an overvoltage protection signal (OVP) and an overcurrent protection signal (OCP) based upon those inputs. For example, when VRECT_FB is greater than OVREF_V, the OVP signal is asserted to indicate an overvoltage condition, and when VSNS_SE_FIL is greater than OVREF_I, the OCP signal is asserted to indicate an overcurrent condition. The OVP and OCP signals are received by logic buffering and driver circuitry 382 of the control circuitry 380, which may modify the control signals HS1_ON, LS1_ON, HS2_ON, and LS2_ON so as to perform overvoltage and overcurrent protection functions. Protections thresholds OVREF_V and OVREF_I are generally set such that they are significantly higher than VREF_I and VREF_V.

The protection circuitry 370 further includes a first comparator 371 having an inverting input terminal receiving the voltage VREF_I and a non-inverting input terminal receiving the voltage VSNS_SE_FIL. The first comparator 371 asserts its output when the voltage VSNS_SE_FIL is greater than VREF_I (indicating that the load current Iload has exceeded a reference load current), but otherwise deasserts its output.

The protection circuitry 370 further includes a second comparator 372 having an inverting input terminal receiving the voltage VREF_V and a non-inverting input terminal receiving the voltage VRECT_FB. The second comparator 372 asserts its output when the voltage VRECT_FB is greater than VREF_V (indicating that the rectified voltage Vrect has exceeded a reference voltage), but otherwise deasserts its output.

Maximum voltage selector 373 receives the outputs of comparators 371 and 372 and provides output to the logic buffering and driver circuitry 382 of the control circuitry 380. In particular, the outputs of comparators 371 and 372 are used to set the rectified voltage Vrect or the load current Iload, to whichever reaches first its reference VREF_V or VREF_I. Practically, this means that during starting sequences where VRECT_FB is still significantly lower than its target VREF_V, but VSNS_SE_FIL reaches its target, the rectifier will behave as a constant current source for supporting CC charging mode of a battery for example Conversely, during sequences where VSNS_FE_FIL is still significantly lower than its target VREF_I, but VRECT_FB reaches its target, the rectifier will behave as a constant voltage source for supporting CV charging mode of a battery for example Also included within the control circuitry 380 are comparators 381 that receive the voltages AC1 and AC2 and provide output to the logic buffering and driver circuitry 382, and are known as zero-crossing comparators in the state of the art of synchronous rectifier control signal generation.

The control circuitry 240 also includes a power management unit 390 that receives the rectified voltage Vrect and produces the reference voltages VREF_V, VREF_I, as well as the supply voltages VDD and VDDA.

Figure 43:
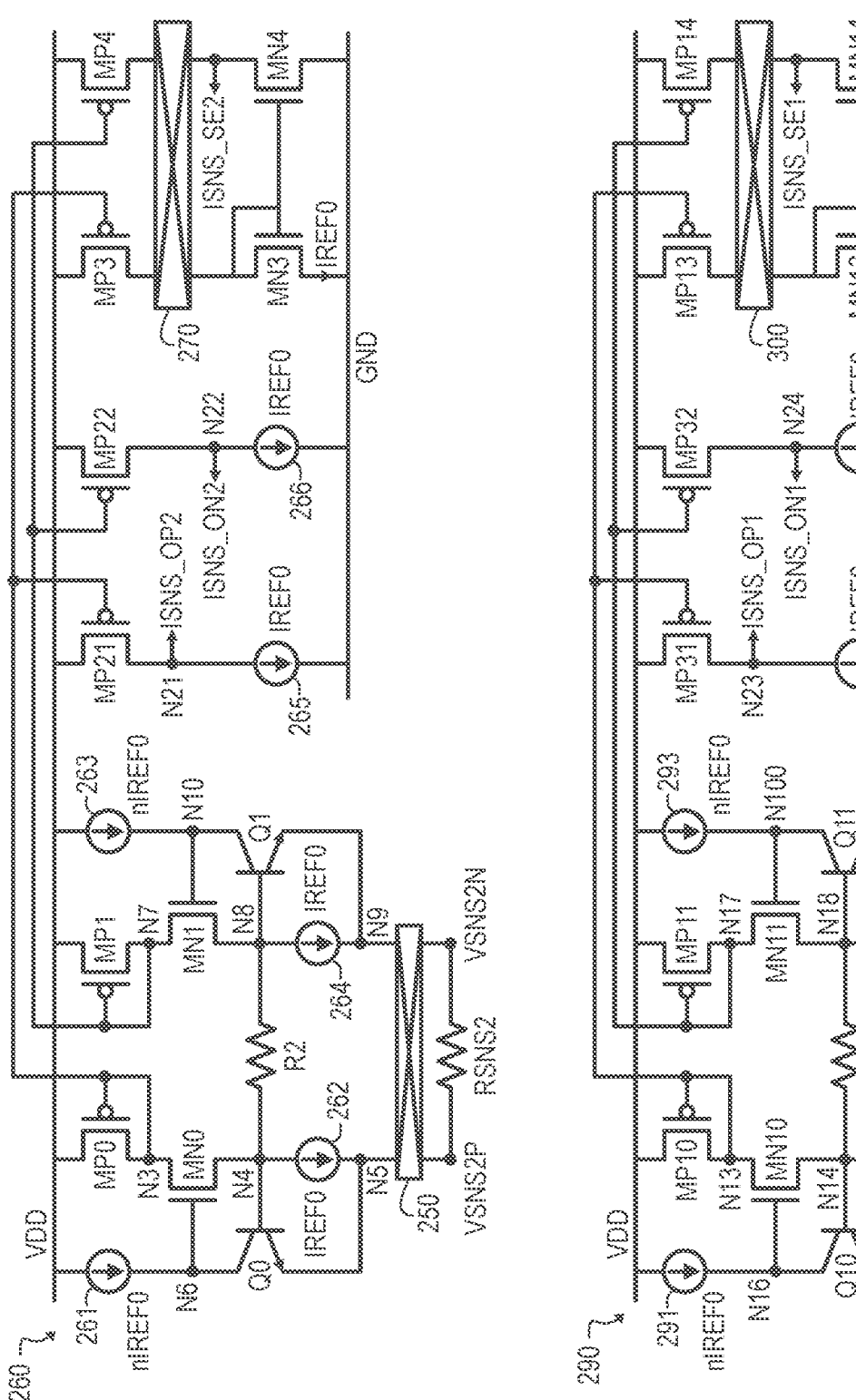
FIG. 43 includes schematic diagrams of the voltage to current converter circuitries of FIG. 42 in operation during the second phase.

Example circuits for the V2I 260 and V2I 290 are now described with additional reference to FIG. 43.

The V2I 260 includes: p-channel transistor MP0 having its source connected to the supply node VDD, and its drain and gate connected to node N3; n-channel transistor MN0 having its drain connected to node N3, its source connected to node N4, and its gate connected to node N6; current source 262 connected between nodes N4 and N5, with current source 262 sourcing reference current REF0 to node N5; current source 261 connected between the supply node VDD and node N6, with current source 261 sourcing scaled reference current nIREF0 to node N6; NPN transistor Q0 having its collector connected to node N6, its emitter connected to node N5, and its base connected to node N5; p-channel transistor MP1 having its source connected to the supply node VDD, and its drain and gate connected to node N7; n-channel transistor MN1 having its drain connected to node N7, its source connected to node N8, and its gate connected to node N10; current source 264 connected between nodes N8 and N9, with current source 264 sourcing reference current REF0 to node N9; current source 263 connected between the supply node VDD and node N10, with current source 263 sourcing scaled reference current nIREF0 to node N10; NPN transistor Q1 having its collector connected to node N10, its emitter connected to node N9, and its base connected to node N8; and resistor R2 connected between nodes N4 and N8. Here, notice that nodes N5 and N9 are connected to the outputs of chopper 250 and the inputs of the chopper 250 are connected to VSNS2P and VSNS2N.

The V2I 260 further includes: p-channel transistor MP21 having its source connected to the supply node VDD, its drain connected to node N21, and its gate connected to node N3; current source 265 connected between node N21 and ground, with current source 265 sinking current IREF0 from node N21 and the current ISNS_OP2 being formed at node N21; p-channel transistor MP22 having its source connected to the supply voltage VDD, its drain connected to node N22, and its gate connected to node N7; and current source 266 connected between node N22 and ground, with current source 266 sinking current IREF0 from node N22 and the current ISNS_ON2 being formed at node N22.

The V2I 260 additionally includes: p-channel transistor MP3 having its source connected to the supply node VDD, its drain connected to a first input of chopper 270, and its gate connected to node N3; n-channel transistor MN3 having its drain connected to a first output of chopper 270, its source connected to ground, and its gate connected to its drain; p-channel transistor MP4 having its source connected to supply node VDD, its drain connected to a second input of chopper 270, and its gate connected to node N7; and n-channel transistor MN4 having its drain connected to a second output of chopper 270, its source connected to ground, and its gate connected to the gate and drain of n-channel transistor MN3.

Operation of the V2I 260 is now described. The voltages VSNS2P and VSNS2N, after chopping, are mirrored to nodes N4 and N8 respectively and the current flowing through resistor R2 is mirrored to nodes N21 and N22 to produce the currents ISNS_OP2 and ISNS_ON2. In greater detail, ISNS_OP2 and ISNS_ON2 can be mathematically represented as:

$$ISNS\_OP2 - ISNS\_OP2 = I\_LS2 \times RSNS2/R2 \times 2$$

The single ended output current ISNS_SE2 can be mathematically represented as:

$$ISNS\_SE2 = I\_LS2 \times RSNS2/R2$$

The V2I 290 includes: p-channel transistor MP10 having its source connected to the supply node VDD, and its drain and gate connected to node N13; n-channel transistor MN10 having its drain connected to node N13, its source connected to node N14, and its gate connected to node N61; current source 292 connected between nodes N14 and N15, with current source 292 sourcing reference current REF0 to node N15; current source 291 connected between the supply node VDD and node N16, with current source 291 sourcing scaled reference current nIREF0 to node N16; NPN transistor Q10 having its collector connected to node N16, its emitter connected to node N15, and its base connected to node N15; p-channel transistor MP11 having its source connected to the supply node VDD, and its drain and gate connected to node N17; n-channel transistor MN11 having its drain connected to node N17, its source connected to node N18, and its gate connected to node N100; current source 294 connected between nodes N18 and N19, with current source 294 sourcing reference current REF0 to node N19; current source 293 connected between the supply node VDD and node N100, with current source 293 sourcing scaled reference current nIREF0 to node N100; NPN transistor Q11 having its collector connected to node N100, its emitter connected to node N19, and its base connected to node N18; and resistor R1 connected between nodes N14 and N18. Here, notice that nodes N15 and N19 are connected to the outputs of chopper 280 and the inputs of the chopper 280 are connected to VSNS1P and VSNS1N.

The V2I 290 further includes: p-channel transistor MP31 having its source connected to the supply node VDD, its drain connected to node N23, and its gate connected to node N13; current source 295 connected between node N23 and ground, with current source 295 sinking current IREF0 from node N23 and the current ISNS_OP1 being formed at node N23; p-channel transistor MP32 having its source connected to the supply voltage VDD, its drain connected to node N24, and its gate connected to node N17; and current source 296 connected between node N24 and ground, with current source 296 sinking current IREF0 from node N24 and the current ISNS_ON1 being formed at node N24.

The V2I 290 additionally includes: p-channel transistor MP13 having its source connected to the supply node VDD, its drain connected to a first input of chopper 300, and its gate connected to node N13; n-channel transistor MN13 having its drain connected to a first output of chopper 300, its source connected to ground, and its gate connected to its drain; p-channel transistor MP14 having its source connected to supply node VDD, its drain connected to a second input of chopper 300, and its gate connected to node N17; and n-channel transistor MN14 having its drain connected to a second output of chopper 300, its source connected to ground, and its gate connected to the gate and drain of n-channel transistor MN13.

Operation of the V2I 290 is now described. The voltages VSNS1P and VSNS1N, after chopping, are mirrored to nodes N14 and N18 respectively and the current flowing through resistor R1 is mirrored to nodes N23 and N24 to produce the currents ISNS_OP1 and ISNS_ON1. In greater detail, ISNS_OP1 and ISNS_ON1 can be mathematically represented as:

$$ISNS\_OP1 - ISNS\_OP1 = I\_LS1 \times RSNS1/R1 \times 2$$

The single ended output current ISNS_SE1 can be mathematically represented as:

$$ISNS\_SE1 = I\_LS1 \times RSNS1/R1$$

Keeping this operation of V2I 260 and V2I 290 in mind, refer back to FIG. 42. The outputs of the I2V 310 are differential voltages that may be mathematically represented as:

$$VOUT\_DIFF = (I\_LSx \times RSNSx/Rx) \times RAFE \times 2$$

Still further, the single ended output voltage VSNS_SE produced by I2V 350 may be mathematically represented as:

$$VSNS\_SE=VCM-(I\_LSx \times RSNSx/Rx) \times RAFE\_3$$

Keeping the calculation of the output voltage VOUT_DIFF produced by the I2V 310 in mind, the output of the PGA 315 can be mathematically represented as:

$$VOUT_{DIFF_{PGA}}=VOUT_{DIFF} \times (RAFE_{FB1}/R1)=$$
$$VOUT_{DIFF} \times (RAFE_{FB2}/R2)$$

It is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A wireless power reception system, comprising:
a bridge rectifier arrangement of transistors comprising a first high-side transistor coupled between an output node and a first input node, a second high-side transistor coupled between the output node and a second input node, a first low-side transistor coupled between the first input node and ground through a first sense resistor, and a second low-side transistor coupled between the second input node and ground through a second sense resistor, wherein an input time varying power signal is received across the first input node and the second input node; and
a control circuit coupled to receive a first differential voltage formed across the first sense resistor and a second differential voltage formed across the second sense resistor, the control circuit configured to:
turn on the first high-side transistor and the second low-side transistor during a first phase, and turn on the second high-side transistor and the first low-side transistor during a second phase, to thereby cause rectification of the input time varying power signal to produce an output voltage at the output node;
during a first given number of occurrences of the first phase, determine a current sunk by the first low-side transistor based upon a voltage across the first sense resistor;
during a second given number of occurrences of the first phase, determine a current delivered to a load coupled between the output node and ground based upon a sum of the voltage across the first sense resistor and a voltage across the second sense resistor; and
modulate a gate voltage of the first low-side transistor during the first phase and modulate a gate voltage of the second low-side transistor during the second phase, based upon the determined current delivered to the load, to thereby cause dissipation of excess power delivered by the input time varying power signal and therefore perform output voltage regulation on top of rectification.

2. The wireless power reception system of claim 1, wherein the control circuit is further configured to:
during a first given number of occurrences of the second phase, determine a current sunk by the second low-side transistor based upon a voltage across the second sense resistor; and during a second given number of occurrences of the second phase, determine a current delivered to the load coupled between the output node and ground based upon a sum of the voltage across the second sense resistor and the voltage across the first sense resistor.

3. The wireless power reception system of claim 2,
wherein a channel selection signal is deasserted during the first given number of occurrences of the first phase, is asserted during the second given number of occurrences of the first phase, is deasserted during the first given number of occurrences of the second phase, and is asserted during the second given number of occurrences of the second phase; and
wherein the control circuit comprises:
a differential channel comprising:
a first chopper configured to chop a first differential voltage across the first sense resistor to produce a first chopped differential voltage during the first phase when the channel selection signal is deasserted, and to block the first differential voltage during the second phase when the channel selection signal is asserted;
a first voltage to current converter configured to convert the first chopped differential voltage to a first differential current;
a second chopper configured to chop a second differential voltage across the second sense resistor to produce a second chopped differential voltage during the second phase when the channel selection signal is deasserted, and to block the second differential voltage during the first phase when the channel selection signal is asserted;
a second voltage to current converter configured to convert the second chopped differential voltage to a second differential current; and
a control signal generator configured to control turn-on of the first high-side transistor, first low-side transistor, second high-side transistor, and second low-side transistor, and to control modulation of the gate voltage of the first low-side transistor and the second low-side transistor, based upon the first differential current and second differential current.

4. The wireless power reception system of claim 3, wherein the differential channel further comprises:
a first current to voltage converter configured to receive the first and second differential currents from the first and second voltage to current converters and to convert them into a corresponding differential voltage;
a first de-chopper configured to de-chop the differential voltage provided by the first current to voltage converter to produce a stabilized voltage signal;
a first low-pass filter configured to receive the stabilized voltage signal provided by the first de-chopper and filter out high-frequency noise, thereby producing a filtered voltage signal indicative of the current delivered to the load; and
an analog-to-digital converter configured to digitize the filtered voltage signal provided by the first low-pass filter and pass the digitized filtered voltage signal to the control signal generator for use in controlling turn-on of the first high-side transistor, first low-side transistor, second high-side transistor, and second low-side transistor, and for use in controlling modulation of the gate voltage of the first low-side transistor and the second low-side transistor, based upon the first differential current and second differential current.

5. The wireless power reception system of claim 3, wherein the control circuit further comprises a single-ended channel, the single-ended channel comprising:

a third de-chopper configured to de-chop the first differential current provided by the first voltage to current converter to produce a first single, non-differential output current;

a fourth de-chopper configured to de-chop the second differential current provided by the second voltage to current converter to produce a second single, non-differential output current; and a protection circuit configured to generate overcurrent and/or overvoltage protection signals based upon the first and second single non-differential output currents and the output voltage at the output node;

wherein the control signal generator modifies turn-on of the first high-side transistor, first low-side transistor, second high-side transistor, and second low-side transistor based upon the overcurrent and/or overvoltage protection signals.

6. The wireless power reception system of claim 5, wherein the single-ended channel further comprises:

a second current to voltage converter configured to receive the first and second single non-differential output currents and to convert them into a corresponding differential voltage; and a second low-pass filter configured to receive the differential voltage from the second current to voltage converter and filter out high-frequency noise therefrom to produce a filtered voltage signal;

wherein the protection circuit generates the overcurrent protection signal based upon the filtered voltage signal received from the second low-pass filter.

7. The wireless power reception system of claim 6, wherein the protection circuit comprises:

a first comparator configured to compare the filtered voltage signal to a predetermined current threshold and generate an overcurrent protection signal when the predetermined current threshold is exceeded; and a second comparator configured to compare the output voltage at the output node against a predetermined voltage threshold and generate an overvoltage protection signal when the predetermined voltage threshold is exceeded;

wherein the control signal generator modifies turn-on of the first high-side transistor, first low-side transistor, second high-side transistor, and second low-side transistor, and modifies modulation of the gate voltage of the first low-side transistor and the second low-side transistor based upon the overcurrent and/or overvoltage protection signals.

8. The wireless power reception system of claim 3, wherein the second voltage to current converter comprises:

a first p-channel transistor having a source connected to a supply voltage node, a drain connected to a first node, and a gate connected to the first node;

a first n-channel transistor having a drain connected to the first node, a source connected to a second node, and a gate connected to a third node;

a first current source connected between the second node and a fourth node and configured to sink a first reference current from the second node and source the first reference current to the fourth node;

a second p-channel transistor having a source connected to the supply voltage node, a drain connected to a fifth node, and a gate connected to the fifth node;

a second n-channel transistor having a drain connected to the fifth node, a source connected to a sixth node, and a gate connected to a seventh node; and a second current source connected between the sixth node and an eighth node and configured to sink a second reference current from the sixth node and source the second reference current to the eighth node;

wherein the second chopped differential voltage is received at the fourth node and eighth node.

9. The wireless power reception system of claim 8, wherein the second voltage to current converter further comprises:

a first NPN transistor having a collector connected to the third node, an emitter connected to the fourth node, and a base connected to the second node;

a third current source connected between the supply voltage node and the third node, the third current source configured to source a scaled version of the first reference current to the third node;

a second NPN transistor having a collector connected to the seventh node, an emitter connected to the eighth node, and a base connected to the sixth node; and a fourth current source connected between the supply voltage node and the seventh node, the fourth current source configured to source a scaled version of the second reference current to the seventh node.

10. The wireless power reception system of claim 9, wherein the second voltage to current converter further comprises:

a third p-channel transistor having a source connected to the supply voltage node, a drain connected to a ninth node, and a gate connected to the first node;

a fifth current source connected between the ninth node and ground, the fifth current source configured to sink a third reference current from the eighth node;

a fourth p-channel transistor having a source connected to the supply voltage node, a drain connected to a tenth node, and a gate connected to the fifth node; and a sixth current source connected between the tenth node and ground, the sixth current source configured to sink a fourth reference current from the tenth node;

wherein the first, second, third, and fourth reference currents are equal in magnitude.

11. The wireless power reception system of claim 10, wherein the second voltage to current converter further comprises:

a fifth p-channel transistor having a source connected to the supply voltage node, a drain connected to the fourth de-chopper, and a gate connected to the first node; and a sixth p-channel transistor having a source connected to the supply voltage node, a drain connected to the fourth de-chopper, and a gate connected to the fifth node.

12. The wireless power reception system of claim 3, wherein the first voltage to current converter comprises:

a first p-channel transistor having a source connected to a supply voltage node, a drain connected to a first node, and a gate connected to the first node;

a first n-channel transistor having a drain connected to the first node, a source connected to a second node, and a gate connected to a third node;

a first current source connected between the second node and a fourth node and configured to sink a first reference current from the second node and source the first reference current to the fourth node;

a second p-channel transistor having a source connected to the supply voltage node, a drain connected to a fifth node, and a gate connected to the fifth node;

a second n-channel transistor having a drain connected to the fifth node, a source connected to a sixth node, and a gate connected to a seventh node; and a second current source connected between the sixth node and an eighth node and configured to sink a second reference current from the sixth node and source the second reference current to the eighth node;

wherein the first chopped differential voltage is received at the fourth node and eighth node.

13. The wireless power reception system of claim 12, wherein the first voltage to current converter comprises:

a first NPN transistor having a collector connected to the third node, an emitter connected to the fourth node, and a base connected to the second node;

a third current source connected between the supply voltage node and the third node, the third current source configured to source a scaled version of the first reference current to the third node;

a second NPN transistor having a collector connected to the seventh node, an emitter connected to the eighth node, and a base connected to the sixth node; and a fourth current source connected between the supply voltage node and the seventh node, the fourth current source configured to source a scaled version of the second reference current to the seventh node.

14. The wireless power reception system of claim 13, wherein the first voltage to current converter further comprises:

a third p-channel transistor having a source connected to the supply voltage node, a drain connected to a ninth node, and a gate connected to the first node;

a fifth current source connected between the ninth node and ground, the fifth current source configured to sink a third reference current from the ninth node;

a fourth p-channel transistor having a source connected to the supply voltage node, a drain connected to a tenth node, and a gate connected to the fifth node; and a sixth current source connected between the tenth node and ground, the sixth current source configured to sink a fourth reference current from the tenth node;

wherein the first, second, third, and fourth reference currents are equal in magnitude.

15. The wireless power reception system of claim 14, wherein the first voltage to current converter further comprises:

a fifth p-channel transistor having a source connected to the supply voltage node, a drain connected to the third de-chopper, and a gate connected to the first node; and a sixth p-channel transistor having a source connected to the supply voltage node, a drain connected to the third de-chopper, and a gate connected to the fifth node.

16. A method for controlling a wireless power reception system, the method comprising:

receiving an input time-varying power signal across a first and a second input node;

turning on a first high-side transistor and a second low-side transistor during a first phase and turning on a second high-side transistor and a first low-side transistor during a second phase to cause rectification of the input time-varying power signal to produce an output voltage at an output node;

determining, during a first given number of occurrences of the first phase, a current sunk by the first low-side transistor based on a voltage across a first sense resistor;

determining, during a second given number of occurrences of the first phase, a current delivered to a load coupled between the output node and ground based on a sum of the voltage across the first sense resistor and a voltage across a second sense resistor; and modulating a gate voltage of the first low-side transistor during the first phase and modulating a gate voltage of the second low-side transistor during the second phase, based on the determined current delivered to the load, to dissipate excess power delivered by the input time-varying power signal and perform output voltage regulation on top of rectification.

17. The method of claim 16, further comprising:

during a first given number of occurrences of the second phase, determining a current sunk by the second low-side transistor based upon a voltage across the second sense resistor;

during a second given number of occurrences of the second phase, determining a current delivered to the load coupled between the output node and ground based upon a sum of the voltage across the second sense resistor and the voltage across the first sense resistor.

18. The method of claim 17, further comprising:

deasserting a channel selection signal during the first given number of occurrences of the first phase and asserting the channel selection signal during the second given number of occurrences of the first phase;

deasserting the channel selection signal during the first given number of occurrences of the second phase and asserting the channel selection signal during the second given number of occurrences of the second phase;

chopping a first differential voltage across the first sense resistor to produce a first chopped differential voltage during the first phase when the channel selection signal is deasserted;

blocking the first differential voltage during the second phase when the channel selection signal is asserted;

converting the first chopped differential voltage to a first differential current;

chopping a second differential voltage across the second sense resistor to produce a second chopped differential voltage during the second phase when the channel selection signal is deasserted;

blocking the second differential voltage during the first phase when the channel selection signal is asserted;

converting the second chopped differential voltage to a second differential current; and controlling the turn-on of the first and second high-side transistors, and the first and second low-side transistors, and modulating the gate voltage of the first and second low-side transistors, based upon the first and second differential currents.

19. The method of claim 18, further comprising:

converting the first and second differential currents into a corresponding differential voltage;

de-chopping the differential voltage to produce a stabilized voltage signal;

filtering the stabilized voltage signal to remove high-frequency noise and produce a filtered voltage signal indicative of the current delivered to the load; and digitizing the filtered voltage signal for use in controlling the turn-on of the first and second high-side transistors, and the first and second low-side transistors, and for modulating the gate voltage of the first and second low-side transistors.

* * * * *